(12) United States Patent
Saito et al.

(10) Patent No.: US 9,443,880 B2
(45) Date of Patent: Sep. 13, 2016

(54) SEMICONDUCTOR DEVICE

(71) Applicant: Semiconductor Energy Laboratory Co., Ltd., Atsugi-shi, Kanagawa-ken (JP)

(72) Inventors: Toshihiko Saito, Atsugi (JP); Yuki Hata, Atsugi (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/500,445

(22) Filed: Sep. 29, 2014

(65) Prior Publication Data

US 2015/0014685 A1  Jan. 15, 2015

Related U.S. Application Data

(62) Division of application No. 13/193,734, filed on Jul. 29, 2011, now abandoned.

(30) Foreign Application Priority Data

Aug. 6, 2010 (JP) .................. 2010-178045
May 13, 2011 (JP) .................. 2011-108416

(51) Int. Cl.
*H01L 27/12* (2006.01)
*H01L 27/115* (2006.01)
(Continued)

(52) U.S. Cl.
CPC ......... *H01L 27/124* (2013.01); *G11C 16/0433* (2013.01); *H01L 27/1156* (2013.01);
(Continued)

(58) Field of Classification Search
CPC ............. H01L 27/11521; H01L 27/11526; H01L 27/1156; H01L 27/1225; H01L 27/11524; H01L 27/11529; H01L 27/1157; G11C 17/18; G11C 11/4099
USPC ............ 257/43, 72, 59; 365/96, 149
See application file for complete search history.

(56) References Cited

U.S. PATENT DOCUMENTS 4,466,081 A   8/1984  Masuoka
5,349,366 A   9/1994  Yamazaki et al.
(Continued)

FOREIGN PATENT DOCUMENTS

EP   1737044 A   12/2006
EP   2226847 A   9/2010
(Continued)

OTHER PUBLICATIONS

Chen.J, "CMOS Process Technology", CMOS Devices and Technology for VLSI, 1990, p. 148, Prentice Hall, Inc.
(Continued)

*Primary Examiner* — Kenneth Parker
*Assistant Examiner* — Bo Fan
(74) *Attorney, Agent, or Firm* — Robinson Intellectual Property Law Office; Eric J. Robinson

(57) ABSTRACT

An object is to miniaturize a semiconductor device. Another object is to reduce the area of a driver circuit of a semiconductor device including a memory cell. The semiconductor device includes an element formation layer provided with at least a first semiconductor element, a first wiring provided over the element formation layer, an interlayer film provided over the first wiring, and a second wiring overlapping with the first wiring with the interlayer film provided therebetween. The first wiring, the interlayer film, and the second wiring are included in a second semiconductor element. The first wiring and the second wiring are wirings to which the same potentials are supplied.

17 Claims, 40 Drawing Sheets

(51) Int. Cl.
*H01L 49/02* (2006.01)
*G11C 16/04* (2006.01)

(52) U.S. Cl.
CPC ... *H01L27/11521* (2013.01); *H01L 27/11526* (2013.01); *H01L 27/12* (2013.01); *H01L 27/1225* (2013.01); *H01L 28/40* (2013.01)

(56) References Cited

U.S. PATENT DOCUMENTS

| | | | |
|---|---|---|---|
| 5,371,707 A * | 12/1994 | Ogawa | G11C 11/4099 365/149 |
| 5,731,856 A | 3/1998 | Kim et al. | |
| 5,744,864 A | 4/1998 | Cillessen et al. | |
| 6,127,702 A | 10/2000 | Yamazaki et al. | |
| 6,191,442 B1 | 2/2001 | Matsufusa | |
| 6,294,274 B1 | 9/2001 | Kawazoe et al. | |
| 6,445,026 B1 | 9/2002 | Kubota et al. | |
| 6,563,174 B2 | 5/2003 | Kawasaki et al. | |
| 6,727,522 B1 | 4/2004 | Kawasaki et al. | |
| 6,794,693 B2 * | 9/2004 | Kakamu | H01L 21/28123 257/257 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,714,633 B2 | 5/2010 | Kato | |
| 7,732,819 B2 | 6/2010 | Akimoto et al. | |
| 8,106,400 B2 | 1/2012 | Miyairi et al. | |
| 9,000,431 B2 | 4/2015 | Miyairi et al. | |
| 9,153,341 B2 | 10/2015 | Umezaki | |
| 9,219,158 B2 | 12/2015 | Miyairi et al. | |
| 2001/0046027 A1 | 11/2001 | Tai et al. | |
| 2002/0056838 A1 | 5/2002 | Ogawa | |
| 2002/0121659 A1 | 9/2002 | Hur | |
| 2002/0132454 A1 | 9/2002 | Ohtsu et al. | |
| 2002/0163827 A1 * | 11/2002 | Mullarkey | G11C 17/18 365/96 |
| 2003/0080385 A1 | 5/2003 | Kimura | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0099907 A1 * | 5/2004 | Morimoto | H01L 23/58 257/341 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0289955 A1 | 12/2006 | Mitarai et al. | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0147104 A1 | 6/2007 | Kato et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272759 A1 | 11/2007 | Kato | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0034131 A1 | 2/2009 | Yamada et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0311809 A1 | 12/2009 | Miyairi et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0148845 A1 | 6/2010 | Kato | |
| 2010/0193785 A1 | 8/2010 | Kimura | |
| 2011/0101351 A1 | 5/2011 | Yamazaki | |
| 2011/0128777 A1 | 6/2011 | Yamazaki et al. | |
| 2015/0325312 A1 | 11/2015 | Umezaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-021478 A | 1/1994 |
| JP | 08-264794 A | 10/1996 |
| JP | 11-040772 A | 2/1999 |
| JP | 11-505377 | 5/1999 |
| JP | 2000-044236 A | 2/2000 |
| JP | 2000-150900 A | 5/2000 |
| JP | 2001-044297 A | 2/2001 |

(56) References Cited

FOREIGN PATENT DOCUMENTS

| | | |
|---|---|---|
| JP | 2001-053164 A | 2/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-322899 A | 11/2005 |
| JP | 2007-151092 A | 6/2007 |
| JP | 2010-123939 A | 6/2010 |
| WO | WO-2004/114391 | 12/2004 |

OTHER PUBLICATIONS

Taiwanese Office Action (Application No. 100125972) Dated Nov. 30, 2015.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, Or Al; B: Mg, Mn, Fe, Ni, Cu,Or Zn] at Temperatures over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Informational Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Smith.S, "10.3 CMOS Logic-Gate Circuits", Microelectronic Circuits 5th Edition, 2004, p. 967.

* cited by examiner

FIG. 25A  FIG. 25B
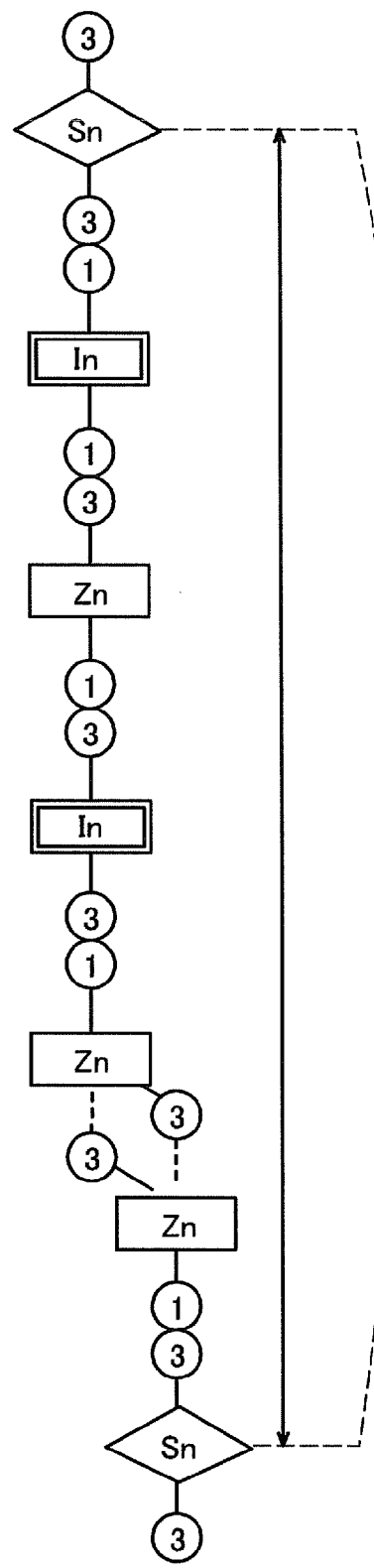
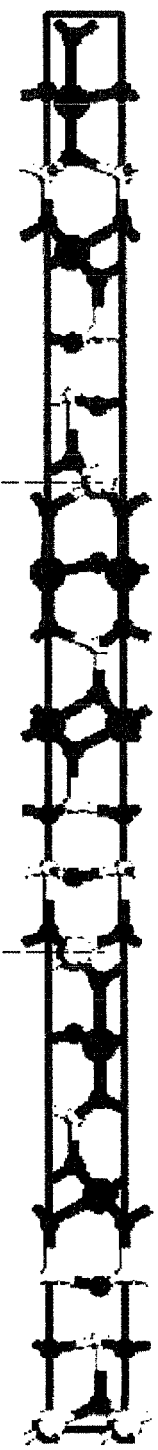
FIG. 25C
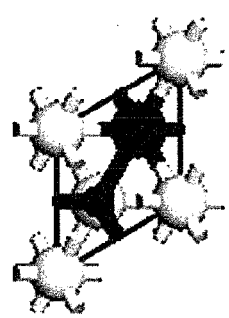
● In
☾ Sn
☾ Zn
● O

SEMICONDUCTOR DEVICE

BACKGROUND OF THE INVENTION

1. Field of the Invention

The invention disclosed herein relates to semiconductor devices using semiconductor elements.

2. Description of the Related Art

Nonvolatile semiconductor devices such as nonvolatile storage devices which are capable of writing and erasing data repeatedly, for example, an EEPROM and a flash memory are convenient and have high resistance to physical impact. Therefore, they have been mainly used for portable storage media such as a USB flash drive and a memory card, an RF tag which is a medium for radio frequency identification (RFID) in which data is read wirelessly, and the like, and have been widely available on the market. In the semiconductor device, a transistor which functions as a storage element is included in each memory cell. Further, the transistor includes an electrode called a floating gate, between a gate electrode and a semiconductor film serving as an active layer. The accumulation of electric charge in the floating gate enables storage of data.

Described in Patent Documents 1 and 2 is a thin film transistor including a floating gate which is formed over a glass substrate.

REFERENCE

[Patent Document 1] Japanese Published Patent Application No. H6-021478

[Patent Document 2] Japanese Published Patent Application No. 2005-322899

SUMMARY OF THE INVENTION

In the case where a circuit including a plurality of signal lines is formed as a driver circuit of a semiconductor device, it is preferable to increase the number of wiring layers and form the signal line in each of the layers in order to reduce the area of the driver circuit. However, simply increasing the number of wiring masks in increasing the number of the wiring layers is not preferable because the cost also increases.

In particular, a semiconductor device such as a storage device includes a memory cell and a driver circuit for driving the memory cell; thus, the size of the semiconductor device is limited by the area of the driver circuit. That is to say, even when only the area of a memory cell is reduced, a semiconductor device cannot be wholly miniaturized unless the area of a driver circuit can be reduced. Therefore, it is important to reduce the area of a driver circuit in miniaturizing a semiconductor device.

In view of the above, an object of one embodiment of the present invention is to miniaturize a semiconductor device.

Another object of one embodiment of the present invention is to reduce the area of a driver circuit of a semiconductor device including a memory cell.

An embodiment of the disclosed invention is a semiconductor device including an element formation layer provided with at least a first semiconductor element, a first wiring provided over the element formation layer, an interlayer film provided over the first wiring, and a second wiring overlapping with the first wiring with the interlayer film provided therebetween. The first wiring, the interlayer film, and the second wiring are included in a second semiconductor element. The first wiring and the second wiring are wirings to which the same potentials are supplied.

Another embodiment of the disclosed invention is a semiconductor device including an element formation layer provided with at least a first semiconductor element, a first wiring provided over the element formation layer, an interlayer film provided over the first wiring, and a second wiring overlapping with the first wiring with the interlayer film provided therebetween. The first wiring, the interlayer film, and the second wiring are included in a second semiconductor element. The first wiring and the second wiring are wirings to which common-mode signals are input.

Another embodiment of the disclosed invention is a semiconductor device including a memory cell and a driver circuit portion of the memory cell. The memory cell includes a first transistor including a first channel formation region, a first gate electrode, a first source electrode, and a first drain electrode; a second transistor including a second channel formation region, a second gate electrode, a second source electrode, and a second drain electrode; and a capacitor. The second transistor is provided so as to at least overlap with the first transistor. The driver circuit portion is provided with a semiconductor element including a first wiring and a second wiring. The first wiring is formed through the same process as the second source electrode and the second drain electrode. The second wiring overlaps with the first wiring with the interlayer film provided therebetween, and is formed through the same process as the second gate electrode. The first wiring and the second wiring are wirings to which the same potentials are supplied.

Another embodiment of the disclosed invention is a semiconductor device including a memory cell and a driver circuit portion of the memory cell. The memory cell includes a first transistor including a first channel formation region, a first gate electrode, a first source electrode, and a first drain electrode; a second transistor including a second channel formation region, a second gate electrode, a second source electrode, and a second drain electrode; and a capacitor. The second transistor is provided so as to at least overlap with the first transistor. The driver circuit portion is provided with a semiconductor element including a first wiring and a second wiring. The first wiring is formed through the same process as the second source electrode and the second drain electrode. The second wiring overlaps with the first wiring with the interlayer film provided therebetween, and is formed through the same process as the second gate electrode. The first wiring and the second wiring are wirings to which common-mode signals are input.

In the above semiconductor device, the semiconductor element may be a level shifter. The thickness of the interlayer film is preferably greater than or equal to 10 nm and less than or equal to 100 nm.

In this specification and the like, the terms "over" and "below" do not necessarily mean "directly on" and "directly under", respectively, in the description of a positional relation between components. For example, the expression "a gate electrode over a gate insulating film" can mean the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, "the same potentials" include "substantially the same potentials". The technical idea of the disclosed invention is that conductive layers (a first wiring and a second wiring) stacked with a thin insulating film provided therebetween are made to serve as wirings and parasitic capacitance is reduced in a circuit. Therefore, "the same potentials" include "substantially the same potentials" such as potentials with which parasitic capacitance can be sufficiently reduced (to one hundredth or lower) as compared to the case where a first potential (e.g., VDD) is supplied to a first wiring, and a second potential (e.g., GND) is supplied to a second wiring from a power supply line different from that of the first potential. In addition, potential deviation due to wiring resistance or the like is reasonably acceptable. Similarly, "common-mode" potential include "substantially common-mode" potential.

According to one embodiment of the present invention, a miniaturized semiconductor device can be provided.

Further, according to one embodiment of the present invention, a semiconductor device including a memory cell and a driver circuit whose area is reduced can be provided.

BRIEF DESCRIPTION OF THE DRAWINGS

In the accompanying drawings:

FIGS. 25A to 25C are diagrams illustrating a structure of an oxide material according to one embodiment of the present invention.

DETAILED DESCRIPTION OF THE INVENTION

Figure 1A:
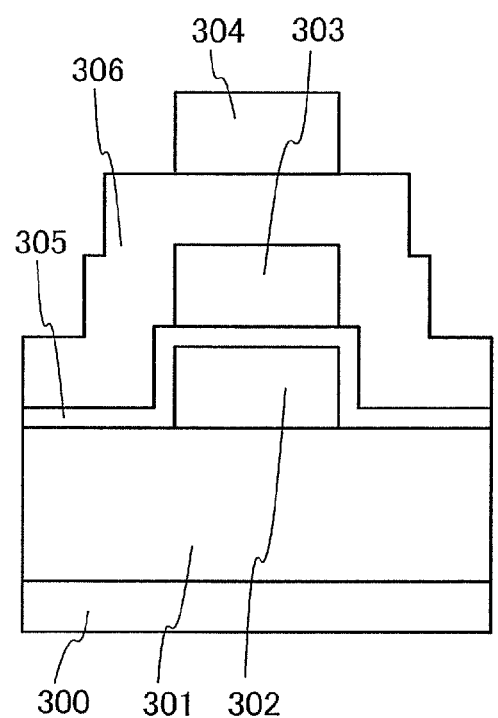
FIG. 1A is a cross-sectional view of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, a basic structure of a semiconductor device according to one embodiment of the disclosed invention will be described with reference to drawings.

Figure 1B:
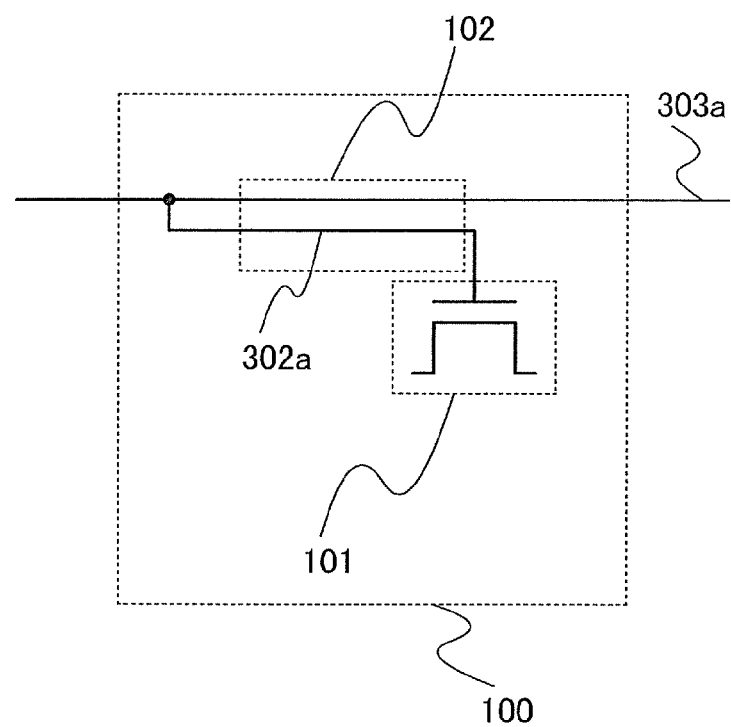
FIG. 1B is a circuit diagram thereof.

FIGS. 1A and 1B illustrate a structure of a semiconductor device according to one embodiment of the present invention. FIG. 1A schematically illustrates a cross-sectional structure of the semiconductor device, and FIG. 1B schematically illustrates a circuit configuration.

FIG. 1A illustrates the structure of the semiconductor device in which a layer 301 provided with a semiconductor element such as a transistor (hereinafter referred to as an element formation layer 301), a first wiring 302, a first interlayer film 305, a second wiring 303, a second interlayer film 306, and a third wiring 304 are stacked over a substrate 300. The element formation layer 301 is a region where a semiconductor element such as a capacitor or a resistor may be formed as well as a transistor. In FIGS. 1A and 1B, the first interlayer film 305 is thinner than the second interlayer film 306. The first wiring 302, the second wiring 303, and the third wiring 304 are each formed to have a single-layer structure or a layered structure with the use of a conductive layer. Further, the first interlayer film 305 and the second interlayer film 306 are formed to have a single-layer structure or a layered structure with the use of an insulating layer.

FIG. 1B illustrates the circuit configuration of a circuit 100 and positional relation of wirings in the circuit 100. The circuit 100 includes a wiring 303a provided across the circuit 100, a wiring 302a diverging from the wiring 303a, a transistor 101, and a region 102 where the wiring 303a and the wiring 302a overlap with each other. Further, the wiring 303a is given an input signal and connected to a gate electrode of the transistor 101 through the wiring 302a electrically connected to the wiring 303a. The wiring 303a is formed using the second wiring 303 in FIG. 1A, and the wiring 302a is formed using the first wiring 302 in FIG. 1A.

In general, the semiconductor device having the cross-sectional structure in FIG. 1A has the following problem. Because only the first interlayer film 305 which is thin is provided between the first wiring 302 and the second wiring 303, large parasitic capacitance might be generated in a region where the first wiring 302 and the second wiring 303 overlap with each other. Consequently, delay time of signals given to the first wiring 302 and the second wiring 303 increases and thus circuit operation slows down or stops. To avoid such an adverse effect, it is possible to employ a structure where only one of the first wiring 302 and the second wiring 303 is used; however, in that case, there is a problem that the area of the circuit is increased because the number of wirings which can be used is reduced by one.

On the other hand, when the configuration in FIG. 1B is employed, an increase in delay time of a signal can be suppressed although large parasitic capacitance is generated in the region 102 where the wiring 303a and the wiring 302a overlap with each other. This is because two terminals where parasitic capacitance is generated are at substantially the same potentials due to electrical connection between the wiring 303a and the wiring 302a, so that the two terminals are less likely to be charged and discharged.

Thus, the circuit can be formed using a region where the first wiring and the second wiring overlap with each other with the thin interlayer film (the first interlayer film 305 in FIG. 1A) provided therebetween, which leads to a reduction in area of the circuit as compared to the case of using only one of the first wiring and the second wiring. Consequently, a reduction in size of a semiconductor device can be achieved.

By employing the circuit configuration and the positional relation of the wirings, which are illustrated in FIG. 1B, however small the thickness of the first interlayer film 305 illustrated in FIG. 1A may be, the region where the first wiring 302 and the second wiring 303 overlap with each other can be used as part of the circuit, which is advantageous to a reduction in area of the circuit. On the other hand, in the case where the first interlayer film 305 is used as a dielectric of a capacitor or a gate insulating film of the transistor in the semiconductor device, the thickness of the first interlayer insulating film 305 is preferably greater than or equal to 10 nm and less than or equal to 300 nm, more preferably greater than or equal to 10 nm and less than or equal to 100 nm, still more preferably greater than or equal to 10 nm and less than or equal to 30 nm.

Further, in the configuration in FIG. 1B, the wiring 302a may be thinner than the wiring 303a. In that case, there is a concern that the wiring 302a has higher sheet resistance than the wiring 303a and thus has high wiring resistance. However, it is possible to use the wiring 302a only as a short wiring when the wiring 303a is used as a long wiring provided across the circuit 100; therefore, the wiring resistance of the wiring 302a can be reduced. Accordingly, an adverse effect due to the wiring resistance on circuit operation can be reduced.

In a manufacturing process of the semiconductor device, a reduction in thickness of the wiring 302a leads to a reduction in step height due to the wiring 302a provided in a lower layer and prevention of disconnection of the wiring 303a and short circuit between the wiring 302a and the wiring 303a, which is preferable. For example, the thickness of the wiring 302a is preferably greater than or equal to 50 nm and less than or equal to 150 nm. By setting the thickness of the wiring 302a to the above value, the wiring 302a can have high sheet resistance while influence of the wiring resistance of the wiring 302a on circuit operation is suppressed, and an adverse effect of a step height due to the wiring 302a in the manufacturing process can be reduced.

Note that FIG. 1B illustrates an example where the wiring 302a and the gate electrode of the transistor 101 are electrically connected to each other in the circuit 100 as a typical example; however, this embodiment is not limited thereto. The wiring 302a may be connected to gate electrodes of a plurality of transistors. Alternatively, the wiring 302a may be a source electrode or a drain electrode of the transistor or a semiconductor element such as a capacitor or a resistor, instead of being connected to the gate electrode of the transistor.

Figure 2:
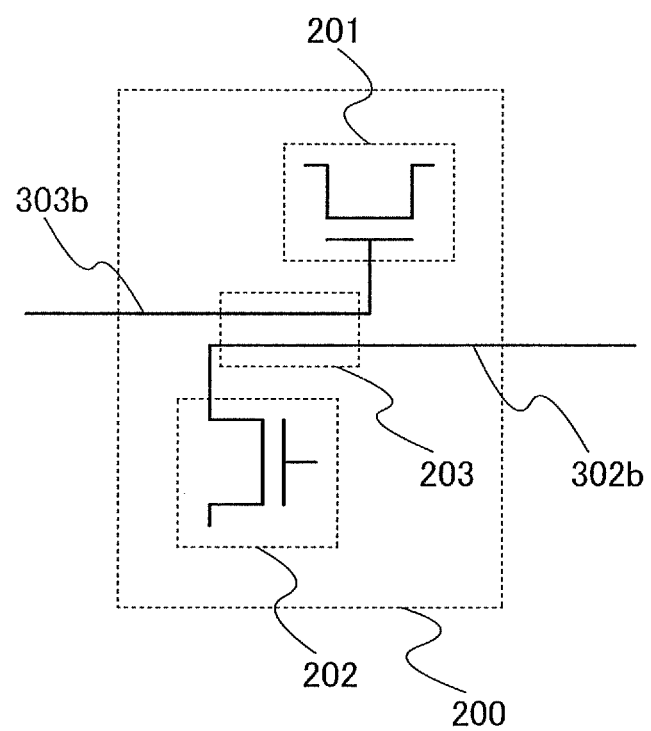
FIG. 2 is a circuit diagram of a semiconductor device.

Next, as a semiconductor device different from that in FIG. 1B, a semiconductor device for which a circuit configuration and positional relation of wirings in FIG. 2 are employed will be described. Note that the cross-sectional structure in FIG. 1A is applied to a cross-sectional structure of the semiconductor device.

FIG. 2 illustrates the circuit configuration of a circuit 200 and the positional relation of wirings in the circuit 200. The circuit 200 includes a wiring 303b, a wiring 302b, transistors 201 and 202, and a region 203 where the wiring 303b and the wiring 302b overlap with each other. The wiring 303b is given a signal input to the circuit 200 and electrically connected to a gate electrode of the transistor 201. Further, the wiring 302b is given a signal output from the circuit 200 and electrically connected to one of a source electrode and a drain electrode of the transistor 202. The wiring 303b is formed using the second wiring 303 in FIG. 1A, and the wiring 302b is formed using the first wiring 302 in FIG. 1A.

The wiring 303b and the wiring 302b are given common-mode signals. Here, common-mode signals mean signals having the same phase. In the case where they are digital signals, they refer to signals having High-level periods corresponding to each other and Low-level periods corresponding to each other. Note that the degree of correspondence of digital signals is preferably as follows: at least parts of rise time or fall time of signals coincide with each other. In the case where rise time or fall time of one of signals overlaps with that of the other, charge and discharge of parasitic capacitance of each wiring are suppressed, so that delay time of signals can be reduced, as compared to the case where rise time or fall time of one of signals does not overlap with that of the other.

As described above, in general, the semiconductor device having the cross-sectional structure in FIG. 1A has the following problem. Because only the first interlayer film 305 which is thin is provided between the first wiring 302 and the second wiring 303, large parasitic capacitance might be generated in a region where the first wiring 302 and the second wiring 303 overlap with each other. Consequently, delay time of signals given to the first wiring 302 and the second wiring 303 increases and thus circuit operation slows down or stops. To avoid such an adverse effect, it is possible to employ a structure where only one of the first wiring 302 and the second wiring 303 is used; however, in that case, there is a problem that the area of the circuit is increased because the number of wirings which can be used is reduced by one.

On the other hand, when the configuration in FIG. 2 is employed, an increase in delay time of a signal can be suppressed although large parasitic capacitance is generated in the region 203 where the wiring 303b and the wiring 302b overlap with each other. This is because the wiring 303b and the wiring 302b are given common-mode signals, which results in a reduction in potential difference between two terminals where parasitic capacitance is generated and suppression of charge and discharge of the two terminals.

Thus, the region 203 where the wiring 303b and the wiring 302b overlap with each other with the thin interlayer film (the first interlayer film 305 in FIG. 1A) provided therebetween can be used as part of the circuit, which leads to a reduction in area of the circuit as compared to the case of using only one of the wiring 302b and the wiring 303b. Consequently, a reduction in size of a semiconductor device can be achieved.

Note that the structure where the first interlayer film 305 is thinner than the second interlayer film 306, which is illustrated in FIG. 1A, can be employed for various semiconductor devices. Such semiconductor devices may have, for example, a structure where the first wiring 302 and the second wiring 303 are used as some of semiconductor elements other than a semiconductor element formed over the element formation layer 301. Specifically, such semiconductor devices may have a structure where the first wiring 302 and the second wiring 303 are used as electrodes of a capacitor. As a dielectric of a capacitor is thinner, the capacitance value increases; thus, the first interlayer film 305 is preferably thin. When the first wiring 302 is used as a gate electrode of the transistor and the second wiring 303 is used as a source electrode and a drain electrode of the transistor, the first interlayer film 305 is formed thin in some cases because it is used as a gate insulating film. Note that the first wiring 302 may be used as the source electrode or the drain electrode, and the second wiring 303 may be used as the gate electrode. As the transistor, a transistor having a semiconductor active region including amorphous silicon, a transistor having a semiconductor active region including an oxide semiconductor, or the like is used. Besides, the first wiring 302 and the second wiring 303 may be used as part of a resistor or a storage element.

By employing the circuit configuration and the positional relation of the wirings, which are illustrated in FIG. 2, however small the thickness of the first interlayer film 305 illustrated in FIG. 1A may be, the region where the first wiring 302 and the second wiring 303 overlap with each other can be used as part of the circuit, which is advantageous to a reduction in area of the circuit. On the other hand, in the case where the first interlayer film 305 is used as a dielectric of a capacitor or a gate insulating film of the transistor in the semiconductor device, the thickness of the first interlayer insulating film 305 is preferably greater than or equal to 10 nm and less than or equal to 300 nm, more preferably greater than or equal to 10 nm and less than or equal to 100 nm, still more preferably greater than or equal to 10 nm and less than or equal to 30 nm.

Note that FIG. 2 illustrates an example where in the circuit 200, the wiring 303b and the gate electrode of the transistor 201 are electrically connected to each other and the wiring 302b and the source electrode or the drain electrode of the transistor 202 are electrically connected to each other, as a typical example; however, this embodiment is not limited thereto. The wiring 303b may be connected to one of the source electrode and the drain electrode of the transistor. The wiring 302b may be connected to the gate electrode of the transistor. Alternatively, the wiring 302b and the wiring 303b may be connected to the gate electrodes, the source electrodes, or the drain electrodes of the plurality of transistors or a semiconductor element such as a capacitor means, a resistor means, or a diode.

Note that although the wiring 303b is formed using the second wiring 303 in FIG. 1A and the wiring 302b is formed using the first wiring 302 in FIG. 1A in this embodiment, the wiring 302b may be formed using the second wiring 303 in FIG. 1A and the wiring 303b may be formed using the first wiring 302 in FIG. 1A.

Note that in FIG. 2, the wiring 303b is given a signal input to the circuit 200; however, this embodiment is not limited thereto. The wiring 303b may be given one of internal signals of the circuit 200. Further, in FIG. 2, the wiring 302b is given a signal output from the circuit 200; however, this embodiment is not limited thereto. The wiring 302b may be given one of internal signals of the circuit 200.

The structures, the methods, and the like described in this embodiment can be combined as appropriate with any of the structures, the methods, and the like described in the other embodiments.

Embodiment 2

In this embodiment, an example where the circuit configuration described in Embodiment 1 is applied to a driver circuit of a semiconductor device will be described with reference to drawings. In this embodiment, a storage device is used as an example of a semiconductor device.

<Structure and Operation of Memory Cell>

Figure 3:
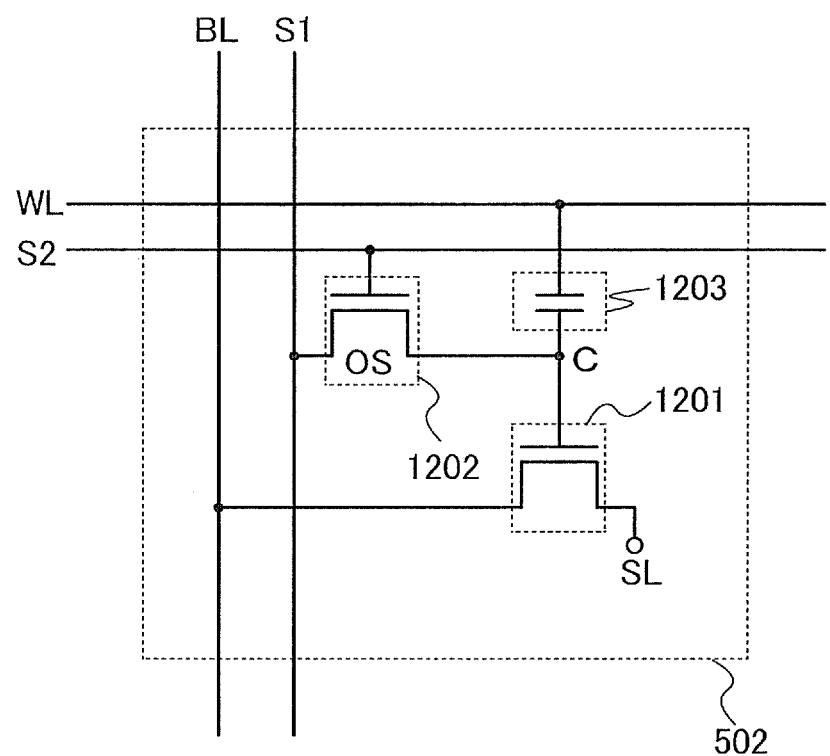
FIG. 3 is a circuit diagram of a semiconductor device.

First, a structure and operation of a memory cell 502 included in a storage device will be described. FIG. 3 is a circuit diagram of the memory cell 502. The memory cell 502 in FIG. 3 includes a first transistor 1201, a second transistor 1202, and a capacitor 1203. A gate electrode of the second transistor 1202 is electrically connected to a second signal line S2, and one of a source electrode and a drain electrode of the second transistor 1202 is electrically connected to a first signal line S1. The other of the source electrode and the drain electrode of the second transistor 1202 is electrically connected to a gate electrode of the first transistor 1201 and one of electrodes of the capacitor 1203. A source electrode of the first transistor 1201 is electrically connected to a source line (SL), and a drain electrode of the first transistor 1201 is electrically connected to a bit line (BL). The other electrode of the capacitor 1203 is electrically connected to a word line (WL).

Here, a transistor including an oxide semiconductor is used as the second transistor 1202. Since the off-state current of a transistor including an oxide semiconductor is extremely low, a memory cell including such a transistor can hold stored data for an extremely long time. In other words, refresh operation becomes unnecessary or the frequency of the refresh operation can be extremely low, which leads to a sufficient reduction in power consumption of a semiconductor device including the memory cell. Moreover, stored data can be stored for a long time even when power is not supplied. In addition, a transistor including a semiconductor material other than an oxide semiconductor is used as the first transistor 1201. Note that as a semiconductor material of the first transistor 1201, silicon, germanium, silicon germanium, silicon carbide, gallium arsenide, or the like can be used, and a single-crystal semiconductor is preferably used. The first transistor 1201 including such a semiconductor material can be operated at sufficiently high speed, so that stored data can be read at high speed, for example.

Figure 4:
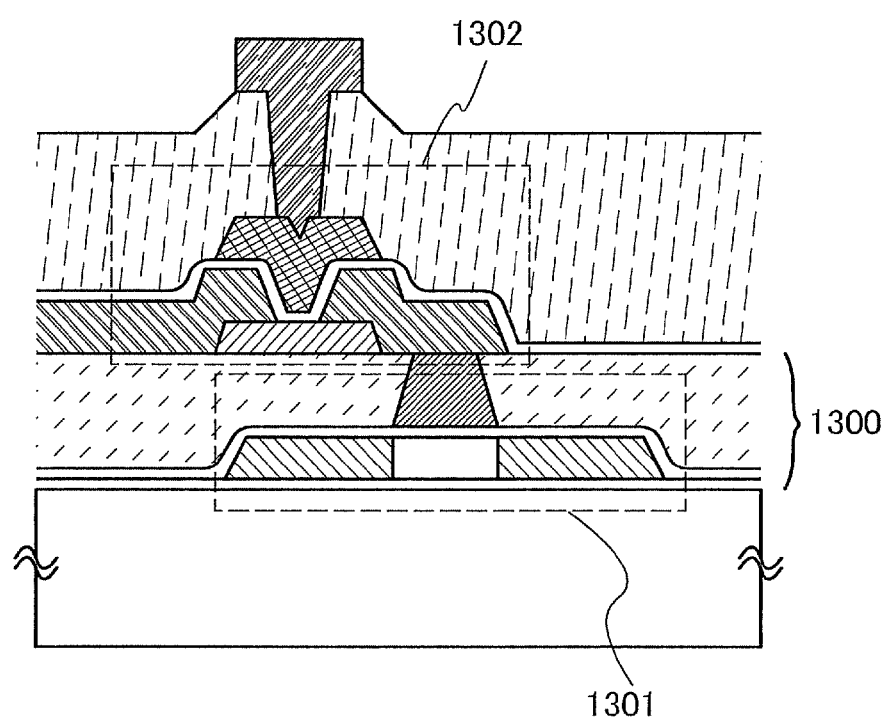
FIG. 4 is a cross-sectional view of a semiconductor device.

FIG. 4 is a schematic view illustrating a cross section of the memory cell 502. As in FIG. 4, the memory cell 502 includes a first transistor 1301 and a second transistor 1302 provided so as to at least overlap with the first transistor 1301. The second transistor 1302 is provided above the first transistor 1301, and a gate electrode of the first transistor 1301 and one of a source electrode and a drain electrode of the second transistor 1302 are electrically connected to each other. The first transistor 1301 and the second transistor 1302 in FIG. 4 correspond to the first transistor 1201 and the second transistor 1202 in FIG. 3, respectively.

The semiconductor device in FIG. 3 utilizes a characteristic in which the potential of the gate electrode of the first transistor 1201 can be held, thereby writing, storing, and reading data as follows.

Writing and storing of data will be described. First, the potential of the second signal line (S2) is set to a potential at which the second transistor 1202 is turned on, so that the second transistor 1202 is turned on. Accordingly, the potential of the first signal line (S1) is supplied to the gate electrode of the first transistor 1201 and the capacitor 1203. That is, a predetermined potential is given to the gate electrode of the first transistor 1201 (writing). Here, one of electric charges for supply of two different potentials (hereinafter, an electric charge for supply of a low potential is referred to as an electric charge $Q_L$ and an electric charge for supply of a high potential is referred to as an electric charge $Q_H$) is given to the gate electrode of the first transistor 1201. Note that electric charges giving three or more different potentials may be applied to increase storage capacity.

After that, the potential of the second signal line (S2) is set to a potential at which the second transistor 1202 is turned off, so that the second transistor 1202 is turned off. Thus, the electric charge given to the gate electrode of the first transistor 1201 is held (storing). Since the off-state current of the second transistor 1202 is significantly small, the potential of the gate electrode of the first transistor 1201 is held for a long time.

Next, operation of data reading will be described. By supplying an appropriate potential (reading potential) to the word line (WL) while a predetermined potential (constant potential) is supplied to the source line (SL), the potential of the bit line (BL) varies depending on the amount of electric charge held in the gate electrode of the first transistor 1201. This is because in general, when the first transistor 1201 is an n-channel transistor, an apparent threshold voltage $V_{th\_H}$ in the case where $Q_H$ is given to the gate electrode of the first transistor 1201 is lower than an apparent threshold voltage $V_{th\_L}$ in the case where $Q_L$ is given to the gate electrode of the first transistor 1201. Here, an apparent threshold voltage refers to the voltage of the word line (WL), which is needed to turn on the first transistor 1201.

Thus, the potential of the word line (WL) is set to a potential $V_O$ intermediate between $V_{th\_H}$ and $V_{th\_L}$, whereby electric charge given to the gate electrode of the first transistor 1201 can be determined. For example, in the case where $Q_H$ is given in writing, when the potential of the word line (WL) is set to $V_O$, the first transistor 1201 is turned on because $V_O$ is higher than $V_{t\_H}$. On the other hand, in the case where $Q_L$ is given in writing, when the potential of the word line (WL) is set to $V_O$, the first transistor 1201 remains in an off state because $V_O$ is lower than $V_{th\_L}$. Therefore, the stored data can be read by determining the potential of the bit line (BL).

Note that in the case where memory cells are arrayed to be used, only data of a desired memory cell is needed to be read. Thus, in the case where data of a predetermined memory cell is read and data of the other memory cells is not read, a potential at which the first transistor 1201 is turned on or off regardless of a state of the gate electrode may be supplied to word lines (WL) of the memory cells whose data is not to be read. Specifically, to turn on the first transistor 1201 regardless of a state of the gate electrode, a potential higher than $V_{th\_L}$ may be supplied to the word lines (WL). To turn off the first transistor 1201 regardless of a state of the gate electrode, a potential lower than $V_{th\_H}$ may be supplied to the word lines (WL).

It can be appropriately determined whether to supply a potential at which the first transistors 1201 are turned on or a potential at which the first transistors 1201 are turned off to the word lines (WL) of the memory cells whose data is not to be read, depending on the connection relation of the memory cells 502 (e.g., depending on whether the memory cells are connected in series or in parallel).

Next, rewriting of data will be described. Data rewriting is performed similarly to the writing or storing of data. That is, the potential of the second signal line (S2) is set to a potential at which the second transistor 1202 is turned on, whereby the second transistor 1202 is turned on. Accordingly, the potential of the first signal line (S1) (potential related to new data) is supplied to the gate electrode of the first transistor 1201 and the capacitor 1203. After that, the potential of the second signal line (S2) is set to a potential at which the second transistor 1202 is turned off, whereby the second transistor 1202 is turned off. Accordingly, electric charge related to new data is held in the gate electrode of the first transistor 1201.

Thus, in the semiconductor device according to the disclosed invention, data can be directly rewritten by overwriting of new data. Therefore, extracting of electric charge from a floating gate with the use of a high voltage needed in a flash memory or the like is not necessary and thus, a reduction in operation speed, which is attributed to erasing operation, can be suppressed. That is, high-speed operation of the semiconductor device can be realized. Further, in that case, the problem of deterioration of a gate insulating film (tunnel insulating film), which is pointed out in a conventional floating gate transistor, does not exist. That is to say, the deterioration of a gate insulating film due to injection of an electron into a floating gate, which has been traditionally regarded as a problem, can be neglected. This means that there is no limit on the number of times of writing in principle.

Note that the source electrode or the drain electrode of the second transistor 1202 is electrically connected to the gate electrode of the first transistor 1201, thereby having an effect similar to that of a floating gate of a floating gate transistor used for a nonvolatile storage element. Therefore, a portion in the drawing where the source electrode or the drain electrode of the second transistor 1202 is electrically connected to the gate electrode of the first transistor 1201 is called a node C. When the second transistor 1202 is off, the node C can be regarded as being embedded in an insulator and thus electric charge is held in the node C. The amount of off-state current of the second transistor 1202 including an oxide semiconductor is lower than or equal to one hundred thousandth of the amount of off-state current of a transistor including a silicon semiconductor; thus, loss of the electric charge accumulated in the node C due to a leakage current of the second transistor 1202 is negligible. That is, with the second transistor 1202 including an oxide semiconductor, a substantially nonvolatile storage device which can store data without being supplied with power can be realized.

For example, when the off-state current of the second transistor 1202 is 10 zA (1 zA (zeptoampere) is $1 \times 10^{-21}$ A) or less at room temperature (25° C.) and the capacitance value of the capacitor 1203 is approximately 10 fF, data can be stored for $10^4$ seconds or longer. It is needless to say that the storage time depends on transistor characteristics and the capacitance value.

<Structure of Semiconductor Device>

Figure 5:
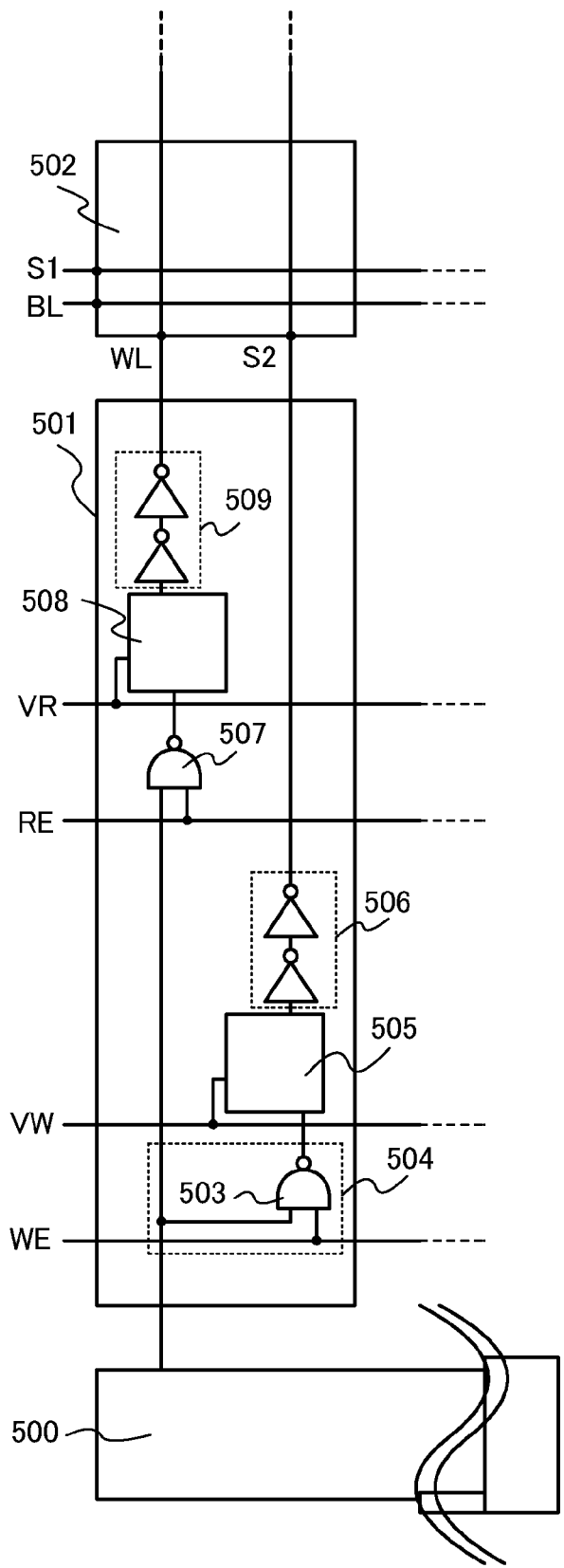
FIG. 5 is a circuit diagram of a semiconductor device.

FIG. 5 is an example of a circuit diagram of a semiconductor device. FIG. 5 is a circuit diagram of the memory cell 502 and a driver circuit which drives the memory cell 502. The driver circuit in FIG. 5 includes a row decoder 500, a row driver 501, and the memory cell 502. A plurality of row drivers 501 and a plurality of memory cells 502 are arrayed.

The row driver 501 includes a NAND gate portion 504, a first level shifter 505, a first buffer 506, a second NAND gate 507, a second level shifter 508, and a second buffer 509. The NAND gate portion 504 includes a first NAND gate 503.

<Structure and Operation of Driver Circuit Portion>

The operation of the driver circuit in FIG. 5 will be described. One of the row drivers 501 is selected by the row decoder 500. An output line of the row decoder 500 is electrically connected to one of input portions of the first NAND gate 503 and one of input portions of the second NAND gate 507. Meanwhile, the other input portion of the first NAND gate 503 is electrically connected to a writing enable signal line (WE), and the other input portion of the second NAND gate 507 is electrically connected to a reading enable signal line (RE). Thus, in wiring operation, that is, when WE is active, output of the first NAND gate 503 is active. In reading operation, that is, when RE is active, output of the second NAND gate 507 is active.

The output of the first NAND gate 503 is input to the first level shifter 505, and the output of the second NAND gate 507 is input to the second level shifter 508. Meanwhile, a writing voltage (VW) is applied to a power supply line of the first level shifter 505, and a reading voltage (VR) is applied to a power supply line of the second level shifter 508. Therefore, when the output of the first NAND gate 503 is active, the first level shifter 505 performs amplification so that a writing voltage is generated, and when the output of the second NAND gate 507 is active, the second level shifter 508 amplifies output of the row decoder 500 so that a reading voltage is generated. The output of the first level shifter 505 passes through the first buffer 506 and is input to the memory cell 502 from the second signal line (S2), and the output of the second level shifter 508 passes through the second buffer 509 and is input to the memory cell 502 from the word line (WL). The bit line (BL) and the first signal line (S1) are connected to the memory cell 502 besides the second signal line (S2) and the word line (WL).

As in FIG. 3, the memory cell 502 includes the first transistor 1201, the second transistor 1202 provided so as to overlap with the first transistor 1201. Here, a layer 1300 including the first transistor 1301 in FIG. 4 corresponds to the element formation layer 301 in FIG. 1A. Further, in this embodiment, a wiring of a driver circuit portion, which is formed through the same process as the source electrode and the drain electrode of the second transistor 1202, corresponds to the first wiring 302 in FIG. 1A. An interlayer film formed through the same process of a gate insulating film of the second transistor 1202 corresponds to the first interlayer film 305 in FIG. 1A. A wiring of the driver circuit portion, which is formed through the same process as the gate electrode of the second transistor 1202, corresponds to the second wiring 303 in FIG. 1A. In that case, by applying the structure of Embodiment 1, both the wiring formed through the same process as the source electrode and the drain electrode of the second transistor 1202 included in the memory cell 502 and the wiring formed through the same process as the gate electrode of the second transistor 1202 can be used as parts of the circuit. Thus, the area of the driver circuit portion can be reduced.

More specifically, the circuit configuration described in Embodiment 1 is applied to the NAND gate portion 504, the first level shifter 505, and the second level shifter 508. The circuit configuration in FIG. 1B is applied to the NAND gate portion 504, and the circuit configuration in FIG. 2 is applied to the first level shifter 505 and the second level shifter 508.

Figure 6:
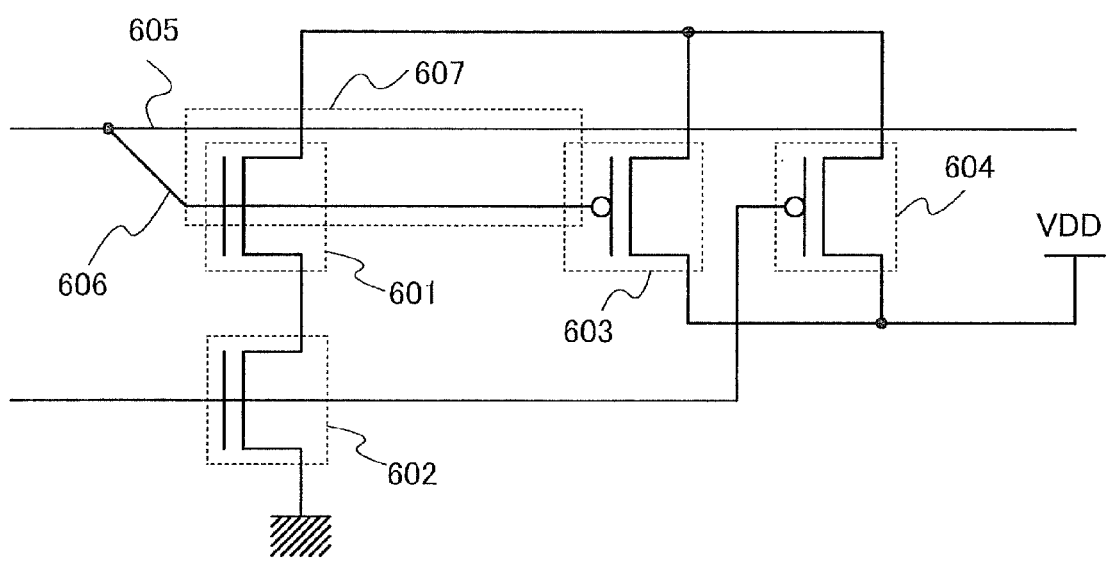
FIG. 6 is a circuit diagram of a semiconductor device.

First, application of the circuit configuration in FIG. 1B to the NAND gate portion 504 will be described with reference to drawings. FIG. 6 is a circuit diagram of the NAND gate portion 504.

A circuit in FIG. 6 includes n-channel transistors 601 and 602, p-channel transistors 603 and 604, and signal lines 605 and 606.

The signal line 605 is a common signal line that drives a plurality of NAND gates (the NAND gate 503 and the NAND gate 507 in FIG. 5). The signal line 606 is electrically connected to the signal line 605, a gate electrode of the n-channel transistor 601, and a gate electrode of the p-channel transistor 603.

In FIG. 6, the signal line 606 and the signal line 605 correspond to the first wiring 302 and the second wiring 303 in FIG. 1A, respectively. More specifically, the signal line 606 is formed through the same process as the source electrode and the drain electrode of the second transistor 1202 included in the memory cell 502, and the signal line 605 is formed through the same process as the gate electrode of the second transistor 1202. Thus, the gate insulating film of the second transistor 1202 included in the memory cell 502 and the interlayer film between the signal line 606 and the signal line 605 are formed through the same process, so that the thickness of the interlayer film can be reduced. The thickness of the interlayer film can be greater than or equal to 10 nm and less than or equal to 300 nm, preferably greater than or equal to 10 nm and less than or equal to 100 nm, more preferably greater than or equal to 10 nm and less than or equal to 30 nm.

Included in FIG. 6 is a region 607 where the signal line 606 and the signal line 605 overlap with each other. Although large parasitic capacitance is generated in the region 607 where the signal line 605 and the signal line 606 overlap with each other, an increase in delay time of a signal can be suppressed. This is because two terminals where parasitic capacitance is generated are at substantially the same potentials due to electrical connection between the signal line 605 and the signal line 606, so that the two terminals are less likely to be charged and discharged.

Note that the signal line 605 may be formed through the same process as the source electrode and the drain electrode of the second transistor 1202, and the signal line 606 may be formed through the same process as the gate electrode of the second transistor 1202. Further, it is preferable that the thickness of the wiring formed through the same process as the source electrode and the drain electrode be greater than or equal to 100 nm and less than or equal to 150 nm, which is smaller than that of the wiring formed through the same process as the gate electrode. That is because disconnection due to a step height made by a wiring in a lower layer (first wiring) can be prevented.

Figure 7:
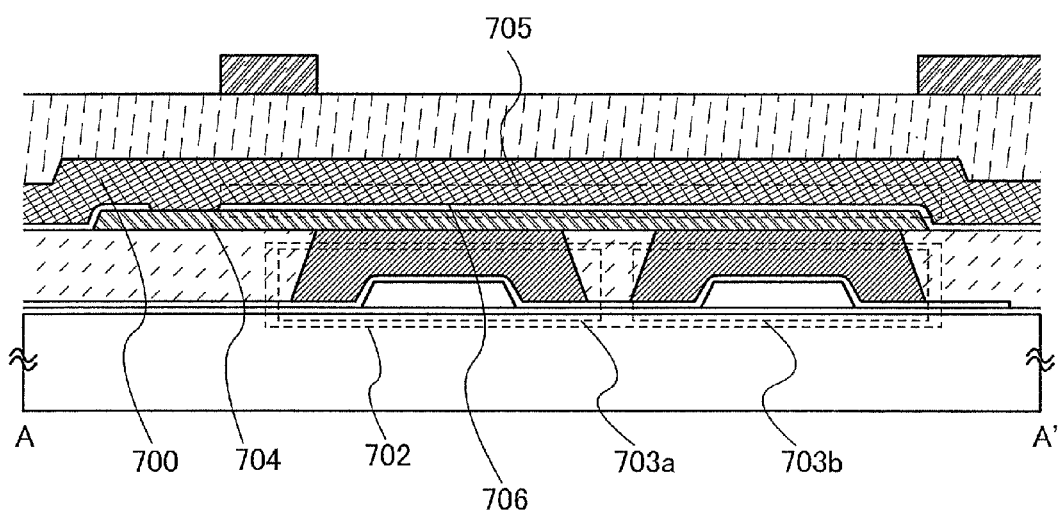
FIG. 7 is a cross-sectional view of a semiconductor device.

FIG. 7 illustrates part of a cross section of the NAND gate portion 504. The cross section in FIG. 7 includes a signal line 700, a NAND gate 702, and a signal line 704. The NAND gate 702 includes transistors 703a and 703b. In FIG. 7, the transistors 703a and 703b are formed through the same process of the first transistor 1201 included in the memory cell 502. The signal line 704 and the signal line 700 in FIG. 7 correspond to the signal line 606 and the signal line 605 in FIG. 6, respectively. A region 705 where the signal line 700 and the signal line 704 overlap with each other in FIG. 7 corresponds to the region 607 in FIG. 6.

In FIG. 7, the signal line 700 is electrically connected to the signal line 704, and the signal line 704 is electrically connected to a gate electrode of the transistor 703a and a gate electrode of the transistor 703b in the NAND gate 702.

Figure 8:
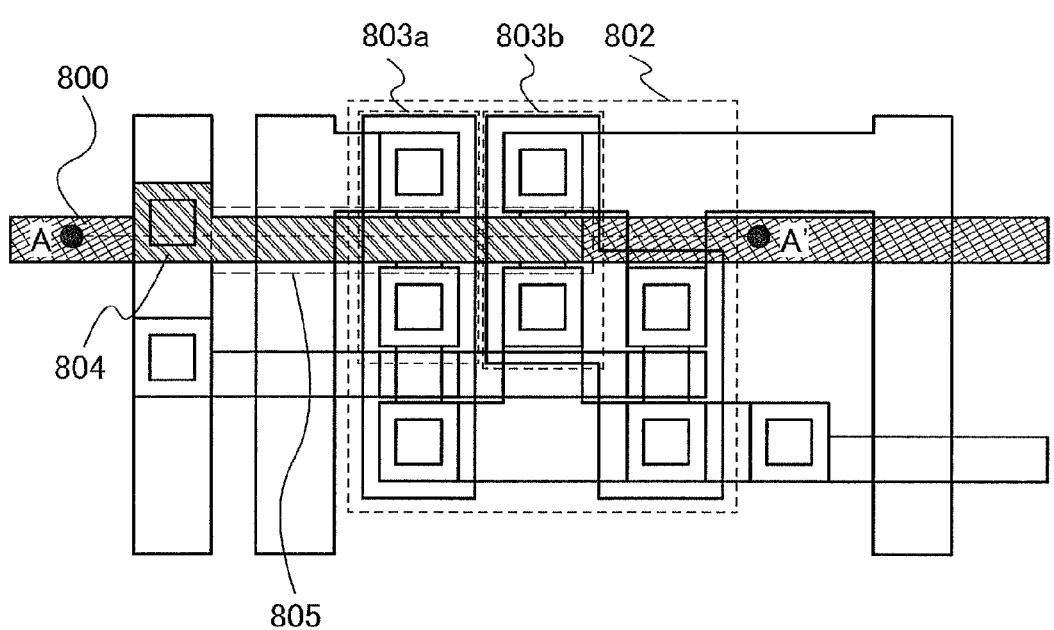
FIG. 8 is a plan view of a semiconductor device.

FIG. 8 is an example of a top view of the NAND gate portion 504 in FIG. 6 and FIG. 7. A dashed line A-A' in FIG. 8 corresponds to A-A' in the cross sectional view in FIG. 7.

A NAND gate 802 in FIG. 8 corresponds to the NAND gate 702 in FIG. 7. A signal line 800 corresponds to the signal line 700 in FIG. 7. A signal line 804 corresponds to the signal line 704 in FIG. 7. A region 805 where the signal line 800 and the signal line 804 overlap with each other corresponds to the region 705 in FIG. 7. A transistor 803a and a transistor 803b in the NAND gate 802 correspond to the transistor 703a and the transistor 703b in FIG. 7, respectively.

The transistor 703a and the transistor 703b included in the NAND gate 702 correspond to the n-channel transistor 601 and the p-channel transistor 603 in FIG. 6, respectively. The signal line 700 is formed using the same wiring layer as the gate electrode of the second transistor 1302 in FIG. 4, and the signal line 704 is formed using the same wiring layer as the source electrode and drain electrode of the second transistor 1302 in FIG. 4. Therefore, the thickness of the signal line 700 is preferably greater than or equal to 200 nm, and the thickness of the signal line 704 is preferably greater than or equal to 100 nm and less than or equal to 150 nm.

The region 705 is a region where the signal line 700 and the signal line 704 are provided with the interlayer film 706 provided therebetween. The thickness of the interlayer film 706 is greater than or equal to 10 nm and less than or equal to 300 nm, preferably greater than or equal to 10 nm and less than or equal to 100 nm, more preferably greater than or equal to 10 nm and less than or equal to 30 nm. The interlayer film 706 is formed through the same process as a film (that is, a gate insulating film) that separates the gate electrode and the source and drain electrodes of the second transistor 1302 in FIG. 4.

The signal line 700 and the signal line 704 are separated by only the interlayer film 706 which is thin; however, even when an interlayer insulating film is between the signal line 700 and the signal line 704 is thin, signals input to the signal line 700 and the signal line 704 do not affect each other because the signals are the same in the case of applying the circuit configuration in FIG. 6. Thus, even when there is the region 705 where the signal line 700 and the signal line 704 overlap with each other, the signal line 700 and the signal line 704 can function as wirings.

Figure 9:
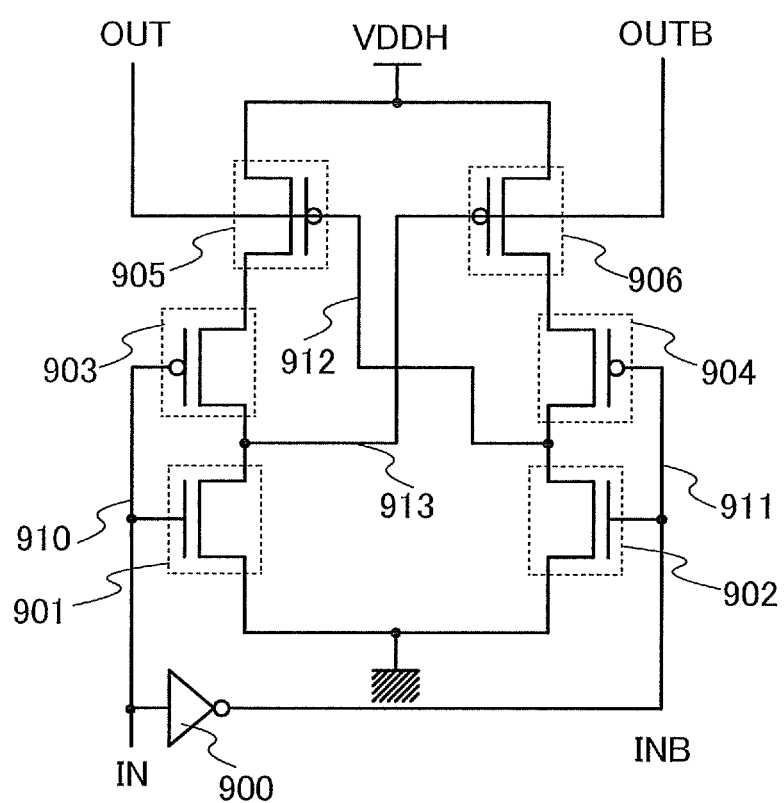
FIG. 9 is a circuit diagram of a semiconductor device.

Next, an example where the circuit configuration in FIG. 2 is applied to the first level shifter 505 and the second level shifter 508 in the semiconductor device in FIG. 5 will be described with reference to FIG. 9. FIG. 9 is a circuit diagram of the first level shifter 505 and the second level shifter 508.

A level shifter in FIG. 9 includes n-channel transistors 901 and 902 and p-channel transistors 903, 904, 905, and 906.

When the level shifter in FIG. 9 is at a high level, the potential of an input signal line and an inverted signal input line is a power supply potential, whereas when the level shifter in FIG. 9 is at a low level, the potential of the lines is a ground potential. Further, when the level shifter in FIG. 9 is at a high level, the potential of an output signal line and an inverted signal output line is a high power-supply potential VDDH, whereas when the level shifter in FIG. 9 is at a low level, the potential of the lines is a ground potential. In the case of the first level shifter 505, VW is used as a high power-supply potential, and in the case of the second level shifter 508, VR is used as a high power-supply potential.

In FIG. 9, one of an input signal line 910 and an output signal line 912 corresponds to the first wiring 302 in FIG. 1A and the other corresponds to the second wiring 303 in FIG. 1A. More specifically, one of the input signal line 910 and the output signal line 912 is formed through the same process as the source electrode and the drain electrode of the second transistor 1202 included in the memory cell 502, and the other is formed through the same process as the gate electrode of the second transistor 1202.

Alternatively, in FIG. 9, one of an inverted signal input line 911 and an inverted signal output line 913 may correspond to the first wiring 302 in FIG. 1A and the other may correspond to the second wiring 303 in FIG. 1A. More specifically, one of the inverted signal input line 911 and the inverted signal output line 913 is formed through the same process as the source electrode and the drain electrode of the second transistor 1202 included in the memory cell 502, and the other is formed through the same process as the gate electrode of the second transistor 1202.

Thus, one of or both an interlayer film between the input signal line 910 and the output signal line 912 and an interlayer film between the inverted signal input line 911 and the inverted signal output line 913 are formed through the same process as the gate insulating film of the second transistor 1202 included in the memory cell 502, so that the thickness of the interlayer film can be reduced. The thickness of the interlayer film can be greater than or equal to 10 nm and less than or equal to 300 nm, preferably greater than or equal to 10 nm and less than or equal to 100 nm, more preferably greater than or equal to 10 nm and less than or equal to 30 nm.

Note that the input signal line 910 is a wiring through which an input signal IN is input, and the inverted signal input line 911 is a wiring through which an inverted signal INB of the input signal is input. Further, an output signal line 912 is a wiring through which an output signal OUT is output, and the inverted signal output line 913 is a wiring through which an inverted signal OUTB of the output signal is output.

Note that when the second transistor 1302 included in the memory cell 502 is a top-gate transistor, it is preferable that the first wiring 302 in FIG. 1A be formed through the same process as the source electrode and the drain electrode of the second transistor 1302, and the second wiring 303 be formed through the same process as the gate electrode of the second transistor 1302. This is because in the second transistor 1302, the source electrode and the drain electrode are thinner than the gate electrode, so that disconnection of the second wiring due to a step height made by the first wiring can be prevented. Note that the thickness of the first wiring (the source electrode and the drain electrode of the second transistor 1302) is preferably greater than or equal to 100 nm and less than or equal to 150 nm.

Note that FIG. 9 illustrates a level shifter which converts a high-level signal from a power supply potential to a high power-supply potential, and one embodiment of the present invention can be similarly applied to a level shifter which converts a low-level signal from a ground potential to a low power-supply potential.

Figure 10:
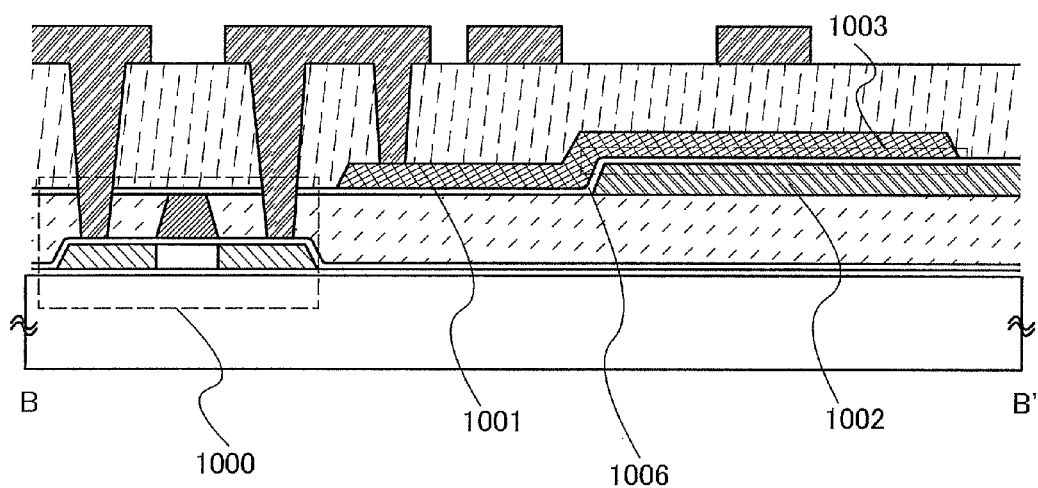
FIG. 10 is a cross-sectional view of a semiconductor device.

FIG. 10 illustrates part of a cross section of the level shifter in FIG. 9. The cross section in FIG. 10 includes a transistor 1000, a wiring 1001, and a wiring 1002. In FIG. 10, the transistor 1000 is formed through the same process as the first transistor 1201 included in the memory cell 502. In addition, the level shifter in FIG. 10 includes a region 1003 where the wiring 1001 and the wiring 1002 overlap with each other. The wiring 1001 is electrically connected to one of a source electrode and a drain electrode of the transistor 1000. Although not illustrated, the wiring 1002 is electrically connected to a gate electrode of a transistor different from the transistor 1000.

The transistor 1000 in FIG. 10 corresponds to a transistor in the inverter 900 in FIG. 9. The wiring 1001 and the wiring 1002 correspond to the inverted signal input line 911 and the inverted signal output line 913 in FIG. 9, respectively. Alternatively, the wiring 1001 and the wiring 1002 correspond to the input signal line 910 and the output signal line 912 in FIG. 9, respectively.

Figure 11:
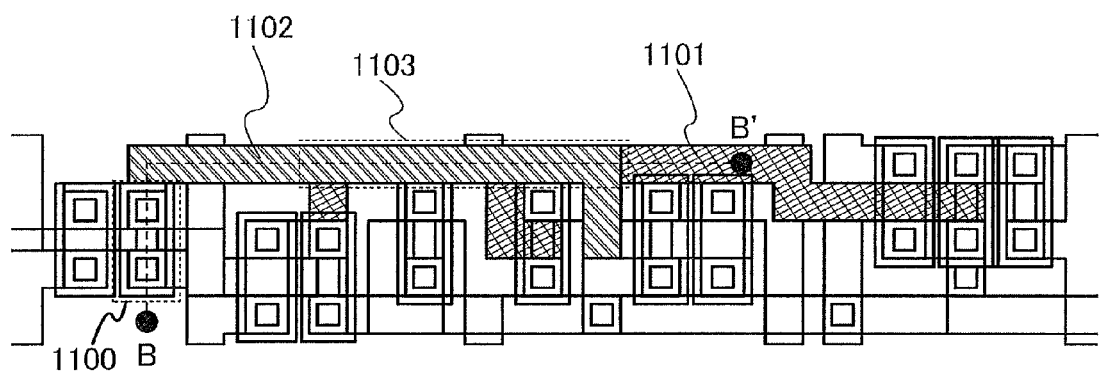
FIG. 11 is a plan view of a semiconductor device.

FIG. 11 is an example of a top view of the level shifter in FIG. 9 and FIG. 10. A dashed line B-B' in FIG. 11 corresponds to B-B' in the cross-sectional view in FIG. 10.

A transistor 1100 in FIG. 11 corresponds to the transistor 1000 in FIG. 10. A wiring 1101 corresponds to the wiring 1001 in FIG. 10. A wiring 1102 corresponds to the wiring 1002 in FIG. 10. A region 1103 where the wiring 1101 and the wiring 1102 overlap with each other corresponds to the region 1003 in FIG. 10.

In FIG. 10, the wiring 1001 is formed through the same process as the gate electrode of the second transistor 1302 in FIG. 4, and the wiring 1002 is formed through the same process as the source electrode and drain electrode of the second transistor 1302 in FIG. 4. Therefore, the thickness of the wiring 1001 is preferably greater than or equal to 200 nm, and the thickness of the wiring 1002 is preferably greater than or equal to 100 nm and less than or equal to 150 nm.

The region 1003 is a region where the wiring 1001 and the wiring 1002 are provided with the interlayer film 1006 provided therebetween. The thickness of the interlayer film 1006 is greater than or equal to 10 nm and less than or equal to 300 nm, preferably greater than or equal to 10 nm and less than or equal to 100 nm, more preferably greater than or equal to 10 nm and less than or equal to 30 nm. The interlayer film 1006 is formed through the same process as a film (that is, a gate insulating film) that separates the gate electrode and the source and drain electrodes of the second transistor 1302 in FIG. 4.

In the level shifter to which the circuit configuration in FIG. 2 is applied, the wiring 1001 and the wiring 1002 are separated by only the thin interlayer film described above; however, even when the interlayer film between the wiring 1001 and the wiring 1002 is thin, an adverse effect due to parasitic capacitance can be suppressed because common-mode signals are input to the wiring 1001 and the wiring 1002. Thus, even when there is the region 1003 where the wiring 1001 and the wiring 1002 overlap with each other, the wiring 1001 and the wiring 1002 can function as wirings.

Figure 12:
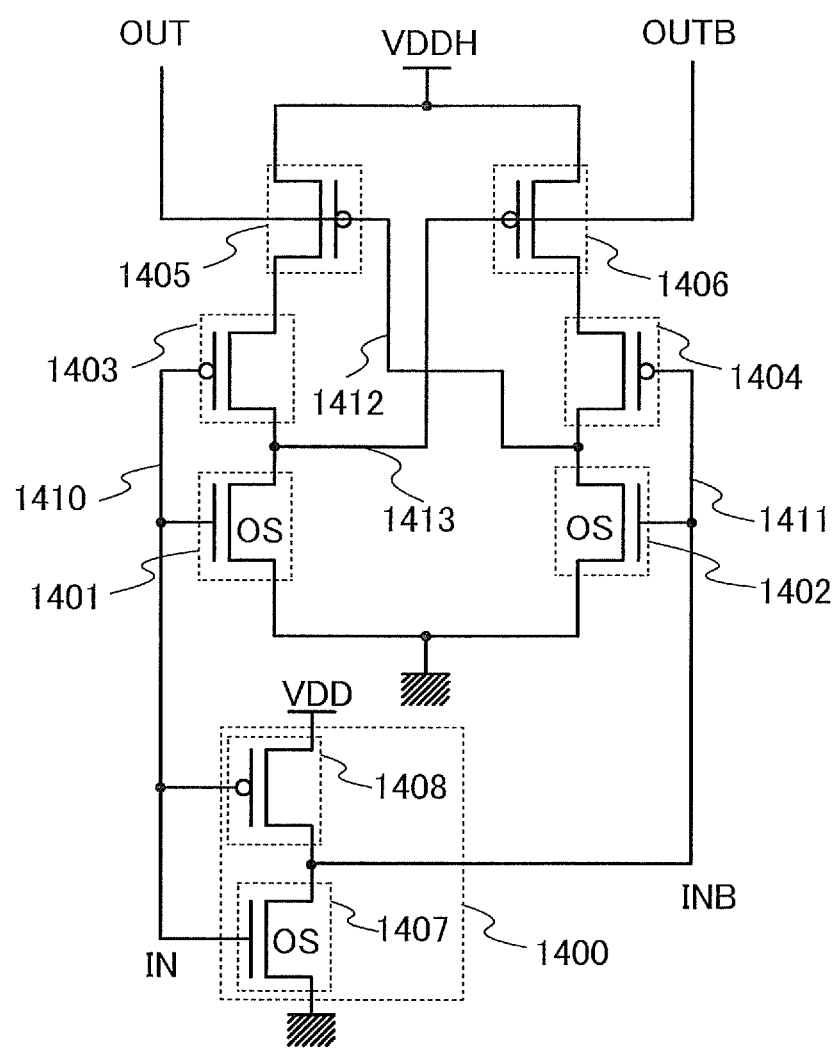
FIG. 12 is a circuit diagram of a semiconductor device.
Figure 13:
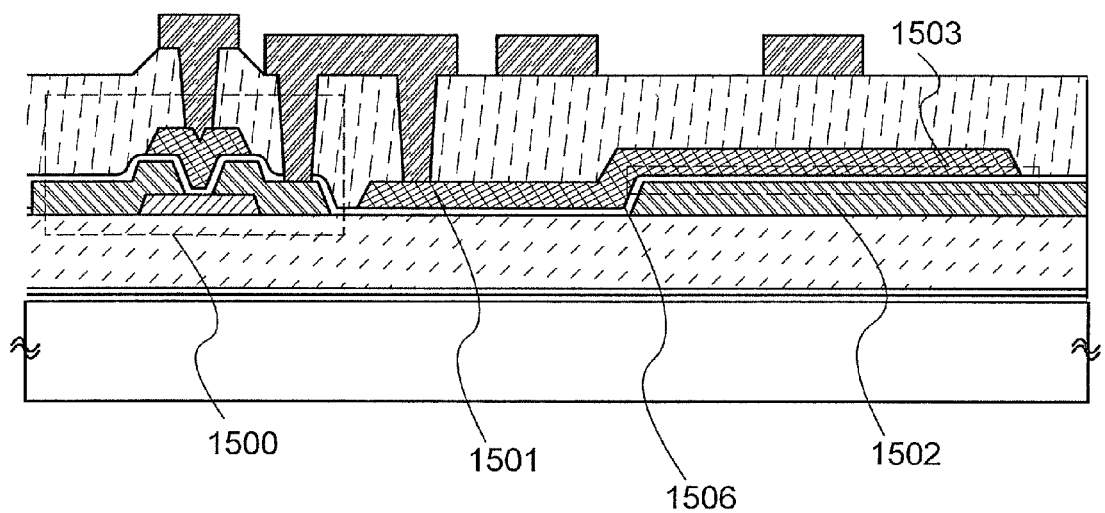
FIG. 13 is a cross-sectional view of a semiconductor device.

An example where the circuit configuration in FIG. 2 is applied to the first level shifter 505 and the second level shifter 508 in the semiconductor device in FIG. 5 is not limited to the structure in FIG. 9, FIG. 10, and FIG. 11. For example, such an example may be a level shifter having a structure in FIG. 12 and FIG. 13. FIG. 12 is a circuit diagram of the first level shifter 505 and the second level shifter 508, and FIG. 13 is a view illustrating part of a cross section of the level shifter in FIG. 12.

The level shifter in FIG. 12 includes an inverter 1400, n-channel transistors 1401 and 1402, and p-channel transistors 1403, 1404, 1405, and 1406. The inverter 1400 includes an n-channel transistor 1407 and a p-channel transistor 1408.

When the level shifter in FIG. 12 is at a high level, the potential of an input signal line and an inverted signal input line is a power supply potential, whereas when the level shifter in FIG. 12 is at a low level, the potential of the lines is a ground potential. Further, when the level shifter in FIG. 12 is at a high level, the potential of an output signal line and an inverted signal output line is a high power-supply potential VDDH, whereas when the level shifter in FIG. 12 is at a low level, the potential of the lines is a ground potential. That is to say, in the case of the first level shifter 505, VW is used as a high power-supply potential, and in the case of the second level shifter 508, VR is used as a high power-supply potential.

In FIG. 12, one of an input signal line 1410 and an output signal line 1412 corresponds to the first wiring 302 in FIG. 1A and the other corresponds to the second wiring 303 in FIG. 1A. More specifically, one of the input signal line 1410 and the output signal line 1412 is formed through the same process as the source electrode and the drain electrode of the second transistor 1202 included in the memory cell 502, and the other is formed through the same process as the gate electrode of the second transistor 1202.

Alternatively, in FIG. 12, one of an inverted signal input line 1411 and an inverted signal output line 1413 may correspond to the first wiring 302 in FIG. 1A and the other may correspond to the second wiring 303 in FIG. 1A. More specifically, one of the inverted signal input line 1411 and the inverted signal output line 1413 is formed through the same process as the source electrode and the drain electrode of the second transistor 1202 included in the memory cell 502, and the other is formed through the same process as the gate electrode of the second transistor 1202.

Thus, an interlayer film between the input signal line 1410 and the output signal line 1412 or an interlayer film between the inverted signal input line 1411 and the inverted signal output line 1413 are formed through the same process as the gate insulating film of the second transistor 1202 included in the memory cell 502, so that the thickness of the interlayer film can be reduced. The thickness of the interlayer film can be greater than or equal to 10 nm and less than or equal to 300 nm, preferably greater than or equal to 10 nm and less than or equal to 100 nm, more preferably greater than or equal to 10 nm and less than or equal to 30 nm.

Note that the input signal line 1410 is a wiring through which an input signal IN is input, and the inverted signal input line 1411 is a wiring through which an inverted signal INB of the input signal is input. Further, an output signal line 1412 is a wiring through which an output signal OUT is output, and the inverted signal output line 1413 is a wiring through which an inverted signal OUTB of the output signal is output.

Note that when the second transistor 1302 included in the memory cell 502 is a top-gate transistor, it is preferable that the first wiring 302 in FIG. 1 be formed through the same process as the source electrode and the drain electrode of the second transistor 1302, and the second wiring 303 be formed through the same process as the gate electrode of the second transistor 1302. This is because in the second transistor 1302, the source electrode and the drain electrode are thinner than the gate electrode, so that disconnection of the second wiring due to a step height made by the first wiring can be prevented. Note that the thickness of the first wiring (the source electrode and the drain electrode of the second transistor 1302) is preferably greater than or equal to 100 nm and less than or equal to 150 nm.

Note that FIG. 12 illustrates a level shifter which converts a high-level signal from a power supply potential to a high power-supply potential, and one embodiment of the present invention can be similarly applied to a level shifter which converts a low-level signal from a ground potential to a low power-supply potential.

FIG. 13 illustrates part of a cross section of the level shifter in FIG. 12. The cross section in FIG. 13 includes a transistor 1500, a wiring 1501, and a wiring 1502. In FIG. 13, the transistor 1500 is formed through the same process as the second transistor 1202 included in the memory cell 502. In addition, the level shifter in FIG. 13 includes a region 1503 where the wiring 1501 and the wiring 1502 overlap with each other. The wiring 1501 is electrically connected to one of a source electrode and a drain electrode of the transistor 1500. Although not illustrated, the wiring 1502 is electrically connected to a gate electrode of a transistor different from the transistor 1500.

The transistor 1500 in FIG. 13 corresponds to the n-channel transistor 1407 in the inverter 1400 in FIG. 12. The wiring 1501 and the wiring 1502 correspond to the inverted signal input line 1411 and the inverted signal output line 1413 in FIG. 12, respectively. Alternatively, the wiring 1501 and the wiring 1502 correspond to the input signal line 1410 and the output signal line 1412 in FIG. 12, respectively.

In FIG. 13, the wiring 1501 is formed through the same process as the gate electrode of the second transistor 1302 in FIG. 4, and the wiring 1502 is formed through the same process as the source electrode and drain electrode of the second transistor 1302 in FIG. 4. Therefore, the thickness of the wiring 1501 is preferably greater than or equal to 200 nm, and the thickness of the wiring 1502 is preferably greater than or equal to 100 nm and less than or equal to 150 nm.

The region 1503 is a region where the wiring 1501 and the wiring 1502 are provided with the interlayer film 1506 provided therebetween. The thickness of the interlayer film 1506 is greater than or equal to 10 nm and less than or equal to 300 nm, preferably greater than or equal to 10 nm and less than or equal to 100 nm, more preferably greater than or equal to 10 nm and less than or equal to 30 nm. The interlayer film 1506 is formed through the same process as a film (that is, a gate insulating film) that separates the gate electrode and the source and drain electrodes of the second transistor 1302 in FIG. 4.

In the level shifter to which the circuit configuration in FIG. 2 is applied, the wiring 1501 and the wiring 1502 are separated by only the thin interlayer film described above; however, even when the interlayer film between the wiring 1501 and the wiring 1502 is thin, an adverse effect due to parasitic capacitance can be suppressed because common-mode signals are input to the wiring 1501 and the wiring 1502. Thus, even when there is the region 1503 where the wiring 1501 and the wiring 1502 overlap with each other, the wiring 1501 and the wiring 1502 can function as wirings.

Figure 14:
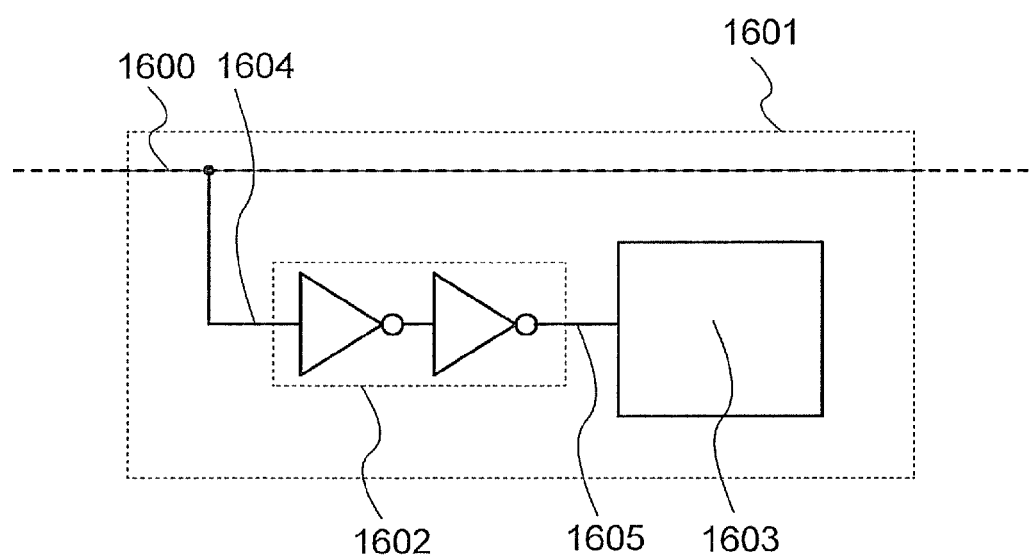
FIG. 14 is a circuit diagram of a semiconductor device.

Next, an example where the structure in FIG. 1A is applied to a circuit including a buffer, which can be used also in the semiconductor device in FIG. 5, will be described with reference to FIG. 14. FIG. 14 illustrates an embodiment of a circuit including a common signal line through which a signal is input to a plurality of circuits included in a semiconductor device, a signal line which diverges from the signal line and is used as a wiring in the circuit.

The circuit 1601 in FIG. 14 includes a buffer 1602 and a circuit 1603. An input electrode of the buffer 1602 is electrically connected to a signal line 1604. The signal line 1600 is a common signal line which drives a plurality of circuits including the circuit 1601, and is electrically connected to the signal line 1604. A signal line 1605 is electrically connected to an output terminal of the buffer 1602 and an input terminal of the circuit 1603.

In FIG. 14, the signal line 1604 and the signal line 1600 correspond to the first wiring 302 and the second wiring 303 in FIG. 1A, respectively. More specifically, the signal line 1604 is formed through the same process as the source electrode and the drain electrode of the second transistor 1202 included in the memory cell 502, and the signal line 1600 is formed through the same process as the gate electrode of the second transistor 1202. Similarly, the signal line 1605 can correspond to the first wiring 302 in FIG. 1A.

Thus, the gate insulating film of the second transistor 1202 included in the memory cell 502, an interlayer film between the signal line 1600 and the signal line 1604, and an interlayer film between the signal line 1600 and the signal line 1605 are formed through the same process, so that the thicknesses of the interlayer films can be reduced. The thickness of the interlayer film can be greater than or equal to 10 nm and less than or equal to 300 nm, preferably greater than or equal to 10 nm and less than or equal to 100 nm, more preferably greater than or equal to 10 nm and less than or equal to 30 nm.

Note that when the second transistor 1202 included in the memory cell 502 is a top-gate transistor, it is preferable that the first wiring 302 in FIG. 1 be formed through the same process as the source electrode and the drain electrode of the second transistor 1302, and the second wiring 303 be formed through the same process as the gate electrode of the second transistor 1302. This is because in the second transistor 1302, the source electrode and the drain electrode are thinner than the gate electrode, so that disconnection of the second wiring due to a step height made by the first wiring can be prevented. Note that the thickness of the first wiring (the source electrode and the drain electrode of the second transistor 1302) is preferably greater than or equal to 100 nm and less than or equal to 150 nm.

The structures, the methods, and the like described in this embodiment can be combined as appropriate with any of the structures, the methods, and the like described in the other embodiments.

Embodiment 3

In this embodiment, a structure and a manufacturing method of a semiconductor device according to one embodiment of the disclosed invention will be described with reference to FIGS. 15A to 20C. Specifically, a structure and a manufacturing method of a memory cell which can be mounted on a storage device will be described.

<Cross-sectional Structure and Planar Structure of Semiconductor Device>

Figure 15A:
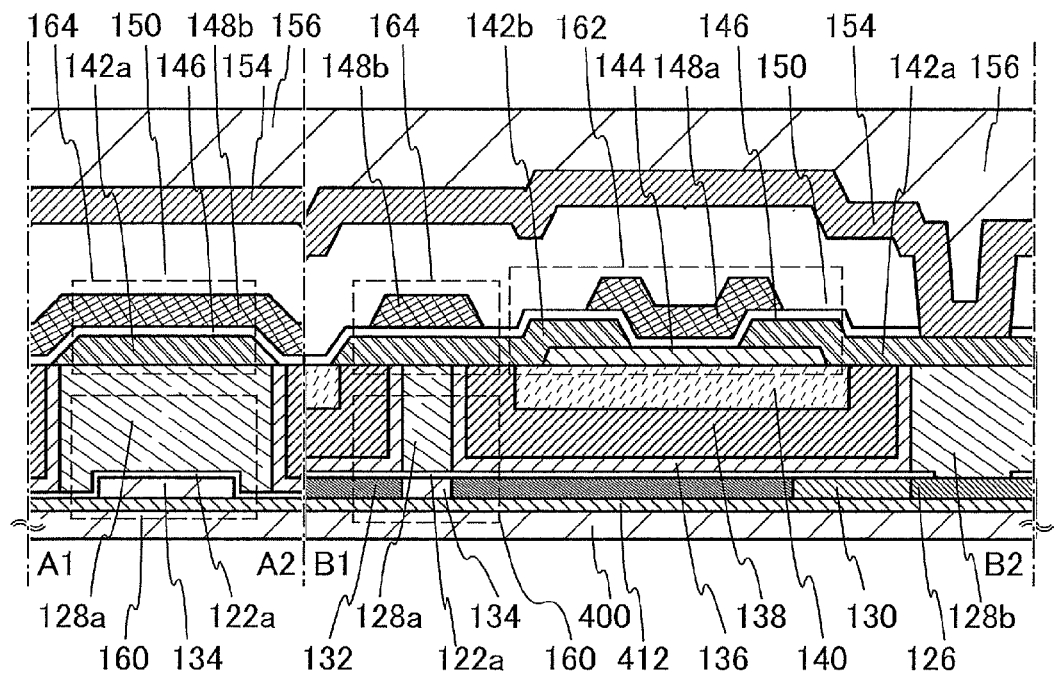
FIG. 15A is a cross-sectional view of a semiconductor device.
Figure 15B:
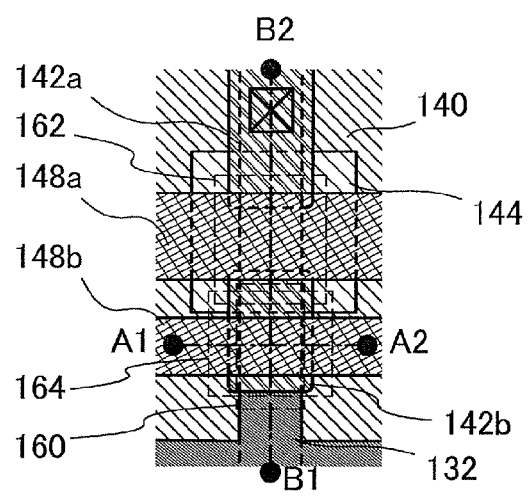
FIG. 15B is a plan view thereof.

FIGS. 15A and 15B illustrate an example of a structure of the semiconductor device. FIG. 15A illustrates a cross section of the semiconductor device, and FIG. 15B illustrates a plan view of the semiconductor device. Here, FIG. 15A corresponds to a cross section along A1-A2 and B1-B2 in FIG. 15B. The semiconductor device illustrated in FIGS. 15A and 15B includes a transistor 160 including a first semiconductor material in a lower portion, and a transistor 162 including a second semiconductor material in an upper portion. Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, or gallium arsenide and is preferably single crystalline. Alternatively, an organic semiconductor material or the like may be used. A transistor including such a semiconductor material other than an oxide semiconductor can operate at high speed easily. On the other hand, a transistor including an oxide semiconductor can hold electric charge for a long time owing to its characteristics. The semiconductor device in FIGS. 15A and 15B can be used as a memory cell.

Since the technical nature of the disclosed invention is to use a semiconductor material with which off-state current can be sufficiently decreased, such as an oxide semiconductor, in the transistor 162 so that data can be stored, it is not necessary to limit a specific structure of the semiconductor device, such as a material of the semiconductor device or a structure of the semiconductor device, to the structure described here.

The transistor 160 in FIGS. 15A and 15B includes a channel formation region 134 provided in a semiconductor layer over a semiconductor substrate 400, impurity regions 132 (also referred to as a source region and a drain region) provided with the channel formation region 134 provided therebetween, a gate insulating film 122a provided over the channel formation region 134, and a gate electrode 128a provided over the gate insulating film 122a so as to overlap with the channel formation region 134. Note that a transistor whose source electrode and drain electrode are not illustrated explicitly in a drawing may be referred to as a transistor for the sake of convenience. Further, in such a case, in description of connection relation of a transistor, a source region and a source electrode are collectively referred to as a "source electrode," and a drain region and a drain electrode are collectively referred to as a "drain electrode". That is, in this specification, the term "source electrode" may include a source region. Further, the term "drain electrode" may include a drain region.

Further, a conductive layer 128b is connected to an impurity region 126 provided in the semiconductor layer over the semiconductor substrate 400. Here, the conductive layer 128b functions also as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that in order to realize higher integration, the transistor 160 preferably has a structure without a sidewall insulating layer as illustrated in FIGS. 15A and 15B. On the other hand, when the characteristics of the transistor 160 have priority, sidewall insulating layers may be provided on side surfaces of the gate electrode 128a, and the impurity region 132 may include regions with different impurity concentrations.

The transistor 162 in FIGS. 15A and 15B includes an oxide semiconductor layer 144 provided over the insulating layer 140 and the like, a source (or drain) electrode 142a and a drain (or source) electrode 142b which are electrically connected to the oxide semiconductor layer 144, a gate insulating film 146 covering the oxide semiconductor layer 144 and the source and drain electrodes 142a and 142b, and a gate electrode 148a provided over the gate insulating film 146 so as to overlap with the oxide semiconductor layer 144.

Here, the oxide semiconductor layer 144 is preferably highly purified by sufficiently removing impurities such as hydrogen or sufficiently supplying oxygen. Specifically, the hydrogen concentration in the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration in the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer (μm) of channel width) at room temperature (25° C.) is lower than or equal to 100 zA (1 zA (zeptoampere) is $1 \times 10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

Although the oxide semiconductor layer 144 which is processed to have an island shape is used in order to suppress leakage current generated between elements due to miniaturization in the transistor 162 of FIGS. 15A and 15B, a structure including the oxide semiconductor layer 144 which is not processed to have an island shape may be employed. In the case where the oxide semiconductor layer is not processed to have an island shape, contamination of the oxide semiconductor layer 144 due to etching in the processing can be prevented.

A capacitor 164 in FIGS. 15A and 15B includes the drain electrode 142b, the gate insulating layer 146, and a conductive layer 148b. That is to say, the drain electrode 142b functions as one of electrodes of the capacitor 164, and the conductive layer 148b functions as the other electrode of the capacitor 164. With such a structure, capacitance can be sufficiently secured. Further, when the oxide semiconductor layer 144 and the gate insulating layer 146 are stacked, insulation between the drain electrode 142b and the conductive layer 148b can be sufficiently secured. The capacitor 164 may be omitted in the case where a capacitor is not needed.

In this embodiment, the transistor 162 and the capacitor 164 are provided so as to at least overlap with the transistor 160. By employing such a planar layout, high integration can be realized. For example, given that the minimum feature size is F, the area occupied by a memory cell can be $15F^2$ to $25F^2$.

An insulating layer 150 is provided over the transistor 162 and the capacitor 164. A wiring 154 is provided in an opening formed in the gate insulating film 146 and the insulating layer 150. The wiring 154 electrically connects one memory cell to another memory cell. The wiring 154 is connected to the impurity region 126 through the source electrode 142a and the conductive layer 128b. The above structure allows a reduction in the number of wirings in comparison with a structure in which the source region or the drain region in the transistor 160 and the source electrode 142a in the transistor 162 are connected to different wirings. Thus, the integration degree of the semiconductor device can be increased.

Since the conductive layer 128b is provided, a position where the impurity region 126 and the source electrode 142a are connected to each other and a position where the source electrode 142a and the wiring 154 are connected to each other can overlap with each other. With such a planar layout, the element area can be prevented from increasing due to contact regions. In other words, the degree of integration of the semiconductor device can be increased.

Note that in the semiconductor device in FIGS. 15A and 15B, a layer including the transistor 160 corresponds to the element formation layer 301 in FIG. 1A. A semiconductor storage device described in this embodiment includes the memory cell in FIGS. 15A and 15B and a driver circuit portion (not illustrated) for driving the memory cell. The first wiring 302 in FIG. 1A corresponds to a wiring in the driver circuit portion, which is formed through the same process as the source electrode 142a (drain electrode 142b) of the transistor 162 (a wiring in the same layer as the source electrode 142a (drain electrode 142b) of the transistor 162). The first interlayer film 305 in FIG. 1A corresponds to an insulating layer in the driver circuit portion, which is formed through the same process as the gate insulating film 146 of the transistor 162. Note that the gate insulating film 146 which is not patterned may be used as the first interlayer film 305. The second wiring 303 in FIG. 1A corresponds to a wiring in the driver circuit portion, which is formed through the same process as the gate electrode 148a of the transistor 162. The second interlayer film 306 in FIG. 1A corresponds to an insulating layer formed through the same process as the insulating layer 150 of the transistor 162. Note that the insulating layer 150 which is not patterned may be used as the second interlayer film 306. The third wiring 304 in FIG. 1A corresponds to a wiring in the driver circuit portion, which is formed through the same process as the wiring 154 of the transistor 162.

<Manufacturing Method of SOI Substrate>

Next, an example of a method for manufacturing an SOI substrate used for manufacturing the above semiconductor device will be described with reference to FIGS. 16A to 16G.

Figure 16A:
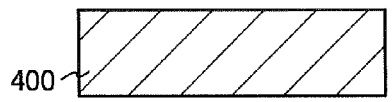
FIGS. 16A to 16G are cross-sectional views illustrating manufacturing steps of a semiconductor device.
Figure 16B:
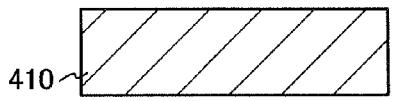

First, the semiconductor substrate 400 is prepared as a base substrate (see FIG. 16A). As the semiconductor substrate 400, a semiconductor substrate such as a single crystal silicon substrate or a single crystal germanium substrate can be used. Alternatively, as the semiconductor substrate, a solar-grade silicon (SOG-Si) substrate or the like may be used. Still alternatively, a polycrystalline semiconductor substrate may be used. In the case of using a SOG-Si substrate, a polycrystalline semiconductor substrate, or the like, the manufacturing cost can be reduced as compared to the case of using a single crystal silicon substrate or the like.

Note that a variety of glass substrates that are used in the electronics industry, such as an aluminosilicate glass substrate, an aluminoborosilicate glass substrate, and a barium borosilicate glass substrate; a quartz substrate; a ceramic substrate; and a sapphire substrate may be used instead of the semiconductor substrate 400. Still alternatively, a ceramic substrate which contains silicon nitride and aluminum nitride as its main components and has a thermal expansion coefficient close to that of silicon may be used.

A surface of the semiconductor substrate 400 is preferably cleaned in advance. Specifically, the semiconductor substrate 400 is preferably cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 410 is used as the bond substrate (see FIG. 16B). Note that although a substrate whose crystallinity is single crystal is used as the bond substrate here, the crystallinity of the bond substrate is not necessarily limited to single crystal.

As the single crystal semiconductor substrate 410, for example, a single crystal semiconductor substrate formed using a Group 14 element, such as a single crystal silicon substrate, a single crystal germanium substrate, or a single crystal silicon germanium substrate, can be used. Further, a compound semiconductor substrate of gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the single crystal semiconductor substrate 410 is not necessarily circular and may be a substrate which has been processed to be rectangular, for example. Further, the single crystal semiconductor substrate 410 can be formed by a Czochralski (CZ) method or a Floating Zone (FZ) method.

Figure 16C:
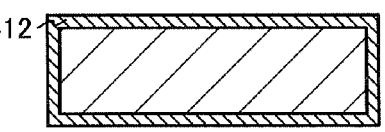

An oxide film 412 is formed over a surface of the single crystal semiconductor substrate 410 (see FIG. 16C). In view of removal of contaminants, it is preferable that the surface of the single crystal semiconductor substrate 410 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like before the formation of the oxide film 412. Diluted hydrogen fluoride and ozone water may be discharged alternately to clean the surface of the single crystal semiconductor substrate 410.

The oxide film 412 can be formed to have a single-layer or layered structure including any of a silicon oxide film, a silicon oxynitride film, and the like. As a method for forming the oxide film 412, a thermal oxidation method, a CVD method, a sputtering method, or the like can be employed. When the oxide film 412 is formed by a CVD method, a silicon oxide film is preferably formed using organosilane such as tetraethoxysilane (abbreviation: TEOS) (chemical formula: $Si(OC_2H_5)_4$) so that favorable bonding can be achieved.

In this embodiment, the oxide film 412 (here, a $SiO_x$ film) is formed by performing thermal oxidation treatment on the single crystal semiconductor substrate 410. The thermal oxidation treatment is preferably performed in an oxidizing atmosphere to which a halogen is added.

For example, thermal oxidation treatment of the single crystal semiconductor substrate 410 is performed in an oxidizing atmosphere to which chlorine (Cl) is added, whereby the oxide film 412 can be formed through chlorine oxidation. In that case, the oxide film 412 is a film containing chlorine atoms. By such chlorine oxidation, a heavy metal (such as Fe, Cr, Ni, or Mo) that is an extrinsic impurity is trapped and a chloride of the metal is formed, which is then removed to the outside, whereby contamination of the single crystal semiconductor substrate 410 can be reduced.

Note that the halogen atoms contained in the oxide film 412 are not limited to chlorine atoms. Fluorine atoms may be contained in the oxide film 412. As a method of fluorine oxidation of the surface of the single crystal semiconductor substrate 410, a method in which the single crystal semiconductor substrate 410 is soaked in an HF solution and then subjected to thermal oxidation treatment in an oxidizing atmosphere, a method in which thermal oxidation treatment is performed in an oxidizing atmosphere to which $NF_3$ is added, or the like can be employed.

Figure 16D:
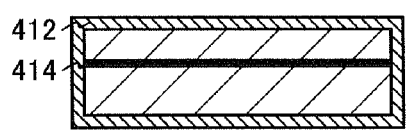
Figure 16E:
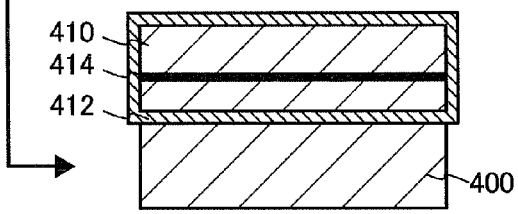

Next, ions are accelerated by an electric field and the single crystal semiconductor substrate 410 is exposed to the ions so that the ions are added to the single crystal semiconductor substrate 410, whereby an embrittled region 414 where the crystal structure is damaged is formed in the single crystal semiconductor substrate 410 at a predetermined depth (see FIG. 16D).

The depth at which the embrittled region 414 is formed can be adjusted by the kinetic energy, the mass, electric charge, or the incident angle of the ions, or the like. The embrittled region 414 is formed at approximately the same depth as the average penetration depth of the ions. Therefore, the thickness of a single crystal semiconductor layer to be separated from the single crystal semiconductor substrate 410 can be controlled by the depth at which the ions are added. For example, the average penetration depth may be controlled such that the thickness of a single crystal semiconductor layer is approximately 10 nm to 500 nm, preferably, 50 nm to 200 nm.

The ion exposure treatment can be performed with an ion-doping apparatus or an ion implantation apparatus. As a typical example of the ion-doping apparatus, there is a non-mass-separation type apparatus in which plasma excitation of a process gas is performed and an object to be processed is exposed to all kinds of ion species generated. In this apparatus, the object to be processed is exposed to ion species of plasma without mass separation. In contrast, an ion implantation apparatus is a mass-separation apparatus. In the ion-implantation apparatus, mass separation of ion species of plasma is performed and the object to be processed is exposed to ion species having predetermined mass.

In this embodiment, an example will be described in which an ion-doping apparatus is used to add hydrogen to the single crystal semiconductor substrate 410. A gas containing hydrogen is used as a source gas. As for ions used for the exposure, the proportion of $H_3+$ is preferably set high. Specifically, it is preferable that the proportion of $H_3^+$ be set 50% or higher (more preferably, 80% or higher) with respect to the total amount of $H^-$, $H_2^+$, and $H_3^+$. With an increase in proportion of $H_3^+$, the efficiency of ion exposure can be improved.

Note that ions to be added are not limited to ions of hydrogen. Ions of helium or the like may be added. Further, ions to be added are not limited to one kind of ions, and plural kinds of ions may be added. For example, in the case of performing exposure to hydrogen and helium simultaneously using an ion-doping apparatus, the number of steps can be reduced as compared to the case of performing exposure to hydrogen and helium in different steps, and surface roughness of a single crystal semiconductor layer to be formed later can be suppressed.

Note that heavy metal may also be added when the embrittled region 414 is formed using the ion-doping apparatus; however, the ion exposure is performed through the oxide film 412 containing halogen atoms, whereby contamination of the single crystal semiconductor substrate 410 due to the heavy metal can be prevented.

Then, the semiconductor substrate 400 and the single crystal semiconductor substrate 410 are disposed to face each other and firmly attached to each other with the oxide film 412 provided therebetween. Thus, the semiconductor substrate 400 and the single crystal semiconductor substrate 410 can be bonded to each other (see FIG. 16E). Note that an oxide film or a nitride film may be formed over a surface of the semiconductor substrate 400 to which the single crystal semiconductor substrate 410 is to be attached.

When bonding is performed, it is preferable that a pressure of 0.001 $N/cm^2$ or more and 100 $N/cm^2$ or less, e.g., a pressure of 1 $N/cm^2$ or more and 20 $N/cm^2$ or less, be applied to one part of the semiconductor substrate 400 or one part of the single crystal semiconductor substrate 410. When the bonding surfaces are made close to each other and firmly attached to each other by applying pressure, bonding between the semiconductor substrate 400 and the oxide film 412 is generated at the part where they are firmly attached, and the bonding spontaneously spreads to almost the entire area. This bonding is performed under the action of the Van der Waals force or hydrogen bonding and can be performed at room temperature.

Note that before the single crystal semiconductor substrate 410 and the semiconductor substrate 400 are bonded to each other, surfaces to be bonded to each other are preferably subjected to surface treatment. Surface treatment can improve the bonding strength at the interface between the single crystal semiconductor substrate 410 and the semiconductor substrate 400.

As the surface treatment, wet treatment, dry treatment, or a combination of wet treatment and dry treatment can be employed. Alternatively, wet treatment may be employed in combination with different wet treatment or dry treatment may be employed in combination with different dry treatment.

Note that heat treatment for increasing the bonding strength may be performed after bonding. This heat treatment is performed at a temperature at which separation along the embrittled region 414 does not occur (for example, a temperature higher than or equal to room temperature and lower than 400° C.). Alternatively, the semiconductor substrate 400 and the oxide film 412 may be bonded to each other while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 16F:
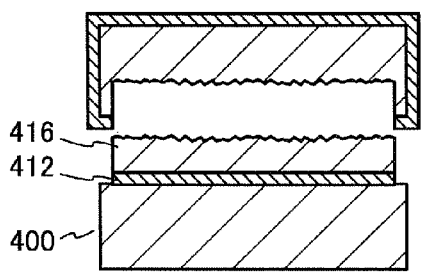

Next, heat treatment is performed so that separation of the single crystal semiconductor substrate 410 is caused at the embrittlement region, whereby a single crystal semiconductor layer 416 is formed over the semiconductor substrate 400 with the oxide film 412 provided therebetween (FIG. 16F).

Note that the temperature for heat treatment in the separation is preferably as low as possible. This is because as the temperature in the separation is lower, generation of roughness on the surface of the single crystal semiconductor layer 416 can be suppressed. Specifically, the temperature for the heat treatment in the separation may be higher than or equal to 300° C. and lower than or equal to 600° C., and the heat treatment is more effective when the temperature is higher than or equal to 400° C. and lower than or equal to 500° C.

Note that after separation of the single crystal semiconductor substrate 410, the single crystal semiconductor layer 416 may be subjected to heat treatment at a temperature of 500° C. or higher so that concentration of hydrogen remaining in the single crystal semiconductor layer 416 is reduced.

Figure 16G:
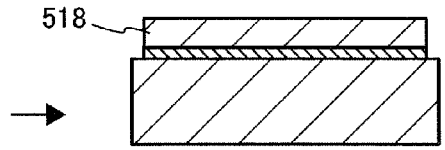

Next, a surface of the single crystal semiconductor layer 416 is irradiated with laser light, whereby a single crystal semiconductor layer 418 whose surface evenness is improved and whose defects are reduced is formed (see FIG. 16G). Note that instead of the laser light irradiation treatment, heat treatment may be performed.

Although the laser light irradiation treatment is performed immediately after the heat treatment for separation of the single crystal semiconductor layer 416 in this embodiment, one embodiment of the present invention is not construed as being limited to this. The laser light irradiation treatment may be performed after the heat treatment for separation of the single crystal semiconductor layer 416 and etching treatment for removing a region including many defects at the surface of the single crystal semiconductor layer 416 are performed in this order. Alternatively, the laser light irradiation treatment may be performed after the surface evenness of the single crystal semiconductor layer 416 is improved. Note that the etching treatment may be either wet etching or dry etching. Further, in this embodiment, after the above laser light irradiation, a step of reducing the thickness of the single crystal semiconductor layer 416 may be performed. In order to reduce the thickness of the single crystal semiconductor layer 416, either or both dry etching or/and wet etching may be employed.

Through the above steps, an SOI substrate including the single crystal semiconductor layer 418 with favorable characteristics can be obtained (see FIG. 16G).

<Manufacturing Method of Semiconductor Device>

Next, a method for manufacturing a semiconductor device formed using the SOI substrate will be described with reference to FIGS. 17A to 17E, FIGS. 18A to 18D, FIGS. 19A to 19D, and FIGS. 20A to 20C.

<Manufacturing Method of Lower Transistor>

First, a manufacturing method of the transistor 160 in the lower portion will be described with reference to FIGS. 17A to 17E and FIGS. 18A to 18D. Note that FIGS. 17A to 17E and FIGS. 18A to 18D illustrate part of the SOI substrate formed by the method illustrated in FIGS. 16A to 16G and are cross-sectional views illustrating a process for manufacturing the transistor in the lower portion in FIG. 15A.

Figure 17A:
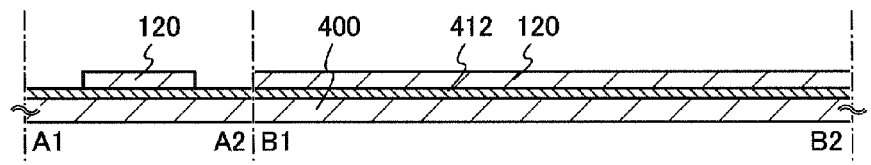
FIGS. 17A to 17E are cross-sectional views illustrating manufacturing steps of a semiconductor device.

First, the single crystal semiconductor layer 418 is patterned to have an island shape, so that a semiconductor layer 120 is formed (see FIG. 17A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 17B:
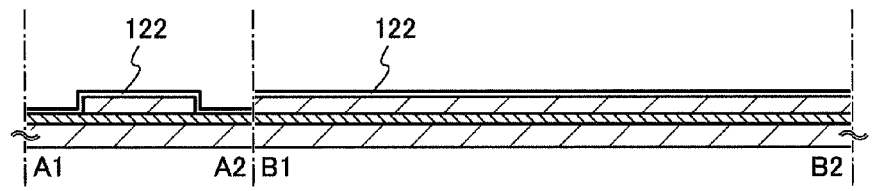

Next, an insulating layer 122 is formed so as to cover the semiconductor layer 120 (see FIG. 17B). The insulating layer 122 is to be a gate insulating film later. The insulating layer 122 can be formed, for example, by performing heat treatment (thermal oxidation treatment, thermal nitridation treatment, or the like) on a surface of the semiconductor layer 120. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. It is needless to say that the insulating layer may be formed by a CVD method, a sputtering method, or the like. The insulating layer 122 preferably has a single-layer or layered structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The thickness of the insulating layer 122 may be, for example, greater than or equal to 1 nm and less than or equal to 100 nm, preferably greater than or equal to 10 nm and less than or equal to 50 nm. In this embodiment, a single-layer insulating layer containing silicon oxide is formed by a plasma CVD method.

Figure 17C:
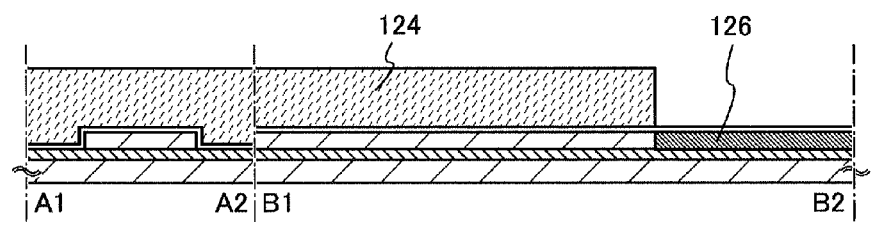

Next, a mask 124 is formed over the insulating layer 122 and an impurity element imparting one conductivity type is added to the semiconductor layer 120, so that the impurity region 126 is formed (see FIG. 17C). Note that the mask 124 is removed after the impurity element is added.

Figure 17D:
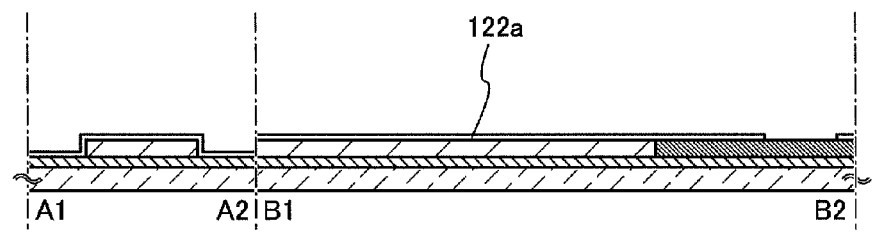

Next, a mask is formed over the insulating layer 122 and a portion of the insulating layer 122 that overlaps with the impurity region 126 is partly removed, so that the gate insulating layer 122a is formed (see FIG. 17D). The portion of the insulating layer 122 can be removed by etching such as wet etching or dry etching.

Figure 17E:
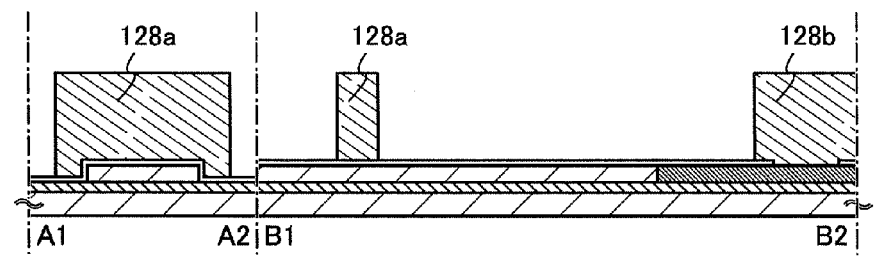

Next, a conductive layer for forming a gate electrode (including a wiring formed in the same layer as the gate electrode) is formed over the gate insulating layer 122a and is processed, so that the gate electrode 128a and the conductive layer 128b are formed (see FIG. 17E).

The conductive layer used for the gate electrode 128a and the conductive layer 128b can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and any of a variety of formation methods such as an evaporation method, a CVD method, a sputtering method, and a spin coating method can be employed. The conductive layer may be processed by etching using a resist mask.

Figure 18A:
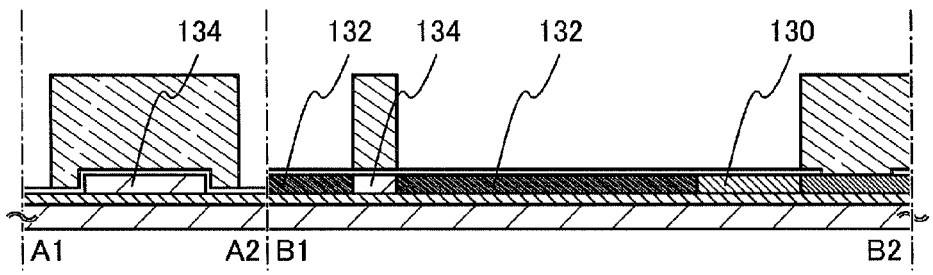
FIGS. 18A to 18D are cross-sectional views illustrating manufacturing steps of the semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 18A). For example, an impurity element such as phosphorus (P) or arsenic (As) may be added in order to form an n-channel transistor, whereas an impurity element such as boron (B) or aluminum (Al) may be added in order to form a p-channel transistor. Here, the concentration of an impurity element to be added can be set as appropriate. In addition, after the impurity element is added, heat treatment for activation is performed. Here, the descending order of concentration of the impurity element in the impurity region among the impurity region 126, the impurity region 132, and the impurity region 130 is as follows: the impurity region 126, the impurity region 132, and the impurity region 130.

Figure 18B:
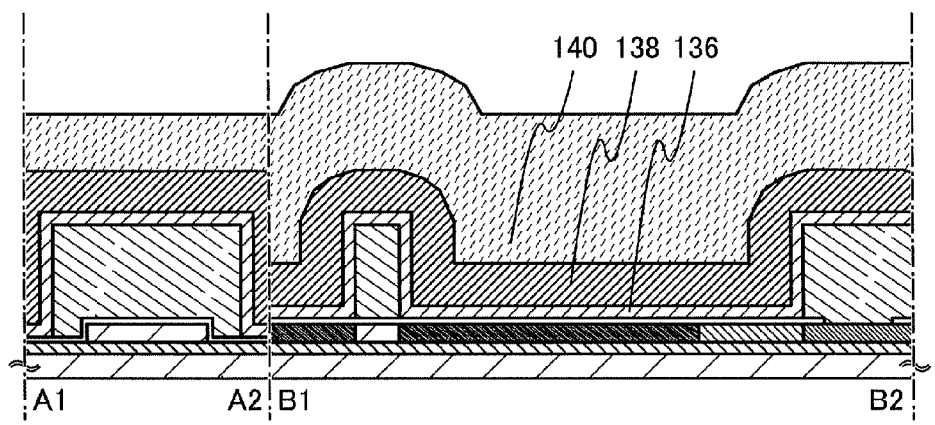

Next, the insulating layer 136, the insulating layer 138, and the insulating layer 140 are formed so as to cover the gate insulating layer 122a, the gate electrode 128a, and the conductive layer 128b (see FIG. 18B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material because capacitance due to overlapping electrodes or wirings can be sufficiently reduced. Note that the insulating layer 136, the insulating layer 138, and the insulating layer 140 may be porous insulating layers formed using any of the above materials. Since the porous insulating layer has a low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. Note that a layered structure of the insulating layer 136, the insulating layer 138, and the insulating layer 140 is employed here; however, one embodiment of the disclosed invention is not limited to this. A single-layer structure, a two-layer structure, or a layered structure of four or more layers may alternatively be used.

Figure 18C:
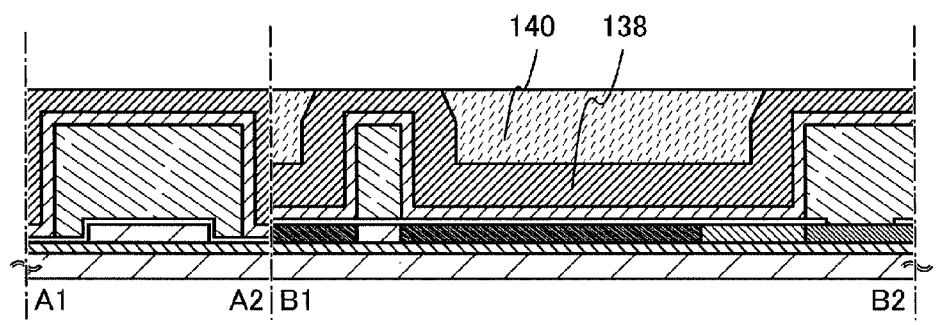

Next, the insulating layer 138 and the insulating layer 140 are subjected to chemical mechanical polishing (CMP) treatment or etching treatment, so that the insulating layer 138 and the insulating layer 140 are planarized (see FIG. 18C). Here, CMP treatment is performed until the insulating layer 138 is partly exposed. When silicon nitride oxide is used for the insulating layer 138 and silicon oxide is used for the insulating layer 140, the insulating layer 138 functions as an etching stopper.

Figure 18D:
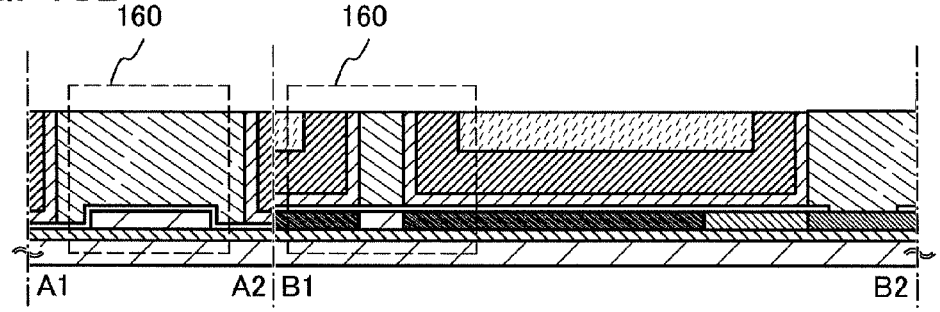

Next, the insulating layer 138 and the insulating layer 140 are subjected to CMP treatment or etching treatment, so that upper surfaces of the gate electrode 128a and the conductive layer 128b are exposed (see FIG. 18D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, surfaces of the insulating layer 136, the insulating layer 138, and the insulating layer 140 are preferably planarized as much as possible.

Through the above steps, the transistor 160 in the lower portion can be formed (see FIG. 18D).

Note that before or after the above steps, a step for forming an additional electrode, wiring, semiconductor layer, insulating layer, or the like may be performed. For example, a multilayer wiring structure in which an insulating layer and a conductive layer are stacked may be employed as a wiring structure to provide a highly-integrated semiconductor device.

<Manufacturing Method of Upper Transistor>

Next, a manufacturing method of the transistor 162 in the upper portion will be described with reference to FIGS. 19A to 19D and FIGS. 20A to 20C.

Figure 19A:
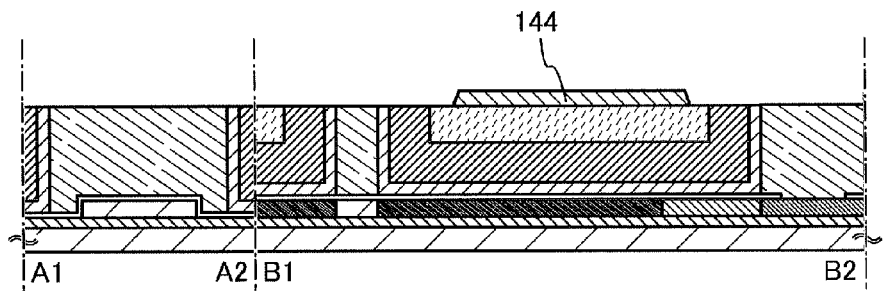
FIGS. 19A to 19D are cross-sectional views illustrating manufacturing steps of the semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 19A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

An oxide semiconductor to be used preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Z-based oxide may contain another metal element in addition to In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Still alternatively, a material represented by $In_3SnO_5(ZnO)_n$ (n>0 is satisfied, and n is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that one embodiment of the disclosed invention is not limited thereto, and a material having appropriate composition depending on semiconductor characteristics (mobility, threshold, variation, and the like) may be used. Further, it is preferable to appropriately set the carrier concentration, the impurity concentration, the defect density, the atomic ratio of a metal element and oxygen, the interatomic distance, the density, or the like in order to obtain necessary semiconductor characteristics.

For example, with an In—Sn—Zn-based oxide, high mobility can be realized relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \le r^2$. A variable r may be 0.05, for example. The same can be applied to other oxides.

The oxide semiconductor may be either a single crystal oxide semiconductor or a non-single-crystal oxide semiconductor. In the latter case, the non-single-crystal oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be suppressed, and relatively high mobility can be obtained with relative ease.

In an oxide semiconductor having crystallinity, defects in the bulk can be further reduced and when surface evenness is improved, mobility higher than that of an oxide semiconductor layer in an amorphous state can be realized. In order to improve the surface evenness, the oxide semiconductor is preferably formed over a flat surface. Specifically, the oxide semiconductor may be formed over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with the following equation.

$$Ra = \frac{1}{S_0} \int_{x_2}^{x_1} \int_{y_2}^{y_1} |f(x, y) - Z_0| \, dx \, dy \qquad \text{[EQUATION 1]}$$

Note that in Equation 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents average height of a measurement surface. Ra can be measured using an atomic force microscope (AFM).

In this embodiment, an oxide including a crystal with c-axis alignment (also referred to as a C-Axis Aligned Crystal (CAAC)), which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including a CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 24A to 24E, FIGS. 25A to 25C, and FIGS. 26A to 26C. In FIGS. 24A to 24E, FIGS. 25A to 25C, and FIGS. 26A to 26C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 24A:
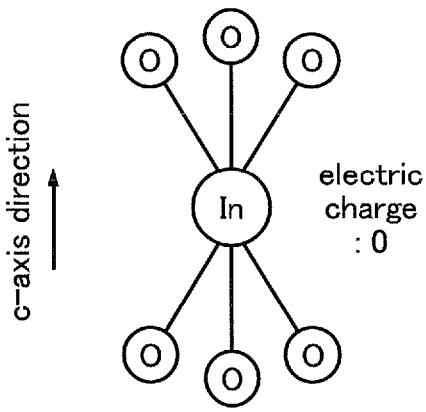
FIGS. 24A to 24E are diagrams each illustrating a structure of an oxide material according to one embodiment of the present invention.

FIG. 24A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 24A is actually an octahedral structure, but is illustrated as a planar structure for simplicity. Note that three tetracoordinate O atoms exist in each of an upper half and a lower half in FIG. 24A. In the small group illustrated in FIG. 24A, electric charge is 0.

Figure 24D:
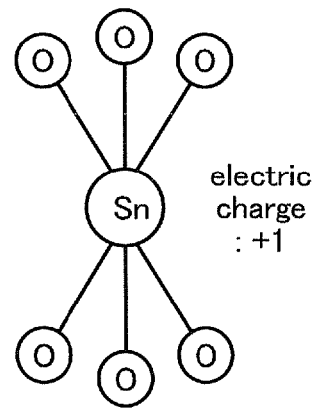
Figure 24B:
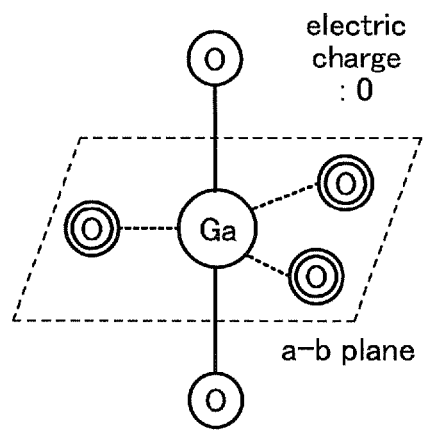

FIG. 24B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 24B. An In atom can also have the structure illustrated in FIG. 24B because an In atom can have five ligands. In the small group illustrated in FIG. 24B, electric charge is 0.

Figure 24E:
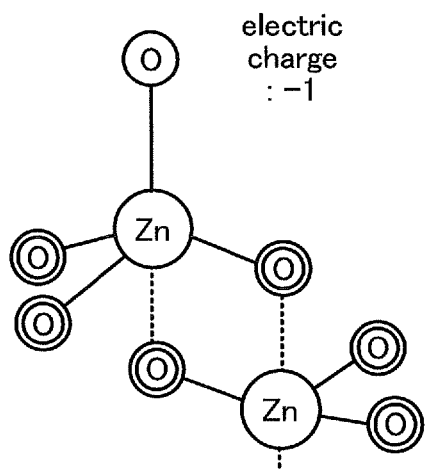
Figure 24C:
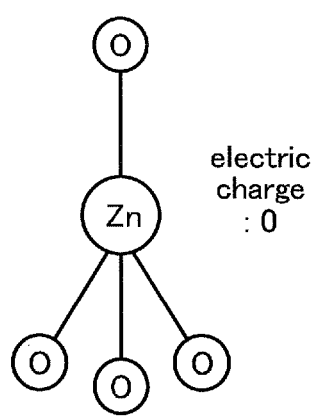

FIG. 24C illustrates a structure including one tetracoordinate Zn atom and four tetracoordinate O atoms proximate to the Zn atom. In FIG. 24C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 24C. In the small group illustrated in FIG. 24C, electric charge is 0.

FIG. 24D illustrates a structure including one hexacoordinate Sn atom and six tetracoordinate O atoms proximate to the Sn atom. In FIG. 24D, three tetracoordinate O atoms exist in each of an upper half and a lower half. In the small group illustrated in FIG. 24D, electric charge is +1.

FIG. 24E illustrates a small group including two Zn atoms. In FIG. 24E, one tetracoordinate O atom exists in each of an upper half and a lower half. In the small group illustrated in FIG. 24E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 24A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 25A illustrates a model of a medium group included in a layered structure of an In—Sn—Zn—O-based material. FIG. 25B illustrates a large group including three medium groups. Note that FIG. 25C illustrates an atomic arrangement in the case where the layered structure in FIG. 25B is observed from the c-axis direction.

In FIG. 25A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 25A, one tetracoordinate O atom existing in each of an upper half and a lower half with respect to an In atom is denoted by circled 1. FIG. 25A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 25A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 24E can be given. For example, with one small group including two Zn atoms, electric charge of one small group including a Sn atom can be cancelled, so that the total electric charge of the layered structure can be 0.

When the large group illustrated in FIG. 25B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figures 26A, 26B, 26C:
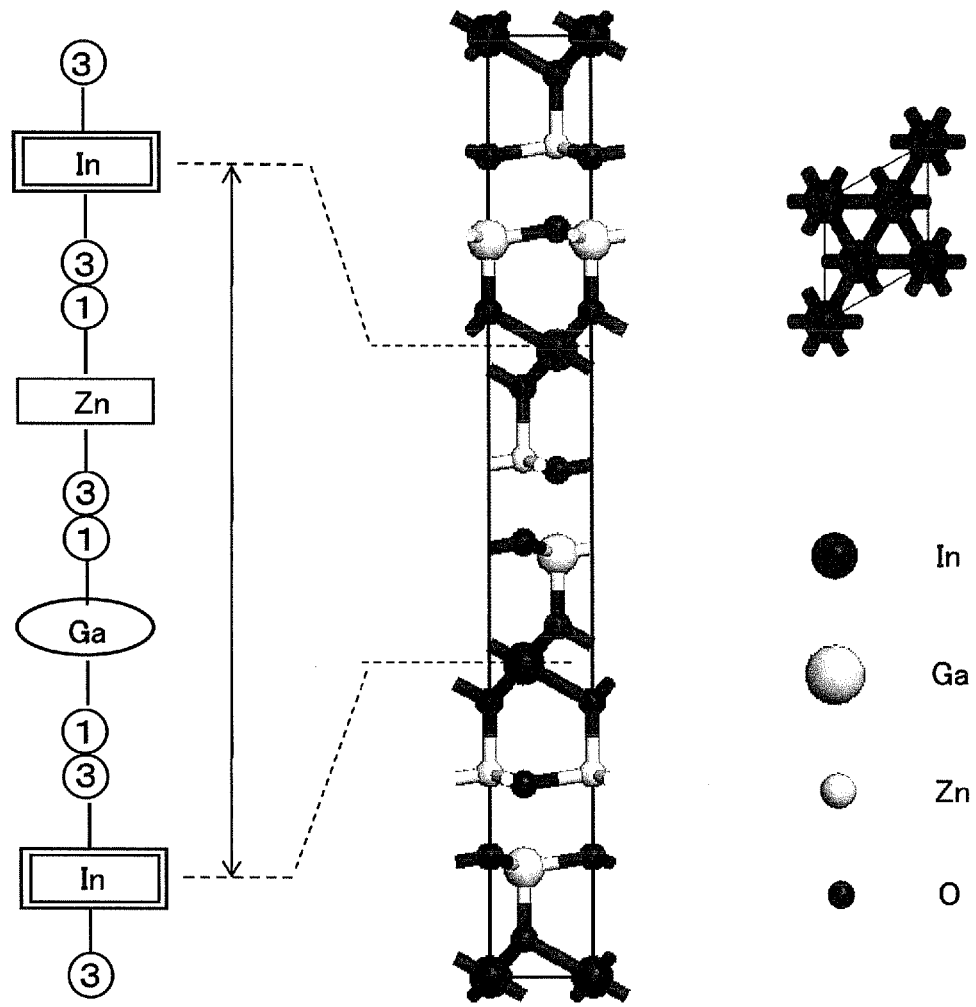
FIG. 26A to 26C are diagrams illustrating a structure of an oxide material according to one embodiment of the present invention.

As an example, FIG. 26A illustrates a model of a medium group included in a layered structure of an In—Ga—Zn—O-based material.

In the medium group included in the layered structure of the In—Ga—Zn—O-based material in FIG. 26A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 26B illustrates a large group including three medium groups. Note that FIG. 26C illustrates an atomic arrangement in the case where the layered structure in FIG. 26B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 26A but also a medium group in which the arrangement of the In atom, the Ga atom, and the Zn atom is different from that in FIG. 26A.

Further, an In—Sn—Zn-based oxide can be referred to as ITZO, and as a target, an oxide target with the following composition ratio is used: the composition ratio of In:Sn:Zn is, for example, 1:2:2, 2:1:3, 1:1:1, or 20:45:35 in atomic ratio.

In the case where an In—Zn—O-based material is used for the oxide semiconductor, a target with the following composition ratio is used: the composition ratio of In:Zn is 50:1 to 1:2 in an atomic ratio ($In_2O_3$:ZnO=25:1 to 1:4 in a molar ratio), preferably 20:1 to 1:1 in an atomic ratio ($In_2O_3$:ZnO=10:1 to 1:2 in a molar ratio), more preferably 15:1 to 1.5:1 in an atomic ratio ($In_2O_3$:ZnO=15:2 to 3:4 in a molar ratio). For example, a target used for the formation of an In—Zn—O-based oxide semiconductor has the following atomic ratio: the atomic ratio of In:Zn:O is X:Y:Z, where Z>1.5X+Y.

The thickness of the oxide semiconductor layer is preferably greater than or equal to 3 nm and less than or equal to 30 nm. This is because the transistor might be normally on when the oxide semiconductor layer is too thick (e.g., the thickness is 50 nm or more).

The oxide semiconductor layer is preferably formed by a method in which impurities such as hydrogen, water, a hydroxyl group, and hydride do not enter the oxide semiconductor layer. For example, a sputtering method can be used.

In this embodiment, the oxide semiconductor layer is formed by a sputtering method using an In—Ga—Zn—O-based oxide target.

As the In—Ga—Zn—O-based oxide target, for example, an oxide target having the following composition ratio can be used: the composition ratio of $In_2O_3$, $Ga_2O_3$, and ZnO is 1:1:1 [molar ratio]. Note that it is not necessary to limit the material and the composition ratio of the target to the above. For example, an oxide target having the following composition ratio can be used: the composition ratio of $In_2O_3$, $Ga_2O_3$, and ZnO is 1:1:2 [molar ratio].

The fill rate of the oxide target is higher than or equal to 90% and lower than or equal to 100%, preferably higher than or equal to 95% and lower than or equal to 99.9%. This is because with the use of the oxide target with a high fill rate, a dense oxide semiconductor layer can be formed.

The deposition atmosphere may be a rare gas (typically argon) atmosphere, an oxygen atmosphere, or a mixed atmosphere containing a rare gas and oxygen. Further, in order to prevent hydrogen, water, a hydroxyl group, hydride, and the like from entering the oxide semiconductor layer, it is preferable to use an atmosphere of a high-purity gas in which impurities such as hydrogen, water, a hydroxyl group, and hydride are sufficiently removed.

For example, the oxide semiconductor layer can be formed as follows.

First, a substrate is placed in a deposition chamber kept under reduced pressure, and heating is performed so that the substrate temperature is higher than 200° C. and lower than or equal to 500° C., preferably higher than 300° C. and lower than or equal to 500° C., more preferably higher than or equal to 350° C. and lower than or equal to 450° C.

Then, a high-purity gas in which impurities such as hydrogen, water, a hydroxyl group, and hydride are sufficiently removed is introduced into the deposition chamber from which remaining moisture is being removed, and the oxide semiconductor layer is formed over the substrate with the use of the target. To remove moisture remaining in the deposition chamber, an entrapment vacuum pump such as a cryopump, an ion pump, or a titanium sublimation pump is preferably used. Further, an evacuation means may be a turbo pump provided with a cold trap. In the deposition chamber which is evacuated with the cryopump, impurities such as hydrogen, water, a hydroxyl group, and hydride (more preferably, also a compound containing a carbon atom), and the like are removed, whereby the concentration of impurities such as hydrogen, water, a hydroxyl group, and hydride in the oxide semiconductor layer formed in the deposition chamber can be reduced.

When the substrate temperature is low (e.g., lower than or equal to 100° C.) during deposition, a substance including a hydrogen atom might enter the oxide semiconductor; therefore, the substrate is preferably heated at the above temperature. When the oxide semiconductor layer is formed with the substrate heated at the above temperature, the substrate temperature is increased; thus, hydrogen bonds are cut due to heat and are less likely to be taken into the oxide semiconductor layer. Therefore, the oxide semiconductor layer is formed with the substrate heated at the above temperature, whereby the concentration of impurities such as hydrogen, water, a hydroxyl group, and hydride in the oxide semiconductor layer can be sufficiently reduced. Moreover, damage due to sputtering can be reduced.

An example of the deposition condition is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the flow rate of the oxygen is 100%). Note that a pulse direct current power source is preferably used because powdery substances (also referred to as particles or dust) generated in deposition can be reduced and the film thickness can be even.

Note that before the oxide semiconductor layer is formed by a sputtering method, powdery substances (also referred to as particles or dust) attached on a surface on which the oxide semiconductor layer is to be formed are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas such as nitrogen, helium, or oxygen may be used.

The oxide semiconductor layer can be processed by being etched after a mask having a desired shape is formed over the oxide semiconductor layer. The mask can be formed by a method such as photolithography or an ink-jet method. For the etching of the oxide semiconductor layer, either wet etching or dry etching may be employed. It is needless to say that both of them may be employed in combination.

After that, the oxide semiconductor layer 144 may be subjected to heat treatment (first heat treatment). Substances including a hydrogen atom in the oxide semiconductor layer 144 can be further reduced through the heat treatment. The heat treatment is performed in an inert gas atmosphere at higher than or equal to 250° C. and lower than or equal to 700° C., preferably higher than or equal to 450° C. and lower than or equal to 600° C. or lower than the strain point of the substrate. As the inert gas atmosphere, an atmosphere that contains nitrogen or a rare gas (e.g., helium, neon, or argon) as its main component and does not contain water, hydrogen, and the like is preferably used. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a manner that, for example, an object to be heated is introduced into an electric furnace in which a resistance heating element or the like is used, and heated in a nitrogen atmosphere at 450° C. for an hour. The oxide semiconductor layer 144 is not exposed to the air during the heat treatment so that entry of impurities water and hydrogen can be prevented.

The above heat treatment can be referred to as dehydration treatment, dehydrogenation treatment, or the like because of its advantageous effect of removing hydrogen, water, or the like. The heat treatment can be performed at the timing, for example, before the oxide semiconductor layer is processed to have an island shape, after the gate insulating film is formed, or the like. Such dehydration treatment or dehydrogenation treatment may be conducted once or plural times.

Figure 19B:
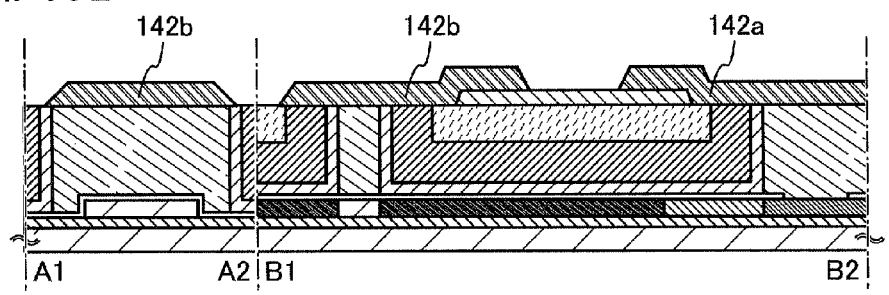

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 19B).

The conductive layer can be formed by a PVD method or a CVD method. As a material for the conductive layer, an element selected from aluminum, chromium, copper, tantalum, titanium, molybdenum, and tungsten; an alloy containing any of the above elements as a component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage that it can be easily processed into the source electrode 142a and the drain electrode 142b having tapered shapes.

Alternatively, the conductive layer may be formed using conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, sometimes referred to as ITO), an alloy of indium oxide and zinc oxide ($In_2O_3$—ZnO), and such a metal oxide material containing silicon or silicon oxide.

The conductive layer is preferably etched so that end portions of the source electrode 142a and the drain electrode 142b that are formed are tapered. Here, a taper angle is, for example, preferably greater than or equal to 30° and less than or equal to 60°. When the etching is performed so that the end portions of the source electrode 142a and the drain electrode 142b are tapered, the coverage with the gate insulating film 146 formed later can be improved and breakage thereof can be prevented.

The channel length (L) of the transistor in the upper portion depends on the distance between lower edges of the source electrode 142a and the drain electrode 142b. Note that in light exposure for forming a mask used in the case where a transistor with a channel length (L) of less than 25 nm is formed, it is preferable to use extreme ultraviolet light whose wavelength is as short as several nanometers to several tens of nanometers. In the light exposure with extreme ultraviolet light, the resolution is high and the focus depth is large. Thus, the channel length (L) of the transistor formed later can be in the range of greater than or equal to 10 nm and less than or equal to 1000 nm (1 μm), whereby the operation speed of a circuit can be increased. Moreover, miniaturization can lead to a reduction in power consumption of a semiconductor device.

Figure 19C:
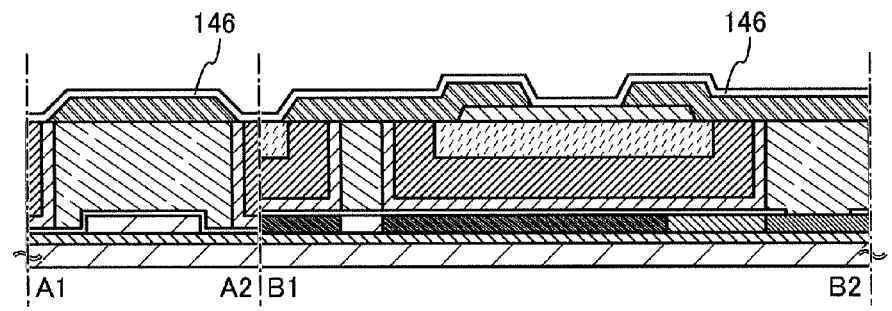

Next, the gate insulating film 146 is formed in contact with part of the oxide semiconductor layer 144 so as to cover the source and drain electrodes 142a and 142b (see FIG. 19C).

The gate insulating film 146 can be formed by a CVD method, a sputtering method, or the like. The gate insulating film 146 preferably contains silicon oxide, silicon nitride, gallium oxide, aluminum oxide, tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The gate insulating film 146 may have a single-layer structure or a layered structure using any of the above materials. There is no particular limitation on the thickness; however, in the case where a semiconductor device is miniaturized, the thickness is preferably small in order that operation of the transistor may be ensured. For example, in the case where silicon oxide is used, the thickness can be set to greater than or equal to 1 nm and less than or equal to 100 nm, preferably greater than or equal to 10 nm and less than or equal to 50 nm.

When the gate insulating film is formed thin as described above, gate leakage due to a tunnel effect or the like becomes a problem. In order to solve the problem of gate leakage, the gate insulating film 146 may be formed using a high dielectric constant (high-k) material such as hafnium oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)). The use of a high-k material for the gate insulating film 146 makes it possible to increase the thickness in order to suppress gate leakage, while electric characteristics are ensured. Note that a layered structure of a film containing a high-k material and a film containing any of silicon oxide, silicon nitride, silicon oxynitride, silicon nitride oxide, aluminum oxide, and the like may be employed.

Further, an insulating layer in contact with the oxide semiconductor layer 144 (in this embodiment, the gate insulating film 146) may be an insulating material containing a Group 13 element and oxygen. Many of oxide semiconductor materials contain Group 13 elements, and an insulating material including a Group 13 element works well with an oxide semiconductor. By using an insulating material containing a Group 13 element for an insulating layer in contact with the oxide semiconductor layer, an interface with the oxide semiconductor layer can be kept favorable.

An insulating material containing a Group 13 element refers to an insulating material containing one or more Group 13 elements. As the insulating material containing a Group 13 element, a gallium oxide, an aluminum oxide, an aluminum gallium oxide, a gallium aluminum oxide, and the like are given. Here, an aluminum gallium oxide contains gallium and aluminum so that the aluminum content is higher than the gallium content in atomic percent, and a gallium aluminum oxide contains gallium and aluminum so that the gallium content is higher than the aluminum content in atomic percent.

For example, in the case of forming a gate insulating film in contact with an oxide semiconductor layer containing gallium, when a material containing a gallium oxide is used for the gate insulating film, favorable characteristics can be kept at the interface between the oxide semiconductor layer and the gate insulating film. When the oxide semiconductor layer and the insulating layer containing a gallium oxide are provided in contact with each other, an accumulation of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing an aluminum oxide. Note that water is less likely to permeate an aluminum oxide. Thus, it is preferable to use a material containing an aluminum oxide in terms of preventing entry of water to the oxide semiconductor layer.

An insulating material of the insulating layer in contact with the oxide semiconductor layer 144 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen in the form of plasma is added to a bulk. The oxygen doping may be performed by an ion implantation method or an ion doping method.

For example, in the case where the insulating layer in contact with the oxide semiconductor layer 144 is formed using a gallium oxide, the composition of the gallium oxide can be set to be Ga$_2$O$_x$ (x=3+α, 0<α<1) by heat treatment in an oxygen atmosphere or oxygen doping. In the case where the insulating layer in contact with the oxide semiconductor layer 144 is formed using an aluminum oxide, the composition of the aluminum oxide can be set to be Al$_2$O$_x$ (x=3+α, 0<α<1) by heat treatment in an oxygen atmosphere or oxygen doping. In the case where the insulating film in contact with the oxide semiconductor layer 144 is formed using a gallium aluminum oxide (aluminum gallium oxide), the composition of the gallium aluminum oxide (aluminum gallium oxide) can be set to be Ga$_x$Al$_{2-x}$O$_{3+α}$ (0<x<2, 0<α<1) by heat treatment in an oxygen atmosphere or oxygen doping.

By oxygen doping or the like, an insulating layer including a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer which has been dehydrated or dehydrogenated or at the interface between the oxide semiconductor layer and the insulating layer is reduced. Thus, the oxide semiconductor layer can be an i-type or substantially i-type oxide semiconductor.

The insulating layer including a region where the proportion of oxygen is higher than that in the stoichiometric composition may be applied to an insulating layer formed as a base film of the oxide semiconductor layer 144 instead of the gate insulating film 146, or both the gate insulating film 146 and the base insulating film.

After the gate insulating film 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for an hour in a nitrogen atmosphere. By performing the second heat treatment, variation in electrical characteristics of the transistor can be reduced. Further, in the case where the gate insulating film 146 contains oxygen, oxygen is supplied to the oxide semiconductor layer 144, which has been dehydrated or dehydrogenated, to fill oxygen vacancies in the oxide semiconductor layer 144, so that an i-type (intrinsic) or substantially i-type oxide semiconductor layer can be formed.

In this embodiment, the second heat treatment is performed after the gate insulating film 146 is formed; however, the timing of the second heat treatment is not limited thereto. For example, the second heat treatment may be performed after the gate electrode is formed. Alternatively, the first heat treatment and the second heat treatment may be successively performed, the first heat treatment may also serve as the second heat treatment, or the second heat treatment may also serve as the first heat treatment.

Figure 19D:
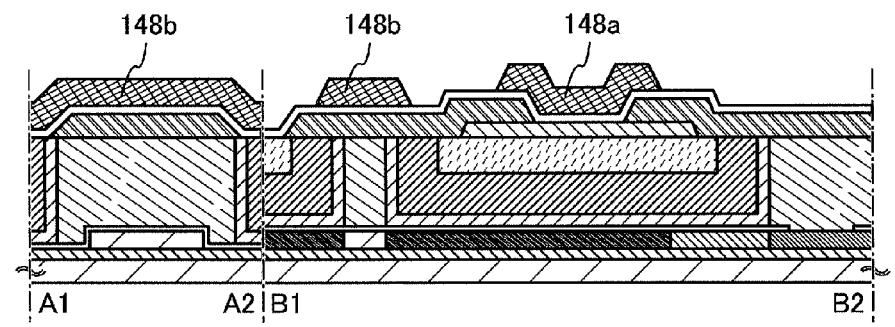

Next, a conductive layer for forming a gate electrode (including a wiring formed in the same layer as the gate electrode) is formed and is processed, so that the gate electrode 148a and the conductive layer 148b are formed (see FIG. 19D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a layered structure.

Figure 20A:
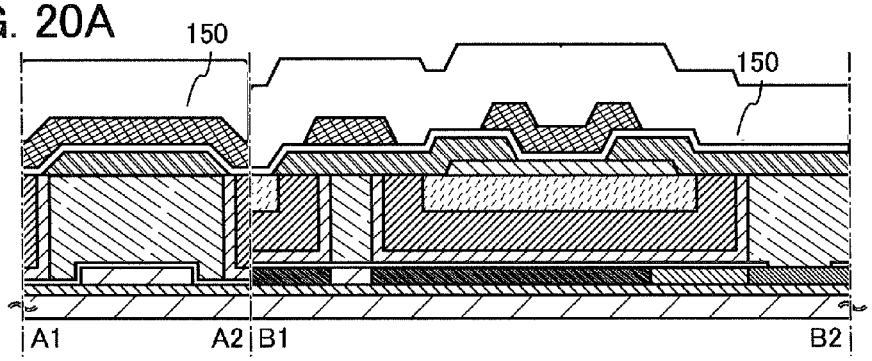
FIGS. 20A to 20C are cross-sectional views illustrating manufacturing steps of the semiconductor device.
Figure 20B:
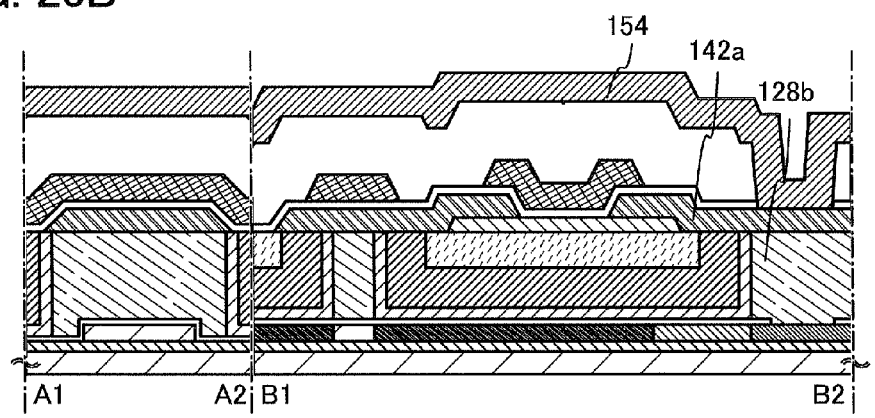

Next, the insulating layer 150 is formed over the gate insulating film 146, the gate electrode 148a, and the conductive layer 148b (see FIG. 20A). The insulating layer 150 can be formed by a PVD method, a CVD method, or the like. The insulating layer 150 can be formed using a material including an inorganic insulating material such as silicon oxide, silicon oxynitride, silicon nitride, hafnium oxide, gallium oxide, or aluminum oxide. Note that for the insulating layer 150, a material with a low dielectric constant or a structure with a low dielectric constant (e.g., a porous structure) is preferably used. This is because by reducing the dielectric constant of the insulating layer 150, capacitance between wirings, electrodes, and the like can be reduced, which leads to an increase in operation speed. Note that although the insulating layer 150 has a single-layer structure in this embodiment, one embodiment of the disclosed invention is not limited to this. The insulating layer 150 may have a layered structure including two or more layers.

Next, an opening reaching the source electrode 142a is formed in the gate insulating film 146 and the insulating layer 150. Then, the wiring 154 in contact with the source electrode 142a is formed over the insulating layer 150 (see FIG. 20B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of the above elements as a component; or the like can be used. Further, one or more materials selected from manganese, magnesium, zirconium, beryllium, neodymium, and scandium may be used.

Specifically, for example, it is possible to employ a method in which a thin titanium film (approximately 5 nm) is formed in a portion of the insulating layer 150, in which the opening is formed, by a PVD method and then, an aluminum film is formed so as to be embedded in the opening. Here, the titanium film formed by a PVD method functions to reduce an oxide film (e.g., a natural oxide film) having a surface over which the titanium film is formed, and to decrease the contact resistance with a lower electrode or the like (here, the source electrode 142a). In addition, a hillock of the aluminum film can be prevented. A copper film may be formed by a plating method after formation of a barrier film of titanium, titanium nitride, or the like.

The opening formed in the insulating layer 150 is preferably formed so as to overlap with the conductive layer 128b. When the opening is formed in such a manner, the element area can be prevented from increasing due to contact regions.

Here, the case where a position where the impurity region 126 and the source electrode 142a are connected to each other and a position where the source electrode 142a and the wiring 154 are connected to each other overlap with each other without using the conductive layer 128b will be described. In that case, an opening (also referred to as a contact in a lower portion) is formed in the insulating layer 136, the insulating layer 138, and the insulating layer 140 which are formed over the impurity region 126, and the source electrode 142a is formed in the contact in the lower portion. After that, an opening (also referred to as a contact in an upper portion) is formed in the gate insulating film 146 and the insulating layer 150 so as to overlap with the contact in the lower portion, and then the wiring 154 is formed. When the contact in the upper portion is formed so as to overlap with the contact in the lower portion, the source electrode 142a formed in the contact in the lower portion might be disconnected due to etching. When the contacts in the lower portion and in the upper portion are formed so as not to overlap with each other in order to avoid the disconnection, there occurs a problem of the increase in the element area.

As described in this embodiment, with the use of the conductive layer 128b, the contact in the upper portion can be formed without disconnection of the source electrode 142a. Thus, the contacts in the lower portion and in the upper portion can be formed so as to overlap with each other, so that the element area can be prevented from increasing due to contact regions. In other words, the degree of integration of the semiconductor device can be increased.

Figure 20C:
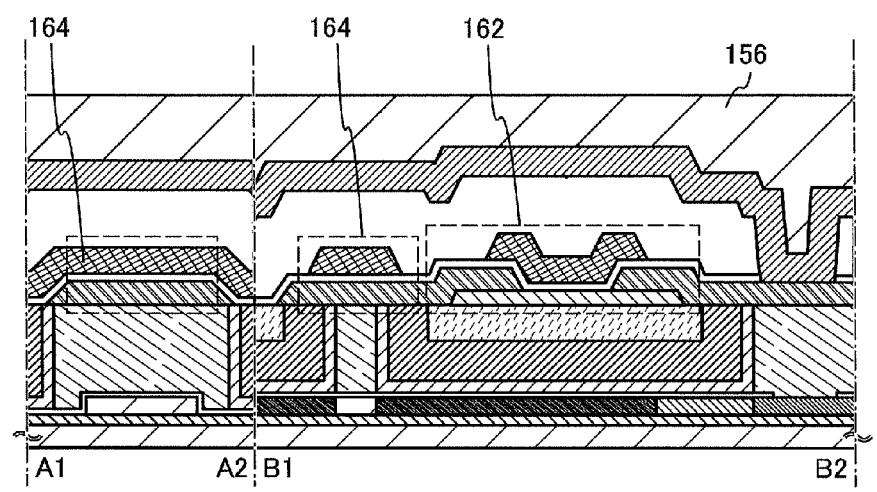

Next, the insulating layer 156 is formed so as to cover the wiring 154 (see FIG. 20C).

Through the above process, the capacitor 164 and the transistor 162 including the oxide semiconductor layer 144 which has been highly purified are completed (see FIG. 20C).

Figure 22A:
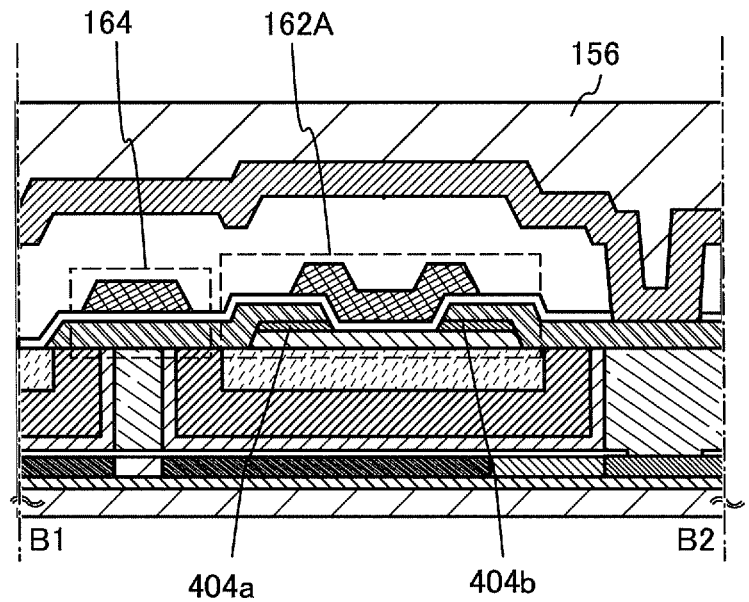
FIGS. 22A and 22B are cross-sectional views of semiconductor devices.
Figure 22B:
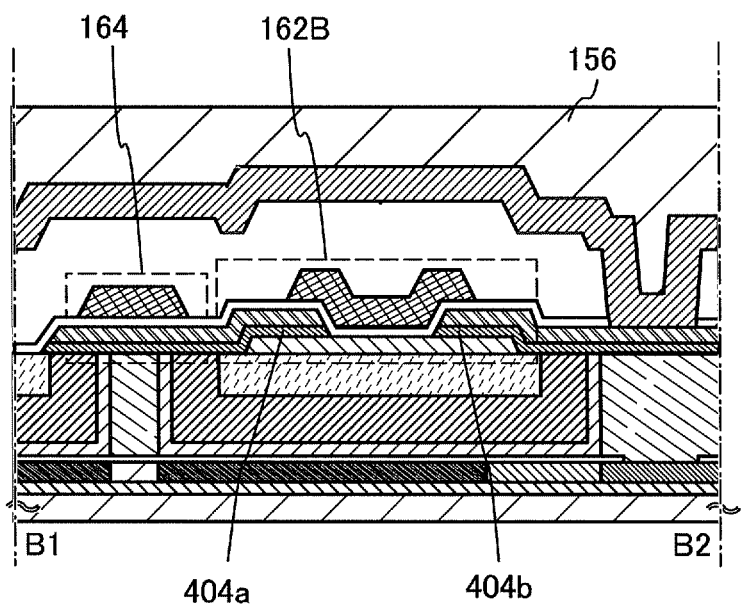

Note that an oxide conductive layer serving as source and drain regions may be provided between the oxide semiconductor layer 144 and the source and drain electrodes 142a and 142b, as a buffer layer in the transistor 162. FIGS. 22A and 22B illustrate transistors 162A and 162B, respectively, each of which is obtained by providing an oxide conductive layer in the transistor 162 in FIG. 15A.

The transistors 162A and 162B in FIGS. 22A and 22B are each provided with oxide conductive layers 404a and 404b serving as source and drain regions between the oxide semiconductor layer 144 and the source and drain electrodes 142a and 142b. The transistors 162A and 162B in FIGS. 22A and 22B are different from each other in the shapes of the oxide conductive layers 404a and 404b depending on a manufacturing process.

In the transistor 162A in FIG. 22A, a stack of an oxide semiconductor film and an oxide conductive film is formed and processed through the same photolithography process, so that the oxide semiconductor layer 144 and the oxide conductive film are formed to have island shapes. After the source electrode 142a and the drain electrode 142b are formed over the oxide semiconductor layer and the oxide conductive film, the oxide conductive film having an island shape is etched using the source electrode 142a and the drain electrode 142b as masks so that the oxide conductive layers 404a and 404b to be source and drain regions are formed.

In the transistor 162B in FIG. 22B, an oxide conductive film is formed over the oxide semiconductor layer 144, a metal conductive film is formed thereover, and then the oxide conductive film and the metal conductive film are processed through the same photolithography process, so that the oxide conductive layers 404a and 404b to be source and drain regions, the source electrode 142a, and the drain electrode 142b are formed.

In performing etching to process the oxide conductive film, etching conditions (the kind and the concentration of an etching material, etching time, and the like) are appropriately adjusted so that the oxide semiconductor layer is not excessively etched.

As a formation method of the oxide conductive layers 404a and 404b, a sputtering method, a vacuum evaporation method (an electron beam evaporation method or the like), an arc discharge ion plating method, or a spray method can be used. As a material of the oxide conductive layers 404a and 404b, zinc oxide, a compound of silicon oxide and indium tin oxide, zinc aluminum oxide, zinc aluminum oxynitride, gallium zinc oxide, or the like can be used. In addition, the above materials may contain silicon oxide.

When the oxide conductive layers are provided as the source and drain regions between the oxide semiconductor layer 144 and the source and drain electrodes 142a and 142b, the resistance of the source and drain regions can be reduced, resulting in high-speed operation of the transistors 162A and 162B.

Including the oxide semiconductor layer 144, the oxide conductive layers 404a and 404b, and the source and drain electrodes 142a and 142b, the transistors 162A and 162B can each have a higher withstand voltage.

Since the oxide semiconductor layer 144 is highly purified in the transistor 162 described in this embodiment, the hydrogen concentration is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. In addition, the carrier density of the oxide semiconductor layer 144 is sufficiently low (e.g., lower than $1 \times 10^{12}$/cm$^3$, preferably lower than $1.45 \times 10^{10}$/cm$^3$) as compared to that of a general silicon wafer (approximately $1 \times 10^{14}$/cm$^3$). Accordingly, the off-state current is also sufficiently low. For example, the off-state current (here, current per micrometer (μm) of channel width) of the transistor 162 at room temperature (25° C.) is lower than or equal to 100 zA (1 zA (zeptoampere) is $1 \times 10^{-21}$ A), preferably lower than or equal to 10 zA.

With the use of the oxide semiconductor layer 144 which has been highly purified to be intrinsic, the off-state current of the transistor can be sufficiently reduced easily. Further, by using such a transistor, a semiconductor device in which stored data can be stored for an extremely long time can be obtained.

In addition, in the semiconductor device described in this embodiment, a wiring can be shared; thus, a semiconductor device with sufficiently increased degree of integration can be realized.

The structures, the methods, and the like described in this embodiment can be combined as appropriate with any of the structures, the methods, and the like described in the other embodiments.

Embodiment 4

In this embodiment, application of any of the semiconductor devices described in the above embodiments to an electronic device will be described with reference to FIGS. 21A to 21F. In this embodiment, the case where the semiconductor device described in the foregoing embodiment is applied to an electronic device such as a computer, a mobile phone handset (also referred to as a mobile telephone or a mobile telephone device), a portable information terminal (including a portable game console, an audio player, and the like), a camera such as a digital camera or a digital video camera, an electronic paper, or a television device (also referred to as a television or a television receiver) will be described.

Figure 21A:
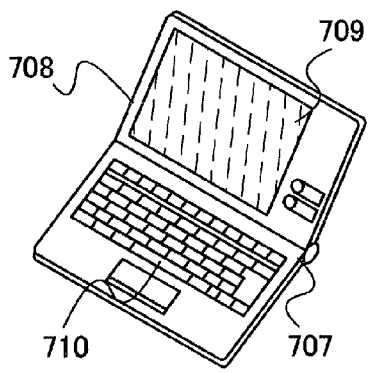
FIGS. 21A to 21F are examples of electronic devices.

FIG. 21A illustrates a laptop personal computer which includes a housing 707, a housing 708, a display portion 709, a keyboard 710, and the like. At least one of the housings 707 and 708 is provided with the semiconductor device described in any of the above embodiments. Therefore, a laptop personal computer in which writing and reading of data are performed at high speed, data can be stored for a long time, and power consumption is sufficiently reduced can be realized.

Figure 21D:
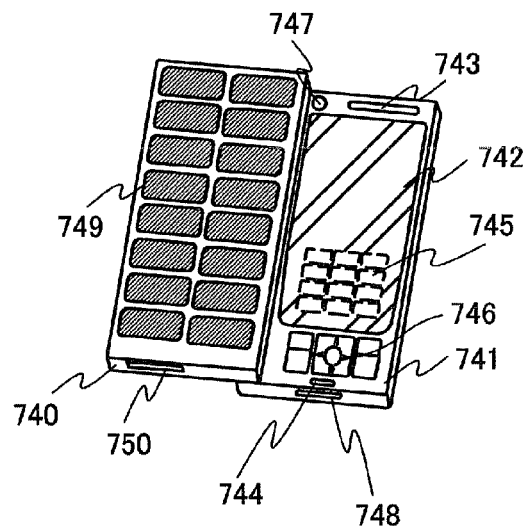
Figure 21B:
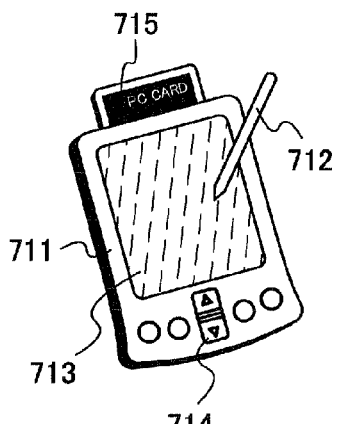

FIG. 21B illustrates a personal digital assistant (PDA). A main body 711 is provided with a display portion 713, an external interface 715, operation buttons 714, and the like. Further, a stylus 712 or the like for operation of the personal digital assistant is provided. In the main body 711, the semiconductor device described in any of the above embodiments is provided. Therefore, a personal digital assistant in which writing and reading of data are performed at high speed, data can be stored for a long time, and power consumption is sufficiently reduced can be realized.

Figure 21E:
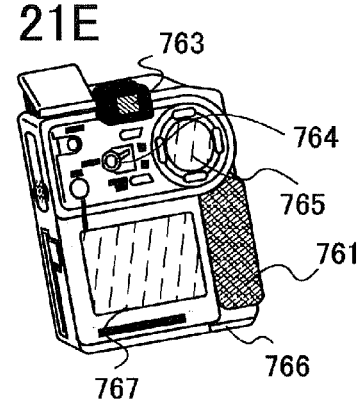
Figure 21C:
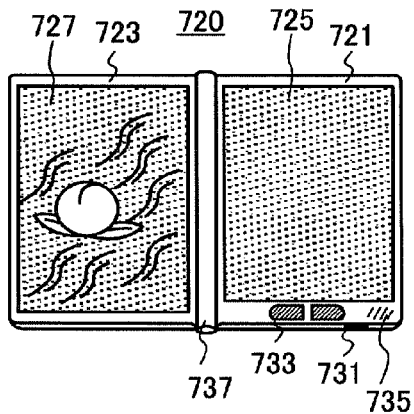

FIG. 21C illustrates an e-book reader 720 including electronic paper. The e-book reader 720 includes two housings, a housing 721 and a housing 723. The housing 721 and the housing 723 are provided with a display portion 725 and a display portion 727, respectively. The housings 721 and 723 are combined by a hinge 737 and can be opened or closed with the hinge 737 as an axis. The housing 721 is provided with a power supply 731, an operation key 733, a speaker 735, and the like. At least one of the housings 721 and 723 is provided with the semiconductor device described in any of the above embodiments. Therefore, an e-book reader in which writing and reading of data are performed at high speed, data can be stored for a long time, and power consumption is sufficiently reduced can be realized.

FIG. 21D illustrates a mobile phone handset which includes two housings, a housing 740 and a housing 741. Further, the housings 740 and 741 which are developed as illustrated in FIG. 21D can overlap with each other by sliding; thus, the size of the mobile phone handset can be reduced, which makes the mobile phone handset suitable for being carried. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone handset, an external memory slot 750, and the like. In addition, an antenna is incorporated in the housing 741. At least one of the housings 740 and 741 is provided with the semiconductor device described in any of the above embodiments. Therefore, a mobile phone handset in which writing and reading of data are performed at high speed, data can be stored for a long time, and power consumption is sufficiently reduced can be realized.

FIG. 21E is a digital camera including a main body 761, a display portion 767, an eyepiece portion 763, an operation switch 764, a display portion 765, a battery 766, and the like. In the main body 761, the semiconductor device described in any of the above embodiments is provided. Therefore, a digital camera in which writing and reading of data are performed at high speed, data can be stored for a long time, and power consumption is sufficiently reduced can be realized.

Figure 21F:
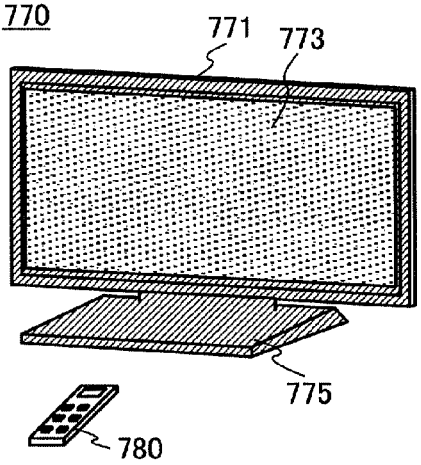

FIG. 21F is a television set 770 including a housing 771, a display portion 773, a stand 775, and the like. The television set 770 can be operated with an operation switch of the housing 771 or a remote controller 780. The semiconductor device described in any of the above embodiments is provided in the housing 771 and/or the remote controller 780. Therefore, a television set in which writing and reading of data are performed at high speed, data can be stored for a long time, and power consumption is sufficiently reduced can be realized.

Thus, any of the semiconductor devices according to the above embodiments is provided in the electronic devices described in this embodiment. Therefore, power consumption of the electronic devices can be reduced.

Embodiment 5

Figure 23A:
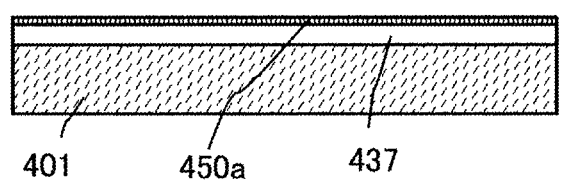
FIGS. 23A to 23C are cross-sectional views illustrating manufacturing steps of a semiconductor device.
Figure 23B:
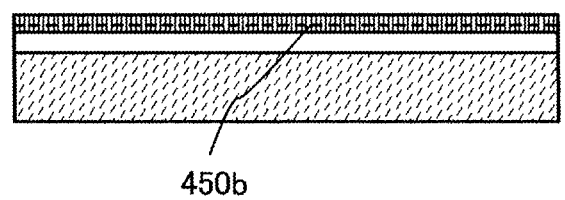

One embodiment of an oxide semiconductor layer which can be used as any of the semiconductor layers of the transistors 162 in the above embodiments will be described with reference to FIGS. 23A to 23C.

The oxide semiconductor layer of this embodiment has a structure including a first crystalline oxide semiconductor layer and a second crystalline oxide semiconductor layer which is stacked over the first crystalline oxide semiconductor layer and has a larger thickness than the first crystalline oxide semiconductor layer.

An insulating layer 437 is formed over an insulating layer 401. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

In the case where an In—Zn—O-based material is used for the oxide semiconductor, a target with the following composition ratio is used: the composition ratio of In:Zn is 50:1 to 1:2 in an atomic ratio ($In_2O_3$:ZnO=25:1 to 1:4 in a molar ratio), preferably 20:1 to 1:1 in an atomic ratio ($In_2O_3$:ZnO=10:1 to 1:2 in a molar ratio), more preferably 15:1 to 1.5:1 in an atomic ratio ($In_2O_3$:ZnO=15:2 to 3:4 in a molar ratio). For example, a target used for the formation of an In—Zn—O-based oxide semiconductor has the following atomic ratio: the atomic ratio of In:Zn:O is X:Y:Z, where $Z>1.5X+Y$.

Further, an In—Sn—Zn-based oxide can be referred to as ITZO, and as a target, an oxide target with the following composition ratio is used: the composition ratio of In:Sn:Zn is, for example, 1:2:2, 2:1:3, 1:1:1, or 20:45:35 in atomic ratio.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 23A).

Depending on the substrate temperature at the time of deposition or the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphen-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating film or at the interface between the first crystalline oxide semiconductor layer 450a and the insulating layer 437 at an amount that exceeds at least the amount of oxygen in the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for an oxide semiconductor (a target for an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 23B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 23C:
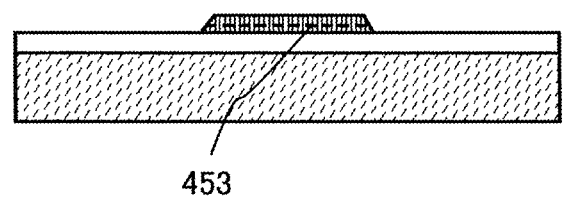

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 23C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as a C-Axis Aligned Crystal (CAAC)), which has neither a single crystal structure nor an amorphous structure. The first crystalline oxide semiconductor layer and the second crystalline oxide semiconductor layer partly include a crystal grain boundary.

An oxide semiconductor to be used preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Z-based oxide may contain another metal element in addition to In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor 162 which can be applied to a semiconductor device disclosed in this specification.

In a transistor according to Embodiment 3, in which the stack of the oxide semiconductor layers of this embodiment is used as an oxide semiconductor layer, an electric field is not applied from one surface to the other surface of the oxide semiconductor layer and current does not flow in the thickness direction (from one surface to the other surface; specifically, in the vertical direction in FIG. 15A) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in an appropriate combination with any of the structures described in the other embodiments.

Embodiment 6

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed by the following equation.

$$\mu = \mu_0 \exp\left(-\frac{E}{kT}\right) \qquad \text{[EQUATION 2]}$$

Here, E represents the height of the potential barrier, k represents the Boltzmann constant, and T represents the absolute temperature. When the potential barrier is assumed to be attributed to a defect, the height of the potential barrier can be expressed by the following equation according to the Levinson model.

$$E = \frac{e^2 N^2}{8\varepsilon n} = \frac{e^3 N^2 t}{8\varepsilon C_{ox} V_g} \qquad \text{[EQUATION 3]}$$

Here, e represents the elementary charge, N represents the average defect density per unit area in a channel, c represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed by the following equation.

$$I_d = \frac{W\mu V_g V_d C_{ox}}{L} \exp\left(-\frac{E}{kT}\right) \qquad \text{[EQUATION 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following equation can be obtained.

$$\ln\left(\frac{I_d}{V_g}\right) = \qquad \text{[EQUATION 5]}$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Equation 5 is a function of $V_g$. From the equation, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, $\mu_0$ can be calculated to be 120 cm²/Vs from Equation 2 and Equation 3. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following equation.

$$\frac{1}{\mu_1} = \frac{1}{\mu_0} + \frac{D}{B}\exp\left(-\frac{x}{G}\right) \qquad \text{[EQUATION 6]}$$

Here, D represents the electric field in the gate electrode direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Equation 6 is increased and accordingly the mobility $\mu_1$ is decreased.

Figure 27:
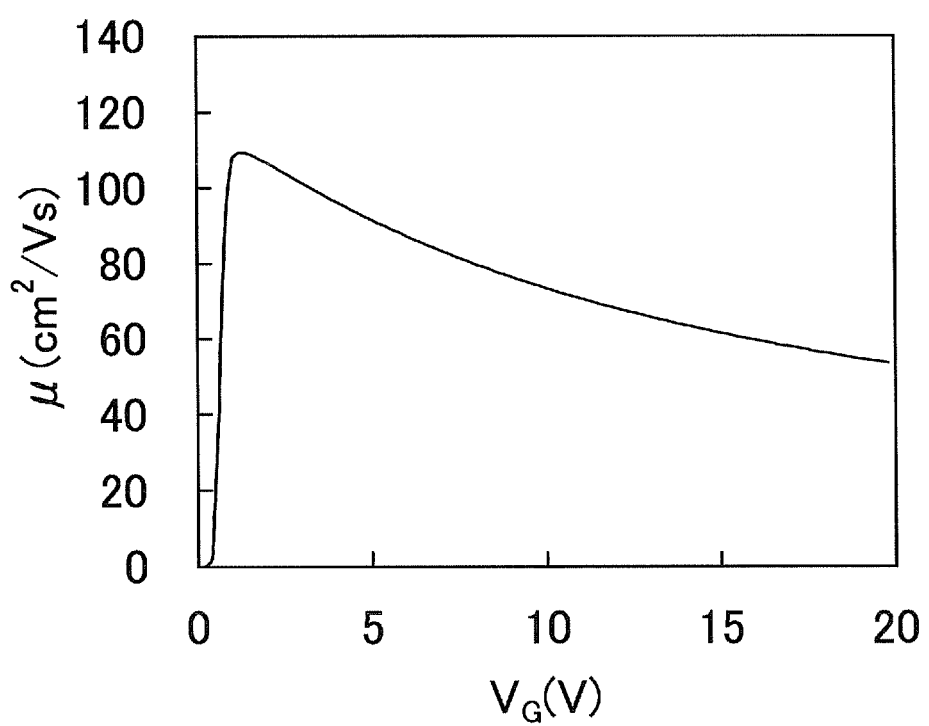
FIG. 27 is a graph showing dependence of mobility on gate voltage, which is obtained by calculation.

Calculation results of the mobility $\mu_2$ of a transistor whose channel includes an ideal oxide semiconductor without a defect inside the semiconductor are shown in FIG. 27. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 27, the mobility has a peak of more than 100 cm²/Vs at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 28A to 28C, FIGS. 29A to 29C, and FIGS. 30A to 30C. FIGS. 31A and 31B illustrate cross-sectional structures of the transistors used for the calculation. The transistors illustrated in FIGS. 31A and 31B each include a semiconductor region 2103a and a semiconductor region 2103c which have n$^+$-type conductivity in an oxide semiconductor layer. The resistivities of the semiconductor region 2103a and the semiconductor region 2103c are 2×10$^{-3}$ Ωcm.

The transistor illustrated in FIG. 31A is formed over a base insulating film 2101 and an embedded insulator 2102 which is embedded in the base insulating film 2101 and formed of aluminum oxide. The transistor includes the semiconductor region 2103a, the semiconductor region 2103c, an intrinsic semiconductor region 2103b serving as a channel formation region therebetween, and a gate electrode 2105. The width of the gate electrode 2105 is 33 nm.

A gate insulating film 2104 is formed between the gate electrode 2105 and the semiconductor region 2103b. In addition, a sidewall insulator 2106a and a sidewall insulator 2106b are formed on both side surfaces of the gate electrode 2105, and an insulator 2107 is formed over the gate electrode 2105 so as to prevent a short circuit between the gate electrode 2105 and another wiring. The sidewall insulator has a width of 5 nm. A source electrode 2108a and a drain electrode 2108b are provided in contact with the semiconductor region 2103a and the semiconductor region 2103c, respectively. Note that the channel width of this transistor is 40 nm.

The transistor of FIG. 31B is the same as the transistor of FIG. 31A in that it is formed over the base insulating film 2101 and the embedded insulator 2102 formed of aluminum oxide and that it includes the semiconductor region 2103a, the semiconductor region 2103c, the intrinsic semiconductor region 2103b provided therebetween, the gate electrode 2105 having a width of 33 nm, the gate insulating film 2104, the sidewall insulator 2106a, the sidewall insulator 2106b, the insulator 2107, the source electrode 2108a, and the drain electrode 2108b.

The transistor illustrated in FIG. 31A is different from the transistor illustrated in FIG. 31B in the conductivity type of semiconductor regions under the sidewall insulator 2106a and the sidewall insulator 2106b. In the transistor illustrated in FIG. 31A, the semiconductor regions under the sidewall insulator 2106a and the sidewall insulator 2106b are part of the semiconductor region 2103a having n$^+$-type conductivity and part of the semiconductor region 2103c having n$^+$-type conductivity, whereas in the transistor illustrated in FIG. 31B, the semiconductor regions under the sidewall insulator 2106a and the sidewall insulator 2106b are parts of the intrinsic semiconductor region 2103b. In other words, in the semiconductor layer of FIG. 31B, a region having a width of $L_{off}$ which overlaps with neither the semiconductor region 2103a (the semiconductor region 2103c) nor the gate electrode 2105 is provided. This region is called an offset region, and the width $L_{off}$ is called an offset length. As is seen from the drawing, the offset length is equal to the width of the sidewall insulator 2106a (the sidewall insulator 2106b).

Figure 28A:
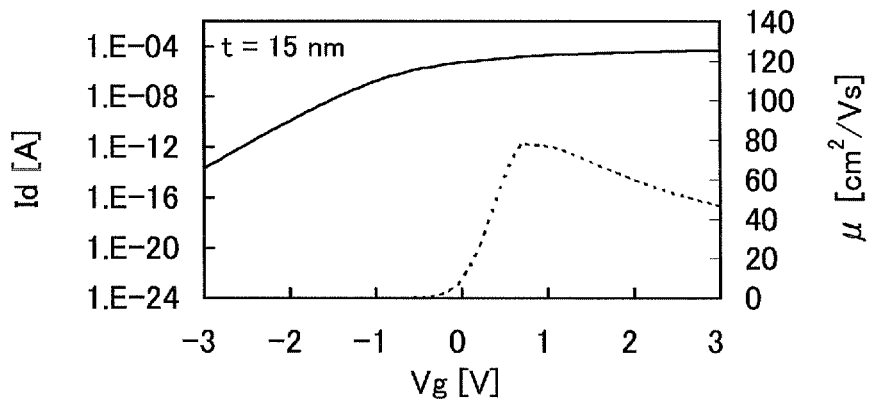
FIGS. 28A to 28C are graphs each showing dependence of drain current and mobility on gate voltage, which is obtained by calculation.
Figure 28B:
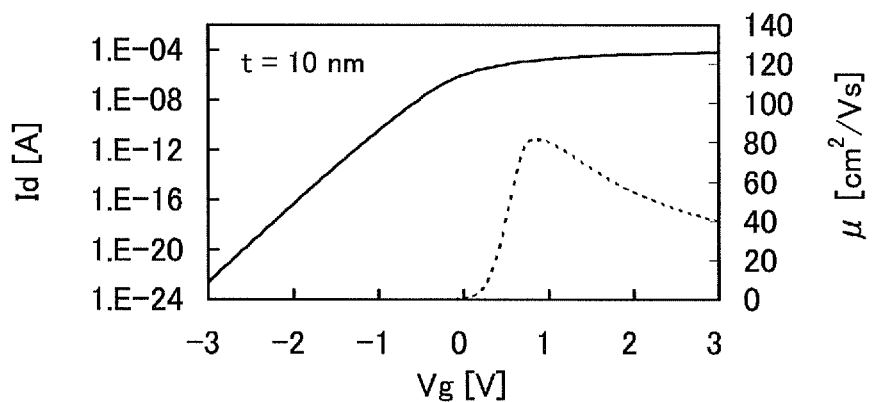
Figure 28C:
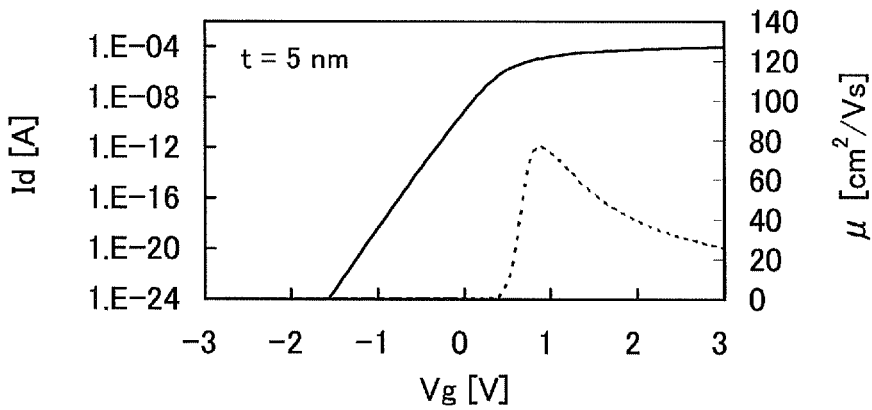

The other parameters used in calculation are as described above. For the calculation, device simulation software Sentaurus Device manufactured by Synopsys, Inc. was used. FIGS. 28A to 28C show the gate voltage ($V_g$: a potential difference between the gate electrode and the source electrode) dependence of the drain current ($I_d$, a solid line) and the mobility (μ, a dotted line) of the transistor having the structure illustrated in FIG. 31A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 28A shows the gate voltage dependence of the transistor in the case where the thickness of the gate insulating film is 15 nm, FIG. 28B shows that of the transistor in the case where the thickness of the gate insulating film is 10 nm, and FIG. 28C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory cell and the like, at a gate voltage of around 1 V.

Figure 29A:
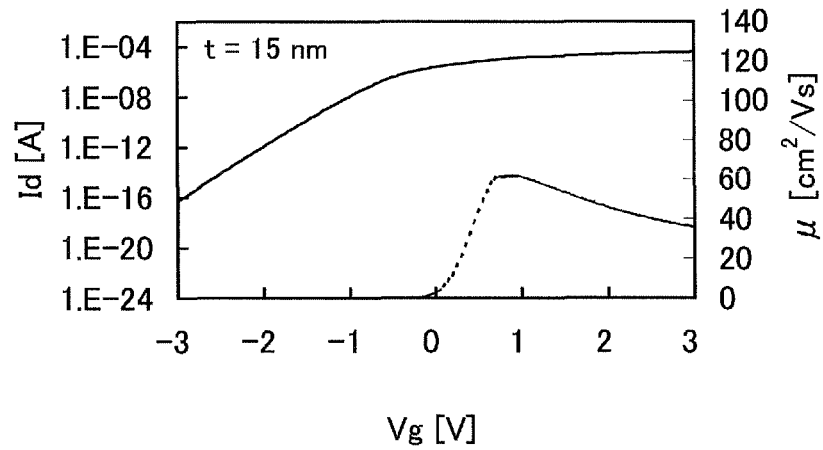
FIGS. 29A to 29C are graphs each showing dependence of drain current and mobility on gate voltage, which is obtained by calculation.
Figure 29B:
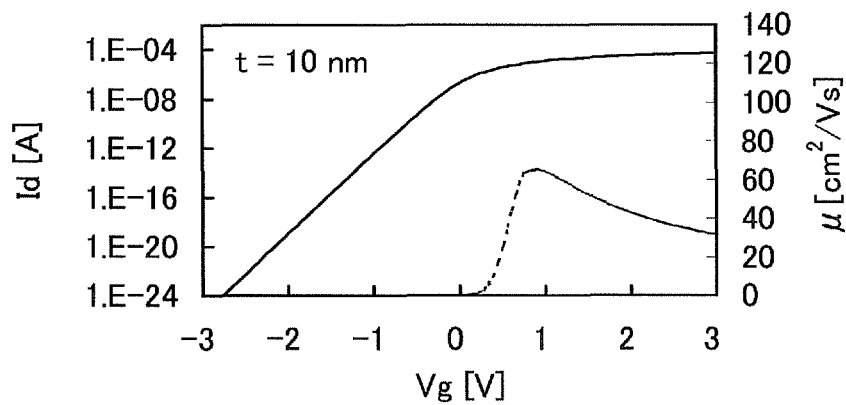
Figure 29C:
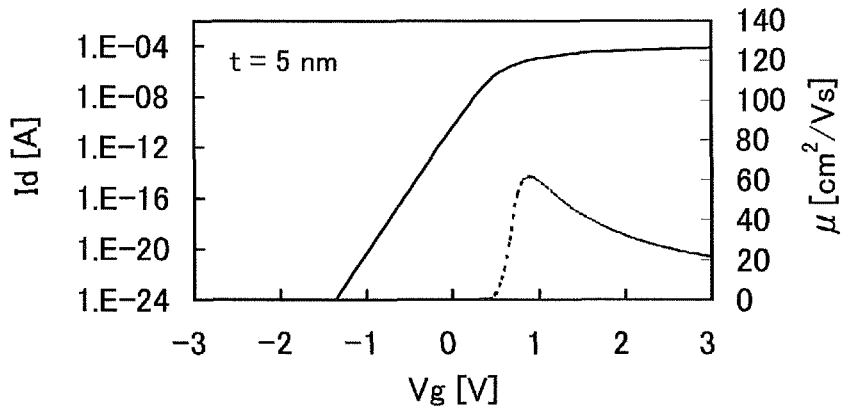

FIGS. 29A to 29C show the gate voltage $V_g$ dependence of the drain current $I_d$ (a solid line) and the mobility μ (a dotted line) of the transistor having the structure illustrated in FIG. 31B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 29A shows the gate voltage dependence of the transistor in the case where the thickness of the gate insulating film is 15 nm, FIG. 29B shows that of the transistor in the case where the thickness of the gate insulating film is 10 nm, and FIG. 29C shows that of the transistor in the case where the thickness of the gate insulating film is 5 nm.

Figure 30A:
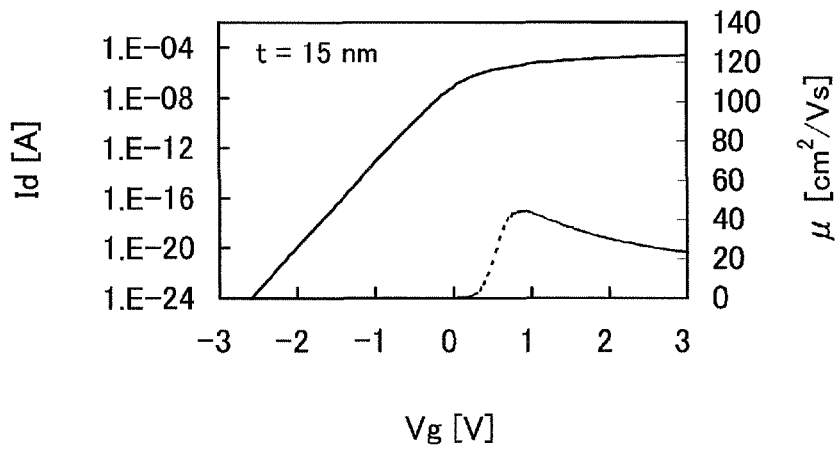
FIGS. 30A to 30C are graphs each showing dependence of drain current and mobility on gate voltage, which is obtained by calculation.
Figure 30B:
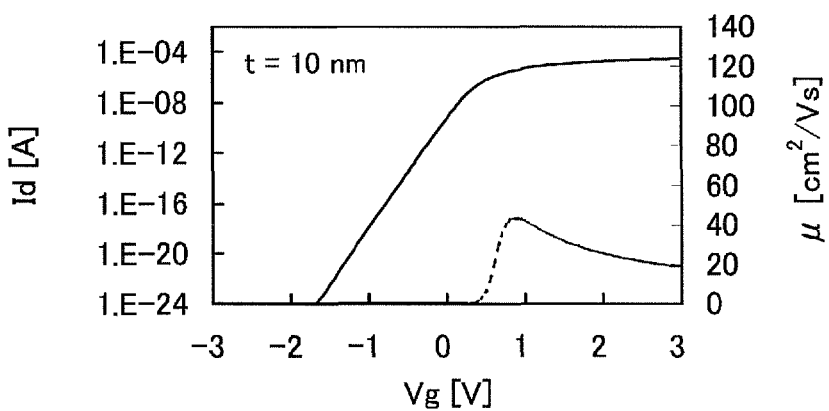
Figure 30C:
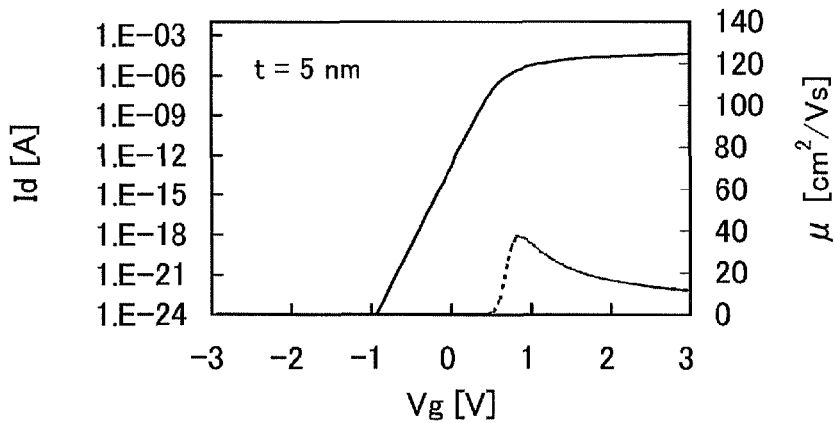
Figure 31A:
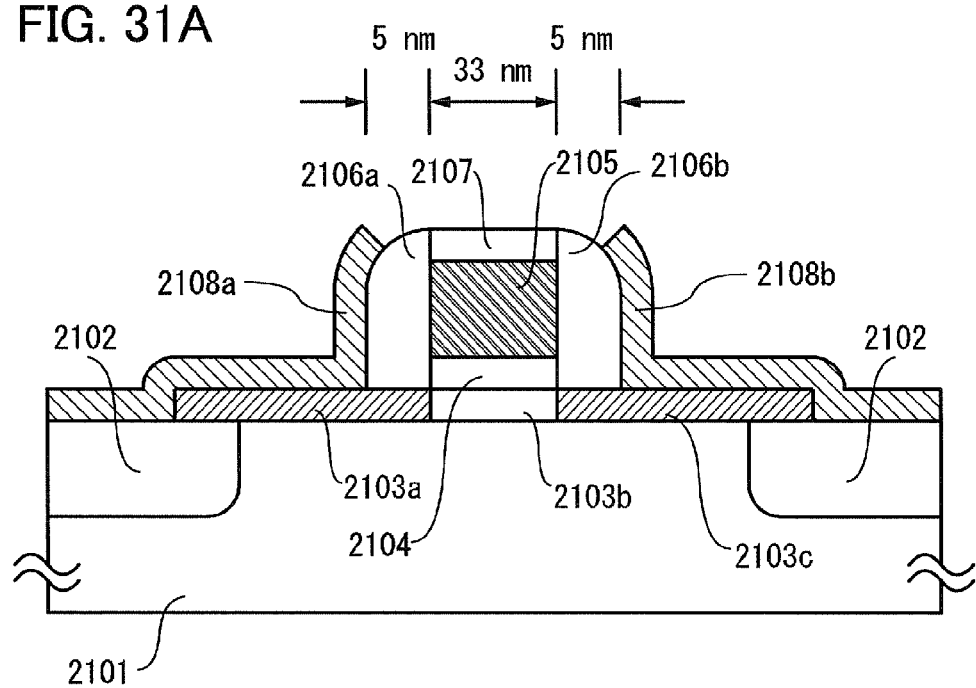
FIGS. 31A and 31B are cross-sectional views of structures of transistors used for calculation.
Figure 31B:
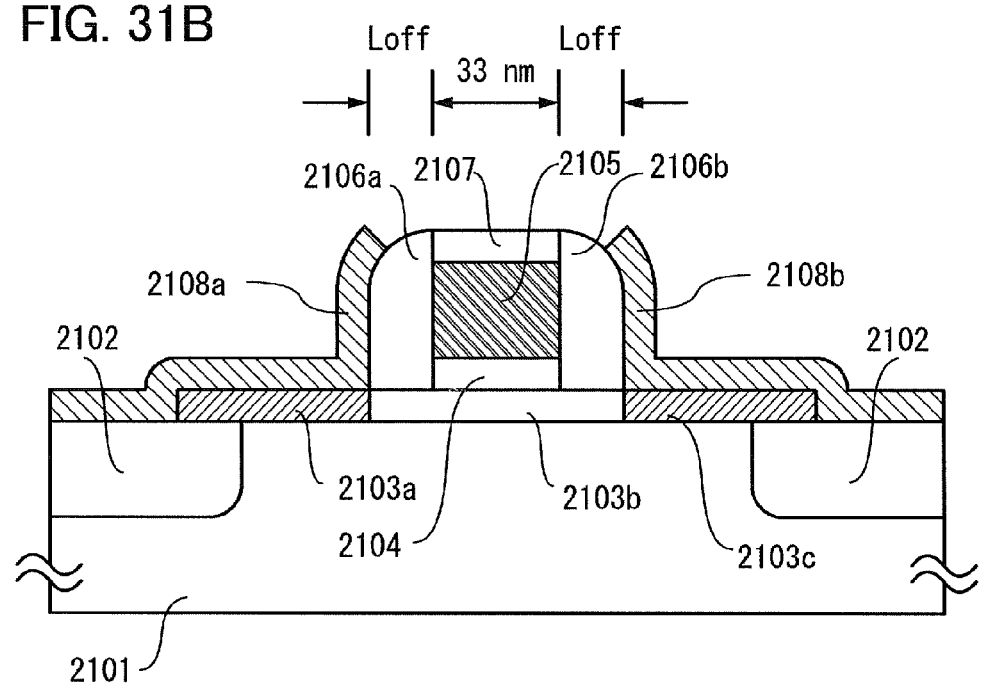

Further, FIGS. 30A to 30C show the gate voltage dependence of the drain current $I_d$ (a solid line) and the mobility μ (a dotted line) of the transistor having the structure illustrated in FIG. 31B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 30A shows the gate voltage dependence of the transistor in the case where the thickness of the gate insulating film is 15 nm, FIG. 30B shows that of the transistor in the case where the thickness of the gate insulating film is 10 nm, and FIG. 30C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 28A to 28C, approximately 60 cm$^2$/Vs in FIGS. 29A to 29C, and approximately 40 cm$^2$/Vs in FIGS. 30A to 30C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory cell and the like, at a gate voltage of around 1 V.

Example 1

A transistor in which an oxide semiconductor containing In, Sn, and Zn as main components is used as a channel formation region can have favorable characteristics by depositing the oxide semiconductor while heating a substrate or by performing heat treatment after an oxide semiconductor film is formed. Note that a main component refers to an element contained in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 32A:
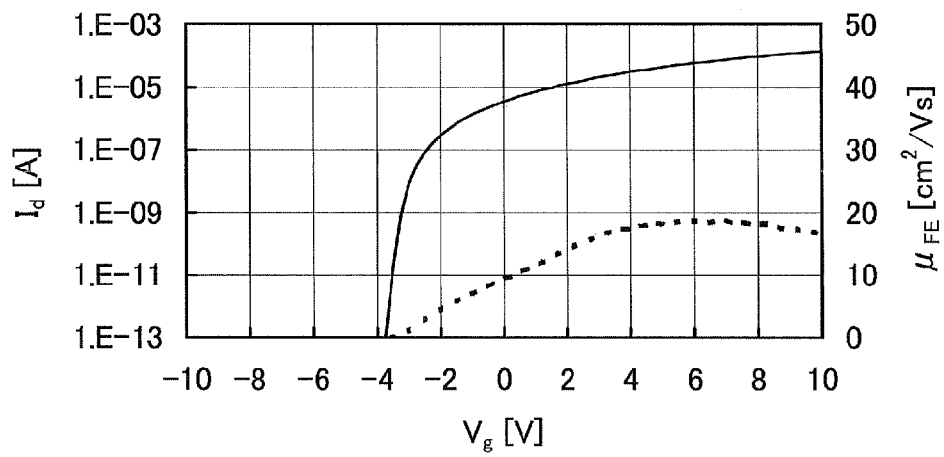
FIGS. 32A to 32C are graphs each showing characteristics of a transistor including an oxide semiconductor film.
Figure 32B:
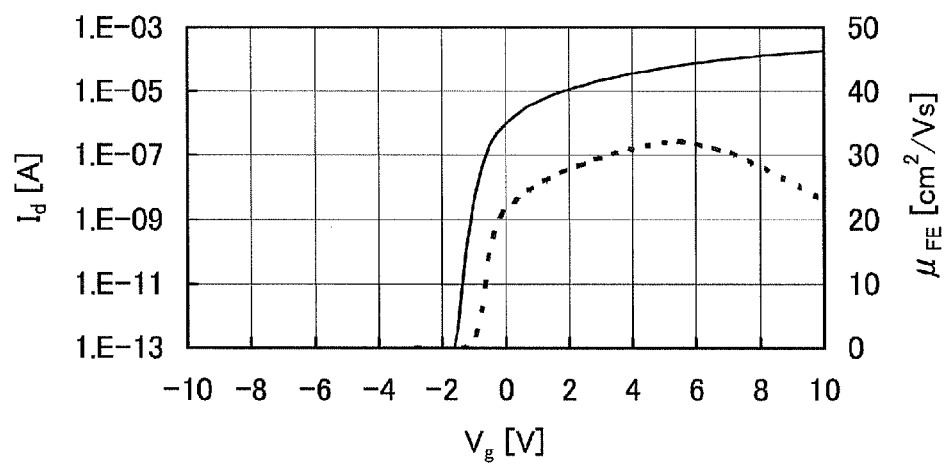
Figure 32C:
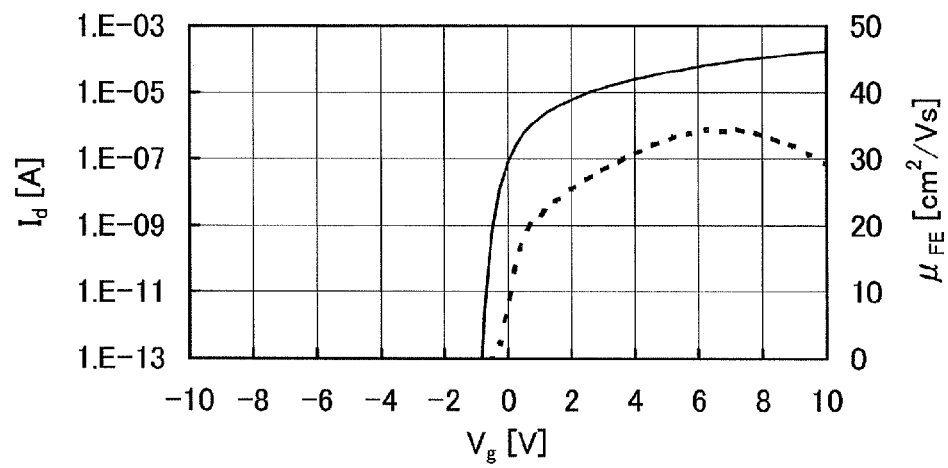

As an example, FIGS. 32A to 32C each show characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 32A shows characteristics of a transistor whose oxide semiconductor film containing In, Sn, and Zn as main components was formed by a sputtering method without heating a substrate intentionally. The field-effect mobility of the transistor is 18.8 $cm^2$/Vsec. On the other hand, when the oxide semiconductor film containing In, Sn, and Zn as main components is formed while heating the substrate intentionally, the field-effect mobility can be improved. FIG. 32B shows characteristics of a transistor whose oxide semiconductor film containing In, Sn, and Zn as main components was formed while heating a substrate at 200° C. The field-effect mobility of the transistor is 32.2 $cm^2$/Vsec.

The field-effect mobility can be further improved by performing heat treatment after formation of the oxide semiconductor film containing In, Sn, and Zn as main components. FIG. 32C shows characteristics of a transistor whose oxide semiconductor film containing In, Sn, and Zn as main components was formed by sputtering at 200° C. and then subjected to heat treatment at 650° C. The field-effect mobility of the transistor is 34.5 $cm^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 $m^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture contained in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 32A and 32B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Note that $V_d$ represents the drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating films was –2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Then, the substrate temperature was set at 150° C. and $V_d$ was set to 0.1 V. After that, –20 V of $V_g$ was applied so that the intensity of an electric field applied to the gate insulating films was –2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 33A:
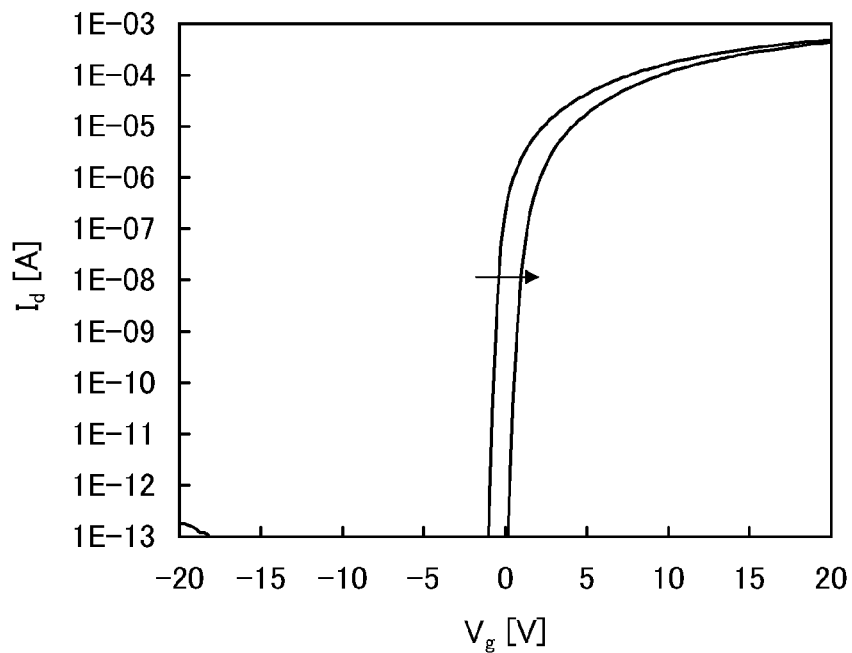
FIGS. 33A and 33B are graphs each showing $V_g$–$I_d$ characteristics of a transistor of Sample 1 which has been subjected to a BT test.
Figure 33B:
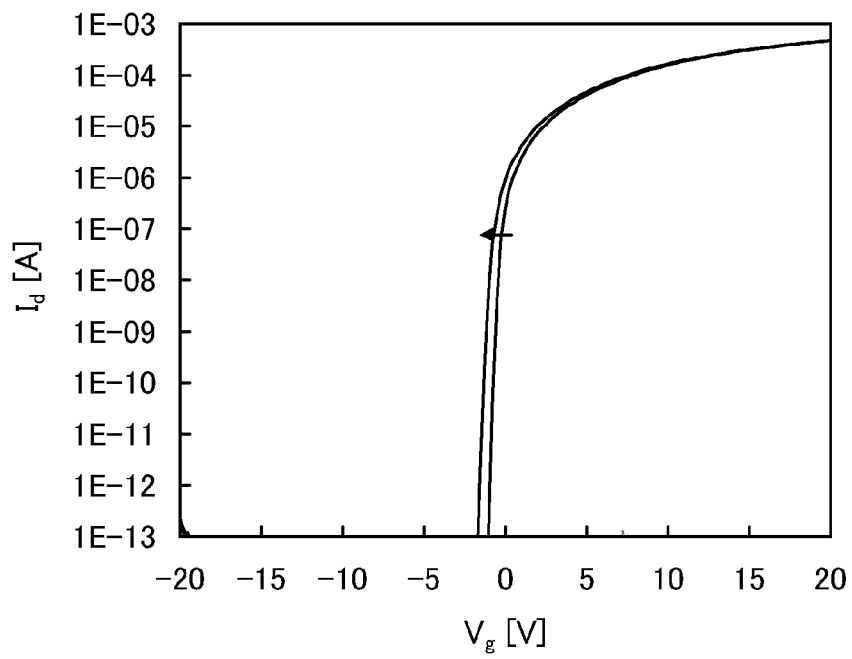
Figure 34A:
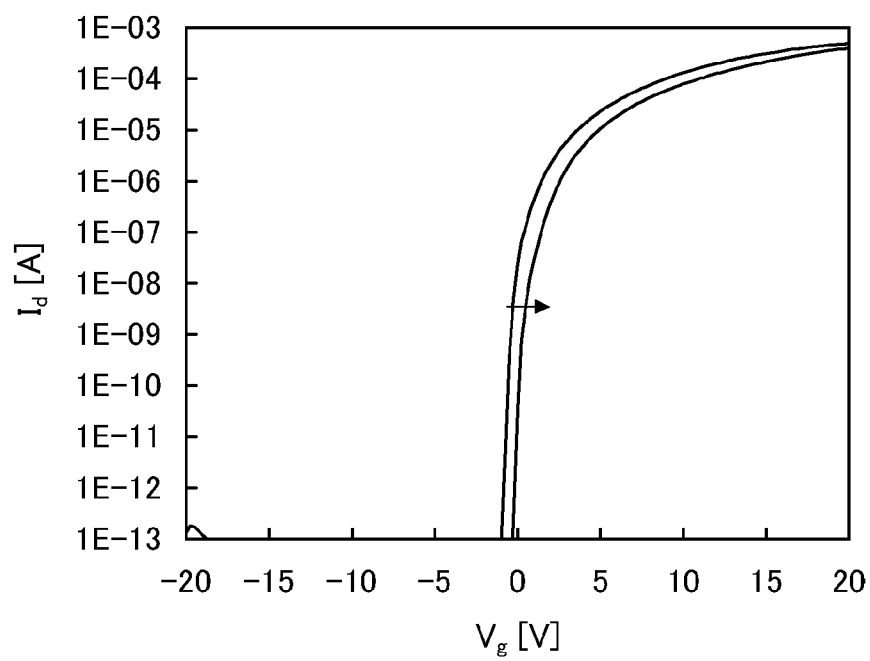
FIGS. 34A and 34B are graphs each showing $V_g$–$I_d$ characteristics of a transistor of Sample 2 which has been subjected to a BT test.
Figure 34B:
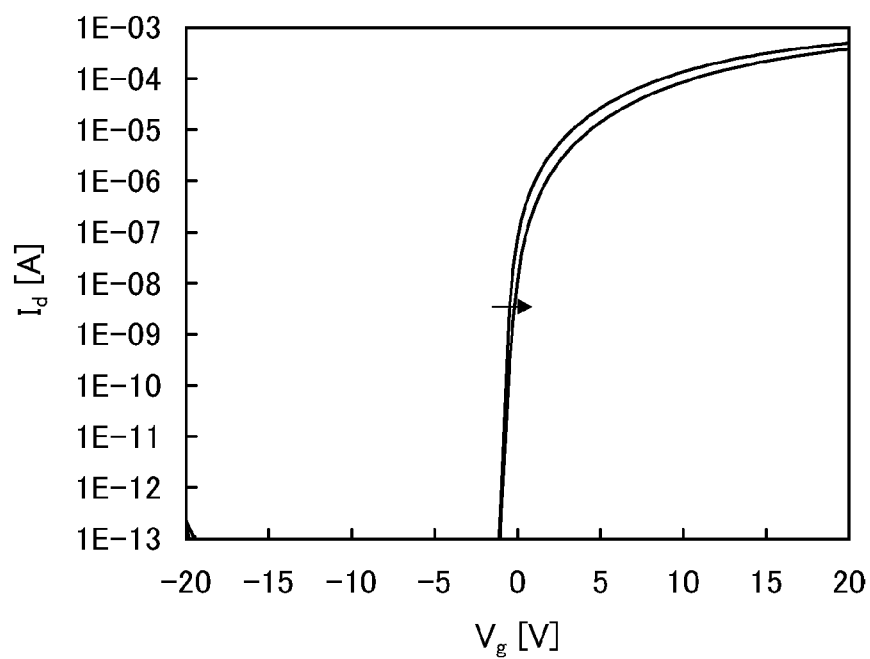

FIGS. 33A and 33B show a result of the positive BT test of Sample 1 and a result of the negative BT test of Sample 1, respectively. FIGS. 34A and 34B show a result of the positive BT test of Sample 2 and a result of the negative BT test of Sample 2, respectively.

The amount of shift in the threshold voltage of Sample 1 due to the positive BT test and that due to the negative BT test were 1.80 V and –0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is contained in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}/cm^3$ and lower than or equal to $2\times10^{20}/cm^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 35:
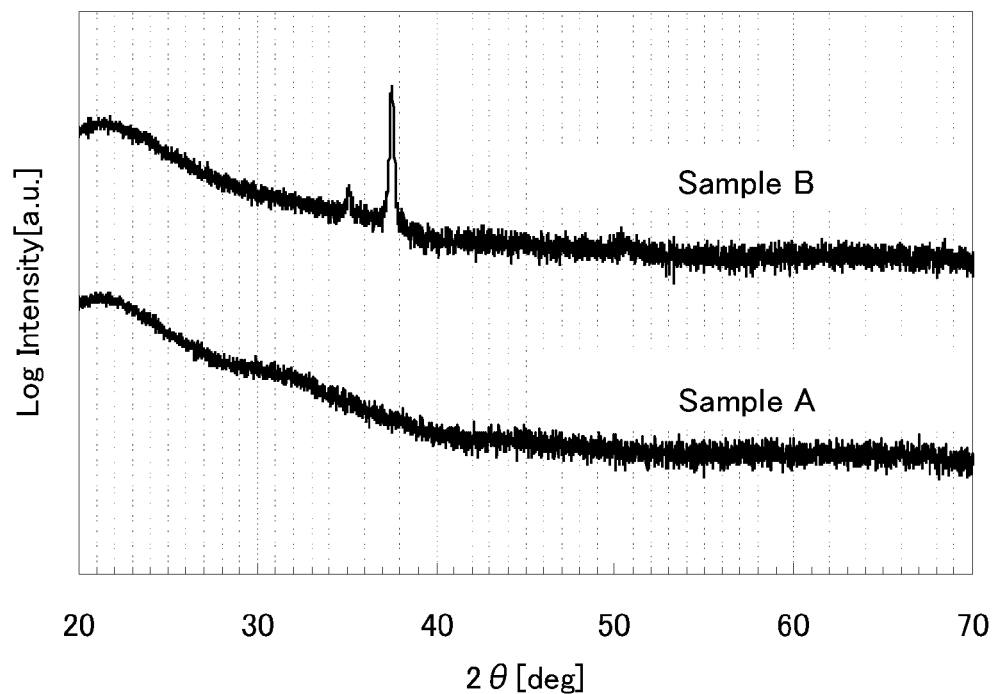
FIG. 35 is a graph showing XRD spectra of Sample A and Sample B.

FIG. 35 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current is used to indicate current per micrometer of a channel width.

Figure 36:
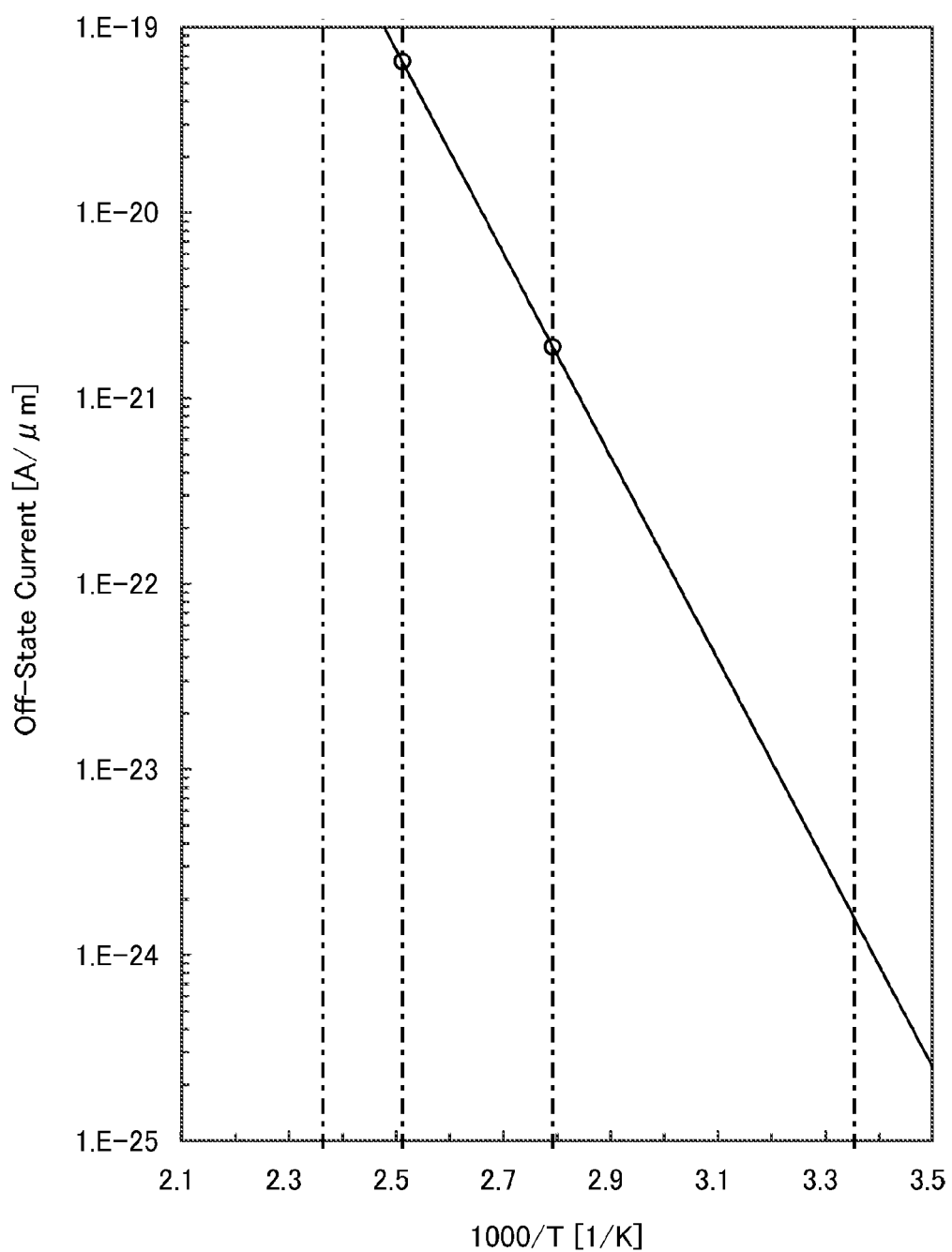
FIG. 36 is a graph showing relation between off-state current and substrate temperature in measurement of a transistor.

FIG. 36 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 36, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being contained in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 37:
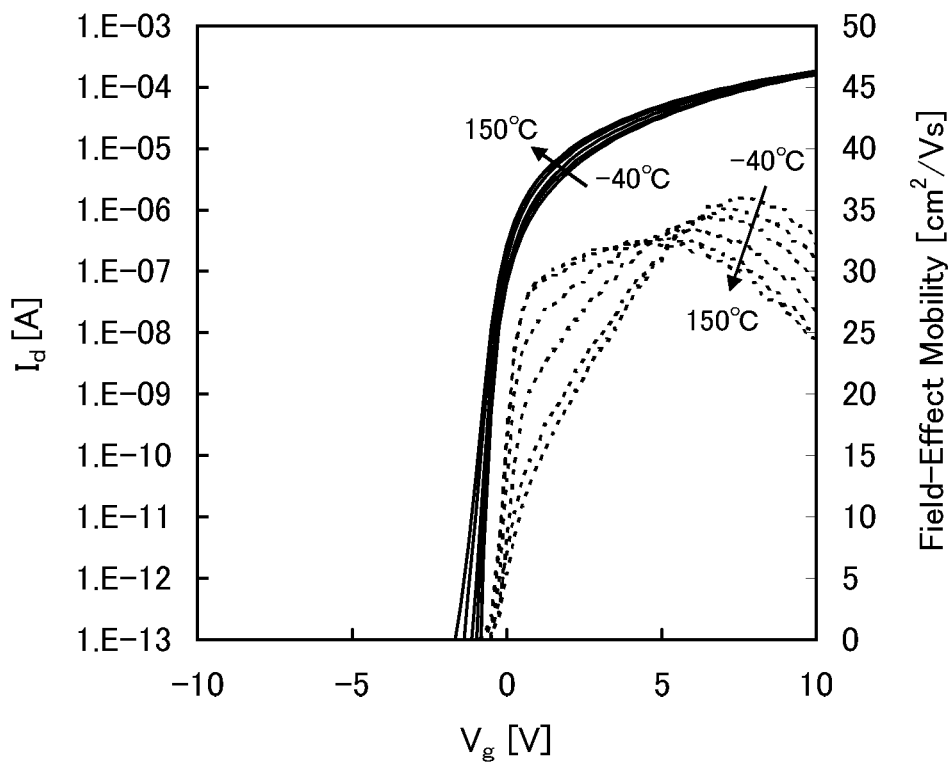
FIG. 37 is a graph showing dependence of $I_d$ and field effect mobility on $V_g$.
Figure 38A:
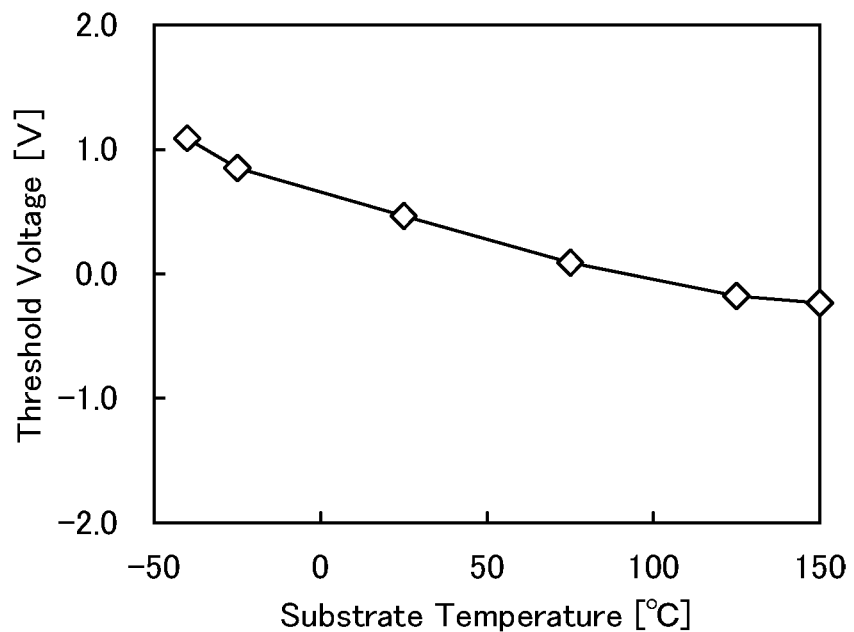
FIG. 38A is a graph showing relation between substrate temperature and threshold voltage.

FIG. 37 shows the $V_g$ dependence of $I_d$ (a solid line) and field-effect mobility (a dotted line). FIG. 38A shows a relation between the substrate temperature and the threshold voltage, and FIG. 38B shows a relation between the substrate temperature and the field-effect mobility.

From FIG. 38A, it is found that the threshold voltage gets lower as the substrate temperature increases. Note that the threshold voltage is decreased from 1.09 V to −0.23 V in the range from −40° C. to 150° C.

Figure 38B:
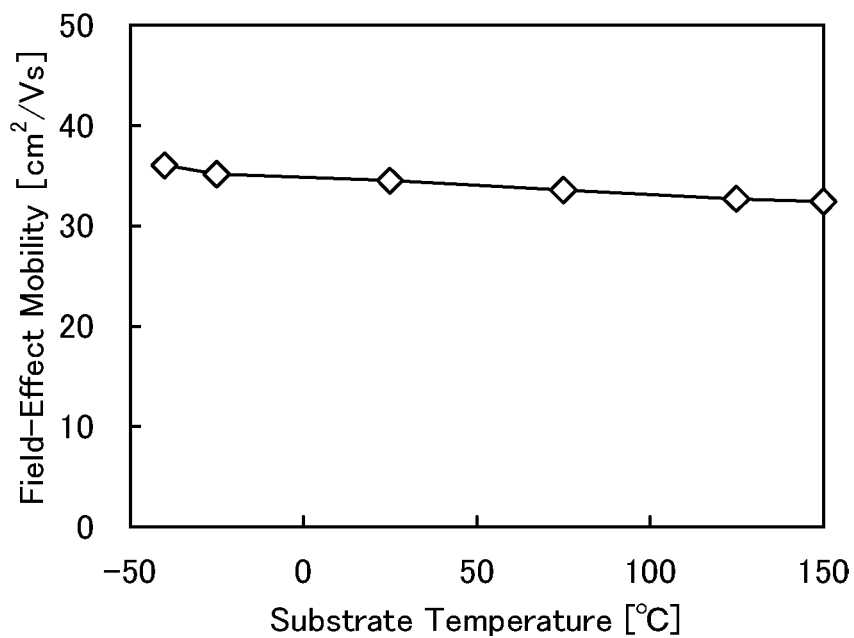
FIG. 38B is a graph showing relation between substrate temperature and field effect mobility.

From FIG. 38B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electric characteristics is small in the above temperature range.

In a transistor in which such an oxide semiconductor containing In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Example 2

In this example, an example of a transistor in which an In—Sn—Zn—O film is used as an oxide semiconductor film will be described below with reference to FIGS. 39A and 39B.

Figure 39A:
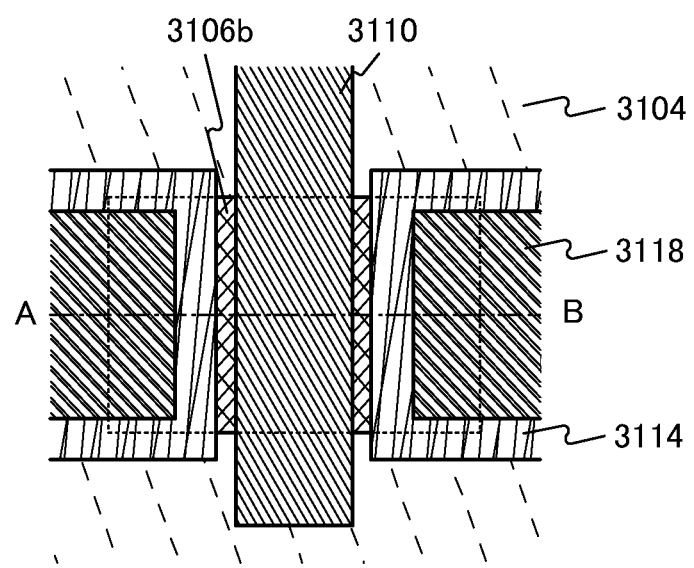
FIG. 39A is a top view of a semiconductor device.
Figure 39B:
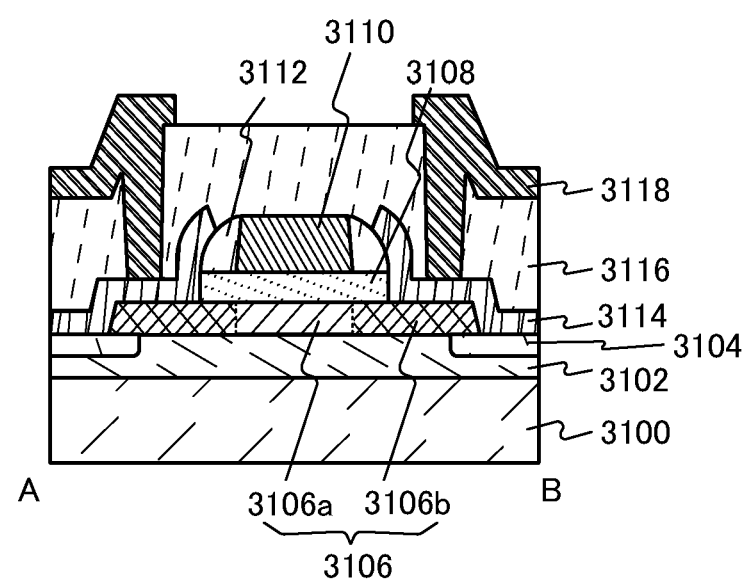
FIG. 39B is a cross-sectional view thereof.

FIGS. 39A and 39B are a top view and a cross-sectional view of a coplanar transistor having a top-gate top-contact structure. FIG. 39A is the top view of the transistor. FIG. 39B illustrates a cross section A-B along dashed-dotted line A-B in FIG. 39A.

The transistor illustrated in FIG. 39B includes a substrate 3100; a base insulating film 3102 provided over the substrate 3100; a protective insulating film 3104 provided in the periphery of the base insulating film 3102; an oxide semiconductor film 3106 provided over the base insulating film 3102 and the protective insulating film 3104 and including a high-resistance region 3106a and low-resistance regions 3106b; a gate insulating film 3108 provided over the oxide semiconductor film 3106; a gate electrode 3110 provided to overlap with the oxide semiconductor film 3106 with the gate insulating film 3108 positioned therebetween; a sidewall insulating film 3112 provided in contact with a side surface of the gate electrode 3110; a pair of electrodes 3114 provided in contact with at least the low-resistance regions 3106b; an interlayer insulating film 3116 provided to cover at least the oxide semiconductor film 3106, the gate electrode 3110, and the pair of electrodes 3114; and a wiring 3118 provided to be connected to at least one of the pair of electrodes 3114 through an opening formed in the interlayer insulating film 3116.

Although not illustrated, a protective film may be provided to cover the interlayer insulating film 3116 and the wiring 3118. With the protective film, a minute amount of leakage current generated by surface conduction of the interlayer insulating film 3116 can be reduced and thus the off-state current of the transistor can be reduced.

Example 3

In this example, another example of a transistor in which an In—Sn—Zn—O film is used as an oxide semiconductor film will be described below.

Figure 40A:
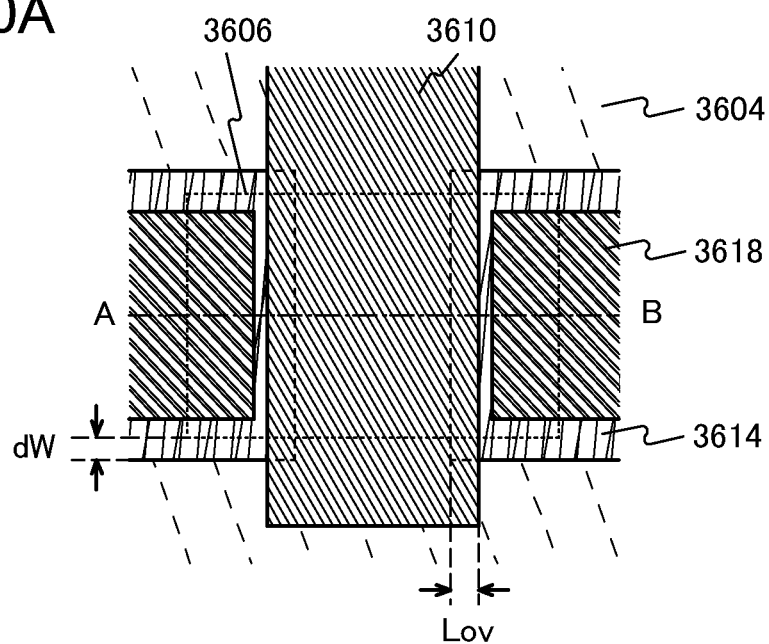
FIG. 40A is a top view of a semiconductor device.
Figure 40B:
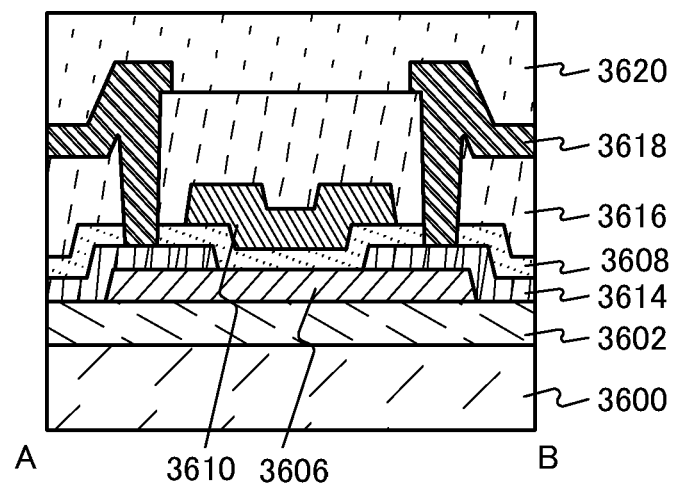
FIG. 40B is a cross-sectional view thereof.

FIGS. 40A and 40B are a top view and a cross-sectional view, which illustrate a structure of a transistor manufactured in this example. FIG. 40A is the top view of the transistor. FIG. 40B is a cross-sectional view along dashed-dotted line A-B in FIG. 40A.

The transistor illustrated in FIG. 40B includes a substrate 3600; a base insulating film 3602 provided over the substrate 3600; an oxide semiconductor film 3606 provided over the base insulating film 3602; a pair of electrodes 3614 in contact with the oxide semiconductor film 3606; a gate insulating film 3608 provided over the oxide semiconductor film 3606 and the pair of electrodes 3614; a gate electrode 3610 provided to overlap with the oxide semiconductor film 3606 with the gate insulating film 3608 positioned therebetween; an interlayer insulating film 3616 provided to cover the gate insulating film 3608 and the gate electrode 3610; wirings 3618 connected to the pair of electrodes 3614 through openings formed in the interlayer insulating film 3616; and a protective film 3620 provided to cover the interlayer insulating film 3616 and the wirings 3618.

As the substrate 3600, a glass substrate can be used. As the base insulating film 3602, a silicon oxide film can be used. As the oxide semiconductor film 3606, an In—Sn—Zn—O film can be used. As the pair of electrodes 3614, a tungsten film can be used. As the gate insulating film 3608, a silicon oxide film can be used. The gate electrode 3610 can have a stacked structure of a tantalum nitride film and a tungsten film. The interlayer insulating film 3616 can have a stacked structure of a silicon oxynitride film and a polyimide film. The wirings 3618 can each have a stacked structure in which a titanium film, an aluminum film, and a titanium film are formed in this order. As the protective film 3620, a polyimide film can be used.

Note that in the transistor having the structure illustrated in FIG. 40A, the width of a portion where the gate electrode 3610 overlaps with one of the pair of electrodes 3614 is referred to as Lov. Similarly, the width of a portion of the pair of electrodes 3614, which does not overlap with the oxide semiconductor film 3606, is referred to as dW.

This application is based on Japanese Patent Application serial no. 2010-178045 filed with the Japan Patent Office on Aug. 6, 2010 and Japanese Patent Application serial no. 2011-108416 filed with the Japan Patent Office on May 13, 2011, the entire contents of which are hereby incorporated by reference.

What is claimed is:
1. A semiconductor device comprising:
   a driver circuit comprising:
      a first transistor;
      a second transistor;
      a first wiring over the first transistor and the second transistor;
      an interlayer film over the first wiring; and
      a second wiring over the interlayer film, and
   a memory cell comprising:
      a third transistor; and
      a capacitor, wherein the first wiring is in contact with a gate of the first transistor and a gate of the second transistor,
wherein a first portion of the second wiring is in contact with the first wiring,
wherein a second portion of the second wiring overlaps with the first transistor,
wherein a third portion of the second wiring overlaps with the second transistor,
wherein the first portion of the second wiring does not overlap with the first transistor and the second transistor,
wherein one of a source or a drain of the first transistor and one of a source or a drain of the second transistor are electrically connected to each other,
wherein a source electrode and a drain electrode of the third transistor are in a same layer as the first wiring,
wherein a gate insulating film of the third transistor is in a same layer as the interlayer film,
wherein a gate electrode of the third transistor is in a same layer as the second wiring,
wherein a first electrode of the capacitor is in the same layer as the first wiring,
wherein a dielectric of the capacitor is in the same layer as the interlayer film, and
wherein a second electrode of the capacitor is in the same layer as the second wiring.

2. An electronic device comprising the semiconductor device according to claim 1.

3. The semiconductor device according to claim 1,
wherein a thickness of the interlayer film is greater than or equal to 10 nm and less than or equal to 100 nm.

4. The semiconductor device according to claim 1,
wherein the first wiring is configured to receive a first signal,
wherein the second wiring is configured to receive a second signal, and
wherein the first signal and the second signal have a same potential.

5. The semiconductor device according to claim 1,
wherein the first wiring is configured to receive a first signal,
wherein the second wiring is configured to receive a second signal, and
wherein the first signal and the second signal have a same phase.

6. The semiconductor device according to claim 1,
wherein the memory cell comprises a fourth transistor,
wherein one of a source and a drain of the third transistor is electrically connected to a gate of the fourth transistor and the second electrode of the capacitor.

7. An electronic device comprising the semiconductor device according to claim 6.

8. The semiconductor device according to claim 6,
wherein the third transistor comprises a channel formation region comprising an oxide semiconductor, and
wherein the fourth transistor comprises a channel formation region comprising silicon.

9. The semiconductor device according to claim 8,
wherein a thickness of the interlayer film is greater than or equal to 10 nm and less than or equal to 100 nm.

10. The semiconductor device according to claim 8,
wherein the first wiring is configured to receive a first signal,
wherein the second wiring is configured to receive a second signal, and
wherein the first signal and the second signal have a same potential.

11. The semiconductor device according to claim 8,
wherein the first wiring is configured to receive a first signal,
wherein the second wiring is configured to receive a second signal, and
wherein the first signal and the second signal have a same phase.

12. The semiconductor device according to claim 1,
Wherein the driver circuit comprises a NAND gate comprising the first transistor and the second transistor.

13. The semiconductor device according to claim 1,
wherein the first transistor is an n-channel transistor, and
wherein the second transistor is a p-channel transistor.

14. The semiconductor device according to claim 1,
wherein the driver circuit comprises a NAND gate comprising the first transistor, the second transistor, a fourth transistor, and a fifth transistor,
wherein the other of the source and the drain of the first transistor is electrically connected to one of a source and a drain of the fourth transistor,
wherein the one of the source and the drain of the first transistor is electrically connected to the one of the source and the drain of the second transistor and one of a source and a drain of the fifth transistor, and
wherein the other of the source and the drain of the second transistor is electrically connected to the other of the source and the drain of the fifth transistor.

15. The semiconductor device according to claim 14,
wherein the first transistor is an n-channel transistor,
wherein the second transistor is a p-channel transistor,
wherein the fourth transistor is an n-channel transistor, and
wherein the fifth transistor is a p-channel transistor.

16. The semiconductor device according to claim 14,
wherein the memory cell comprises a sixth transistor,
wherein one of a source and a drain of the third transistor is electrically connected to a gate of the sixth transistor,
wherein the third transistor comprises a channel formation region comprising an oxide semiconductor, and
wherein the driver circuit is configured to supply a signal to a gate of the third transistor.

17. The semiconductor device according to claim 14,
wherein the memory cell comprises a sixth transistor,
wherein one of a source and a drain of the third transistor is electrically connected to a gate of the sixth transistor,
wherein the third transistor comprises a channel formation region comprising an oxide semiconductor,
wherein the gate of the sixth transistor is electrically connected to the second electrode of the capacitor, and
wherein the driver circuit is configured to supply a signal to the first electrode of the capacitor.

* * * * *